United States Patent [19]

Yoshida

[11] Patent Number: 5,524,088

[45] Date of Patent: Jun. 4, 1996

[54] MULTI-FUNCTIONAL OPERATING CIRCUIT PROVIDING CAPABILITY OF FREELY COMBINING OPERATING FUNCTIONS

[75] Inventor: Yukihiro Yoshida, Ikoma, Japan

[73] Assignee: Sharp Kabushiki Kaisha, Osaka, Japan

[21] Appl. No.: 224,654

[22] Filed: Apr. 6, 1994

[30] Foreign Application Priority Data

Jun. 30, 1993 [JP] Japan .................................. 5-161389

[51] Int. Cl.[6] ................. G06F 7/00; G06F 7/38
[52] U.S. Cl. ......................... 364/746.2; 364/716
[58] Field of Search ..................... 364/746.2, 716

[56] References Cited

U.S. PATENT DOCUMENTS 4,914,614  4/1990  Yamakawa ........................ 364/746.2
5,289,399  2/1994  Yoshida ........................... 364/746.2
5,297,072  3/1994  Yoshida ........................... 364/752
5,299,145  3/1994  Yoshida ........................... 364/746.2
5,381,380  1/1995  Yoshida ........................... 364/767

Primary Examiner—Tan V. Mai

[57] ABSTRACT

A multi-functional operating circuit provides a flexible architecture for dynamically or statically changing plural operating functions in a manner to complex the operating units needing the fastest speed, prevent an electric delay of a signal or be integrated at higher density. The multi-functional operating circuit includes plural operating circuit units having any-valued adding unit, subtracting unit, multiplying unit, squaring unit and logical operating unit, and plural instruction decoders for dynamically or statically selecting plural operating units for controlling a selected combination of these operating units in response to micro orders derived from external instructions in a manner to apply to the necessary operating function.

27 Claims, 53 Drawing Sheets

Fig. 1

| $I_1, I_2$ | OPERATION | $I_3, I_4$ | | INPUT CIRCUIT | BINARY OR CIRCUIT ⑨ 0 0 | TERNARY OR CIRCUIT ⑩ 0 1 | QUATERNARY OR CIRCUIT ⑪ 1 0 |
|---|---|---|---|---|---|---|---|
| | | | | | | $I_5, I_6$ | |
| 0 0 ① | ADDITION | ⑤ | 0 0 | BINARY | CIRCUIT UNIT [1] | CIRCUIT UNIT [2] | CIRCUIT UNIT [3] |
| | | ⑥ | 0 1 | TERNARY | | | |
| | | ⑦ | 1 0 | BINARY | | | |
| | | ⑧ | 1 1 | QUATERNARY | | | |
| 0 1 ② | SUBTRACTION | ⑤ | 0 0 | BINARY | CIRCUIT UNIT [4] | CIRCUIT UNIT [5] | CIRCUIT UNIT [6] |
| | | ⑥ | 0 1 | TERNARY | | | |
| | | ⑦ | 1 0 | BINARY | | | |
| | | ⑧ | 1 1 | QUATERNARY | | | |
| 1 0 ③ | MULTIPLICATION | ⑤ | 0 0 | BINARY | CIRCUIT UNIT [7] | CIRCUIT UNIT [8] | CIRCUIT UNIT [9] |
| | | ⑥ | 0 1 | TERNARY | | | |
| | | ⑦ | 1 0 | BINARY | | | |
| | | ⑧ | 1 1 | QUATERNARY | | | |
| 1 1 ④ | SQUARING | ⑤ | 0 0 | BINARY | CIRCUIT UNIT [10] | CIRCUIT UNIT [11] | CIRCUIT UNIT [12] |
| | | ⑥ | 0 1 | TERNARY | | | |
| | | ⑦ | 1 0 | BINARY | | | |
| | | ⑧ | 1 1 | QUATERNARY | | | |

Fig. 39

| | | $I_1 I_2 I_7 I_8$ | $I_3$ ⑤ | ⑥ | $I_4$ ⑦ | ⑧ | $I_5$ ⑨ | ⑩ | $I_6$ ⑪ |
|---|---|---|---|---|---|---|---|---|---|
| ADDITION | ① | 0 0 0 0 | 00 | 01 | 10 | 11 | 00 | 01 | 10 |
| SUBTRACTION | ② | 0 1 0 0 | | | | | | | |
| MULTIPLICATION | ③ | 1 0 0 0 | | | | | | | |
| SQUARING | ④ | 1 1 0 0 | | | | | | | |
| AND | ⑫ | 0 0 0 1 | 00 | 01 | 10 | 11 | 00 | 01 | 10 |
| OR | ⑬ | 0 1 0 1 | | | | | | | |
| NAND | ⑭ | 1 0 0 1 | | | | | | | |
| NOR | ⑮ | 1 1 0 1 | | | | | | | |
| X⊕Y | ⑯ | 0 0 1 0 | 00 | 01 | 10 | 11 | 00 | 01 | 10 |
| (X≡Y) | ⑰ | 0 1 1 0 | | | | | | | |
| (X>Y) | ⑱ | 1 0 1 0 | | | | | | | |
| (X<Y) | ⑲ | 1 1 1 0 | | | | | | | |
| ADDITIONAL OPERATION | ⑳ | 0 0 1 1 | 00 | 01 | 10 | 11 | 00 | 01 | 10 |
| | ㉑ | 0 1 1 1 | | | | | | | |
| | ㉒ | 1 0 1 1 | | | | | | | |
| | ㉓ | 1 1 1 1 | | | | | | | |

| OUTPUT SIGNAL | INPUT SIGNAL | | |
|---|---|---|---|
| | BI-NARY | TER-NARY | QUATER-NARY |
| BINARY | ENABLE | ENABLE | ENABLE |
| TERNARY | ENABLE | ENABLE | ENABLE |
| QUATER-NARY | ENABLE | ENABLE | ENABLE |

MULTI-FUNCTIONAL OPERATING CIRCUIT PROVIDING CAPABILITY OF FREELY COMBINING OPERATING FUNCTIONS

BACKGROUND OF THE INVENTION

1. Field of the Invention

The present invention relates to a multi-functional operating circuit which may be used for a microprocessor, an operating circuit for a digital signal processing LSI, another operating circuit dedicated to a computer field such as a workstation or a personal computer, an image processor, multi-media equipment or the like.

2. Description of the Related Art

In the field of processing digital data, in general, a microprocessor is widely used for various kinds of operations. Also in the field of image processing or communication, a digital signal processing is now allowed to be compressed or de-compressed. In the fields of processing digital data or a digital signal, an adding circuit or a multiplying circuit merely needs a fundamental operating circuit. As a result of progress of semiconductor technology, large-scale circuit integration is made possible.

The microprocessor known by the inventors of the present application includes operating circuits such an adder or a multiplier dispersively functioned in their own manners. That is, those operating circuits are not allowed to be freely arranged in response to an external instruction. Hence, in the case of designing (integrating) a multiplying circuit used for a microprocessor, no complex operating circuit is disallowed to be arranged. As such, though the operating circuit needs the fastest speed, it is difficult to prevent electric delay of a signal in designing the circuit, because there are provided operating units dispersively in light of functionality. The difficulty is an obstacle to high-density integration. The impossibility to arrange the operating units as an integrated operating circuit controlled in response to an external instruction results in lowering the flexibility of the known operating circuit in light of the architecture and additional operating functions.

SUMMARY OF THE INVENTION

It is an object of the present invention to provide a multi-functional operating circuit which is arranged to complex the operating circuit units required to operate at the fastest speed, make the circuit design of various operating circuit units easy, prevent electric delay of a signal, or integrate the operating circuit units at high density, and provide such a flexible architecture as dynamically or statically changing the operating functions in response to an external instruction.

In carrying out the object, a multi-functional operating circuit includes: plural operating units each for executing an addition, a subtraction, a multiplication, a squaring operation or an logical operation; and control means for controlling a selective combination of the plural operating units by dynamically or statically selecting plural operating units in response to an external instruction in a manner to apply to a predetermined multi-valued signal and an operating function.

In operation, as described above, the control means includes plural operating circuit units for executing an addition, a subtraction, a multiplication, a squaring, and a logical operation and operates to dynamically or statically select operating circuits in response to an external instruction(s) and to control a combination of plural operating circuits so as to process a predetermined multi-valued signal and a predetermined operating function.

The multi-functional operating circuit makes it possible to integrate the operating unit needing the fastest speed at a higher density and prevent or reduce electric delay of a signal. Further, the plural operating circuit units are allowed to be complexed. This results in realizing a controllable and multi-functional operating module in response to the external instructions, which may provide such a quite effective architecture as integrating the operating system and apply to a binary signal, a ternary signal or a quaternary signal.

Moreover, each operating speed to be controlled in response to the external instructions is doubled without having to change a clock frequency. Hence, if the clock frequency is divided into a half, the operating circuit can keep the operating speed.

Further objects and advantages of the present invention will be apparent from the following description of the preferred embodiments of the invention as illustrated in the accompanying drawings.

BRIEF DESCRIPTION OF THE DRAWINGS

FIG. 1 is a table for describing an outline of a multi-functional operating circuit according to the present invention;

FIG. 25 1s a block diagram showing an arrangement of a quaternary multiplying/squaring circuit included in the circuit [9]/[12] of FIG. 1;

FIG. 39 is an allocation table of instruction codes which may apply to the multi-functional operating circuit according to the present invention;

DESCRIPTION OF THE PREFERRED EMBODIMENTS

Figure 2:
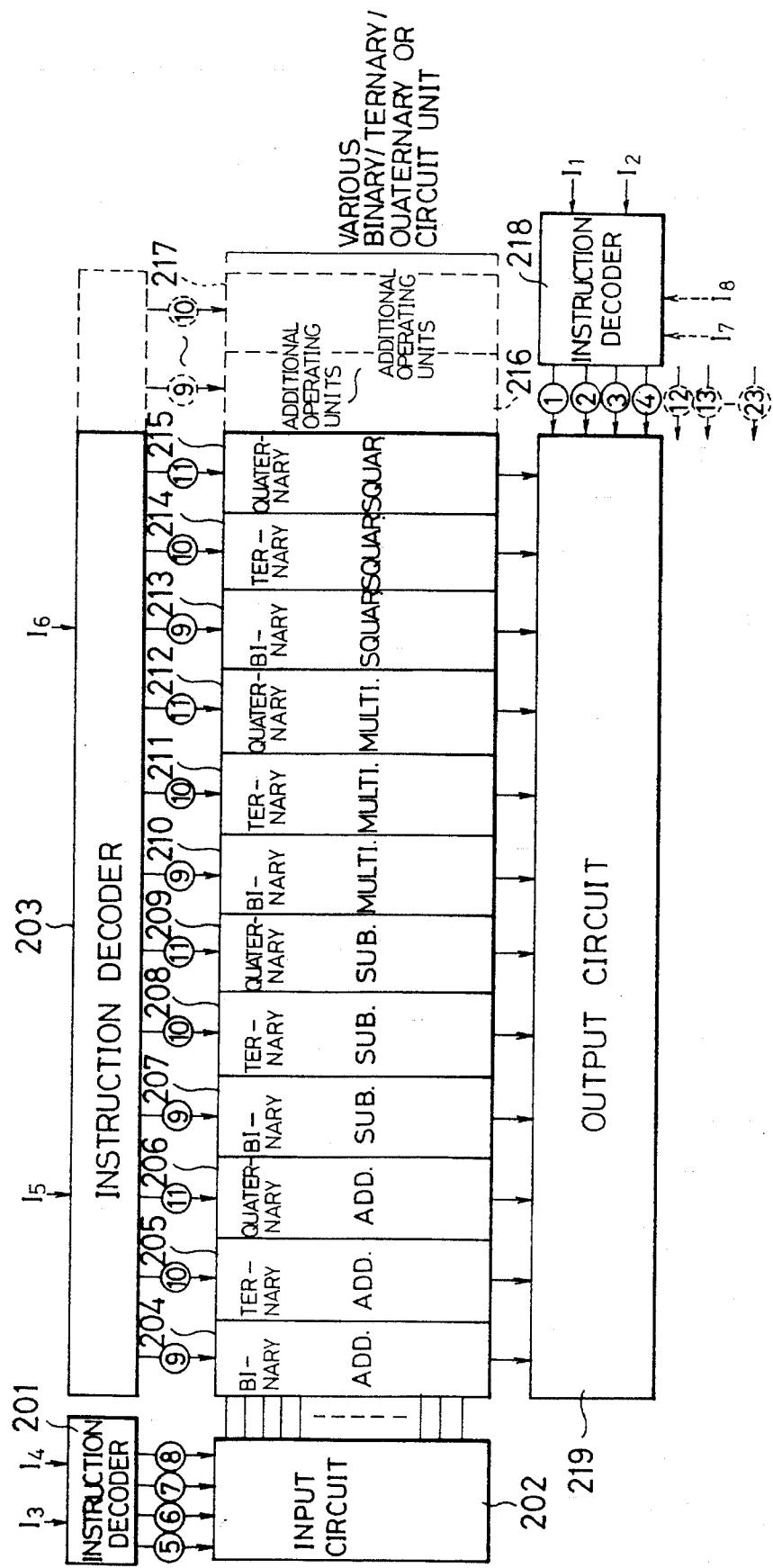
FIG. 2 is a block diagram showing an arrangement of a multi-functional operating circuit according to a first embodiment of the present invention.

Hereafter, the description will be oriented to a multi-functional operating circuit according to an embodiment of the present invention with reference to the drawings.

FIG. 1 is a table for describing an outline of the multi-functional operating circuit.

In FIG. 1, $I_1$, $I_2$, $I_3$, $I_4$, $I_5$, and $I_6$ denote each bit of an external instruction. 1, 2 (represented simply as 1 and 2 in the later description) and the like denote micro orders to be decoded from the external instructions $I_1$, $I_2$, $I_3$, $I_4$, $I_5$, and $I_6$ by an instruction decoder circuit (to be described later and shown in FIG. 3). For example, if the external instructions $I_1$ and $I_2$ are (0, 0), an addition micro order 1 is outputted. Likewise, if the external instructions $I_1$ and $I_2$ are (0, 1), a subtraction micro order 2 is outputted. If the external instructions $I_1$ and $I_2$ are (1, 0), a multiplication micro order 3 is outputted. If the external instructions $I_1$ and $I_2$ are (1, 1), a squaring micro order 4 is outputted.

Micro orders 5 to 8 are used for selecting an input circuit (to be described later and shown in FIG. 2). As shown in FIG. 1, according to the value (0 0), (0 1), (1 0) or (1 1) of the external instructions $I_3$ and $I_4$, the corresponding micro order 5, 6, 7 or 8 is outputted for selecting each of a binary, ternary, binary and quaternary input circuits.

The micro orders 9, 10 and 11 are used for selecting each of binary, ternary and quaternary OR circuits. In these OR circuits, the binary OR circuits are denoted by a numeral 1901 of FIG. 17, a numeral 2201 of FIG. 20 and a numeral 2501 of FIG. 23. The ternary OR circuits are denoted by a numeral 2001 of FIG. 18, a numeral 2301 of FIG. 21 and a numeral 2601 of FIG. 24. The quaternary OR circuits are denoted by a numeral 2101 of FIG. 19, a numeral 2401 of FIG. 22 and a numeral 2701 of FIG. 25.

The arrangements of the circuits [1] to [12] shown in FIG. 1 are indicated in FIGS. 17 to 25, respectively.

Figure 23:
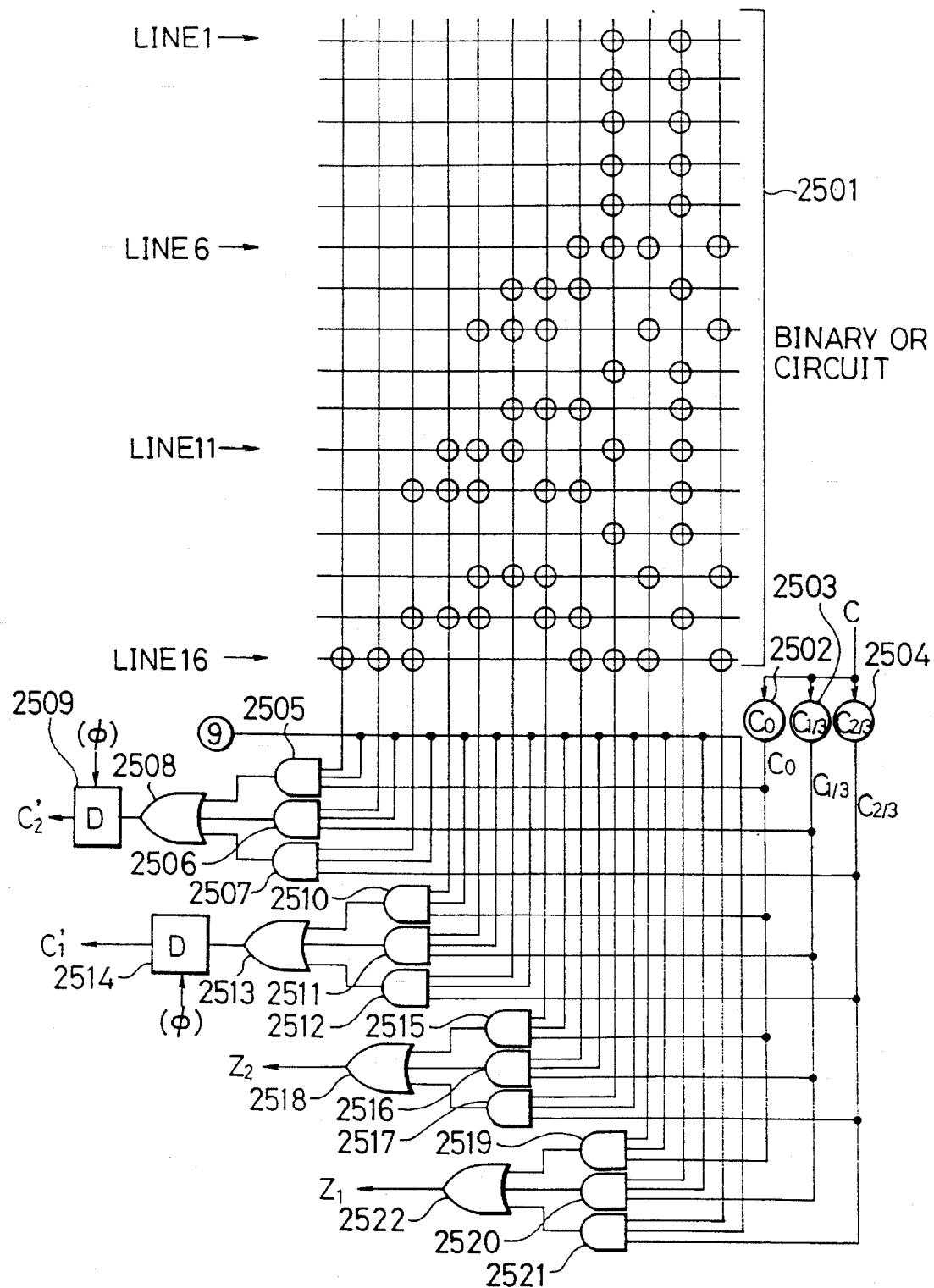
FIG. 23 is a block diagram showing an arrangement of a binary multiplying/squaring circuit included in the circuit [7]/[10] of FIG. 1.
Figure 24:
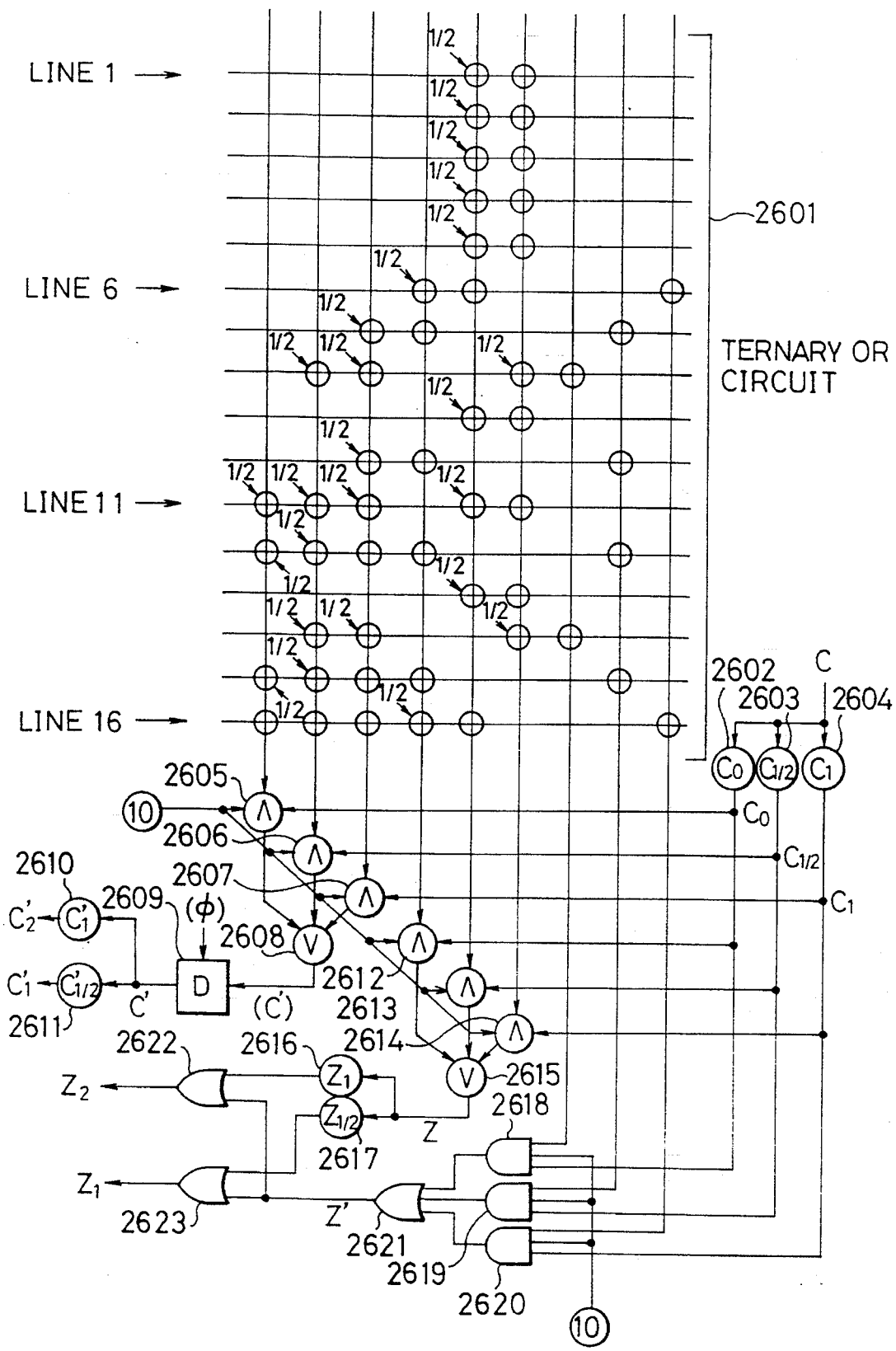
FIG. 24 is a block diagram showing an arrangement of a ternary multiplying/squaring circuit included in the circuit [8]/[11] of FIG. 1.
Figure 25:
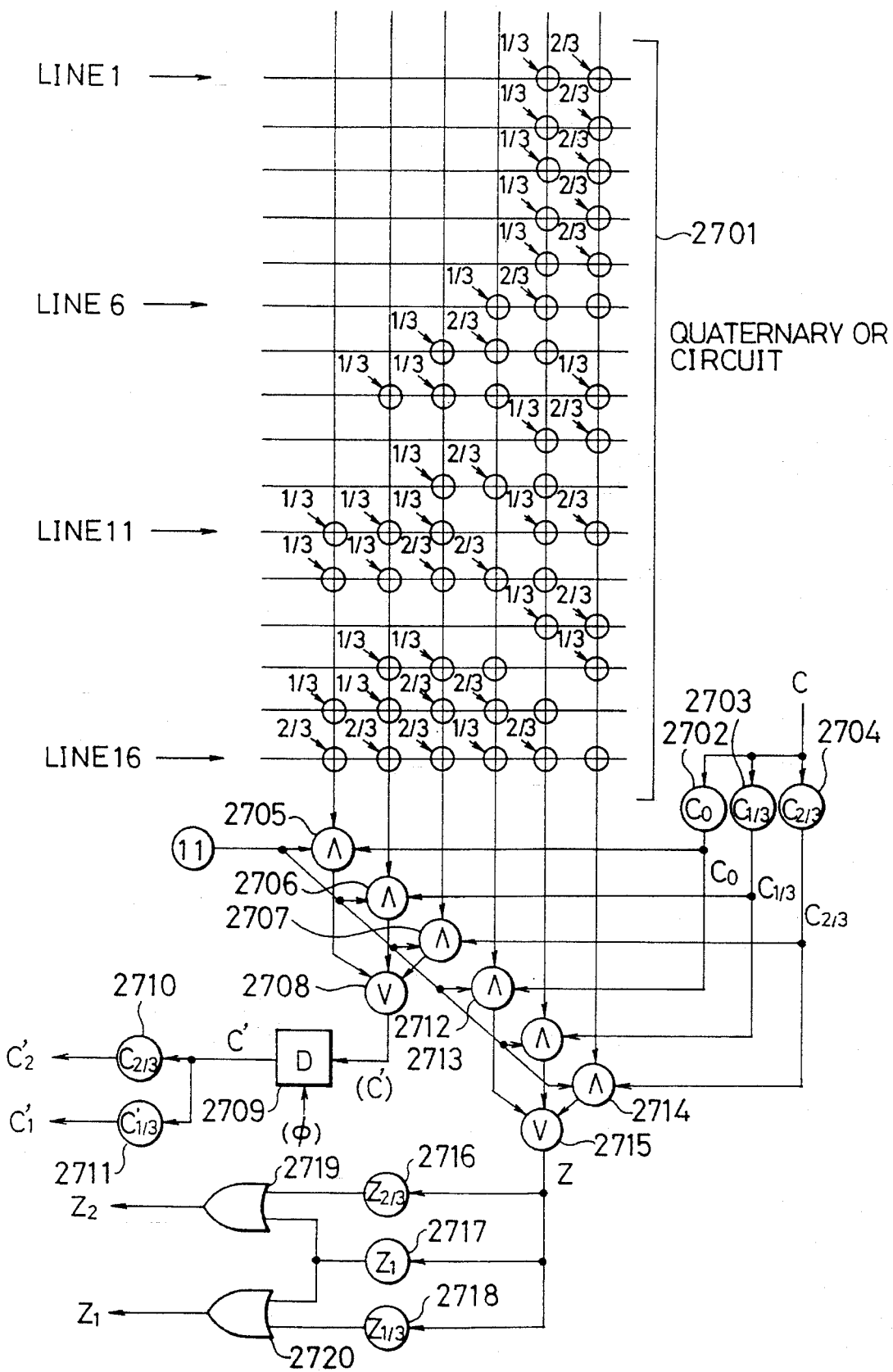

Of these circuits, [10], [11] and [12] denote the squaring circuits, which are set in the condition of X=Y and x=y. In FIGS. 23 to 25, therefore, only multi-valued functional elements (or quantizing functional elements) on a line indicated by an arrow compose an OR circuit.

FIG. 2 is a block diagram showing an arrangement of a multi-functional operating circuit according to the first embodiment of the invention, which circuit may selectively combine various operating functions according to a combination table shown in FIG. 1.

The multi-functional operating circuit shown in FIG. 2 is arranged to have an instruction decoder 201, an input circuit 202, an instruction decoder 203, operating units 204 to 217, an instruction decoder 218, and an output circuit 219. The instruction decoder 201 operates to receive external instructions $I_3$ and $I_4$ and output a micro order 5, 6, 7 or 8 according to each of the external instructions $I_3$ and $I_4$. The input circuit 202 is connected to the instruction decoder 201 and operates to receive any output of the binary, ternary, binary and quaternary input circuits selected according to the micro order outputted from the instruction decoder 201. The instruction decoder 203 operates to receive the external instructions $I_5$ and $I_6$ and output the micro order 9, 10 or 11 according to the inputted external instructions $I_5$ and $I_{16}$. The operating units 204 to 217 are connected to the instruction decoder 203 and operates to output a signal from any one of binary, ternary and quaternary OR circuits selected according to the micro order outputted from the instruction decoder 203. The instruction decoder 218 operates to receive the external instructions $I_1$, $I_2$ and $I_7$, $I_8$ in some cases and output the micro orders 1, 2, 3 and 4 according to the external instructions $I_1$ and $I_2$ or the micro orders 12, 13 to 23 according to the external instructions $I_7$ and $I_8$ in some cases. The output circuit 219 is connected to the operating units 204 to 217 and the instruction decoder 218 and operates to output the operated result obtained by the operating units according to the micro orders outputted from the instruction decoder 218.

In FIG. 2, numerals 216 and 217 denote operating units indicated by dotted lines, which may be additional. For example, in the case of adding an operation of $x^3$ (cube), various logical operations and a logical expression, it is necessary to increase the number of bits of an external instruction. The number of the micro orders is increased according to the increase of the bits. As an example, in response to an 8-bit external instruction, the instruction decoder enables to output 256 micro orders. The addition of various logical operations and logical expressions, therefore, makes it possible to expand an operating function.

FIGS. 4 to 16 show representative combinations of complex operating circuits, respectively.

Figure 4:
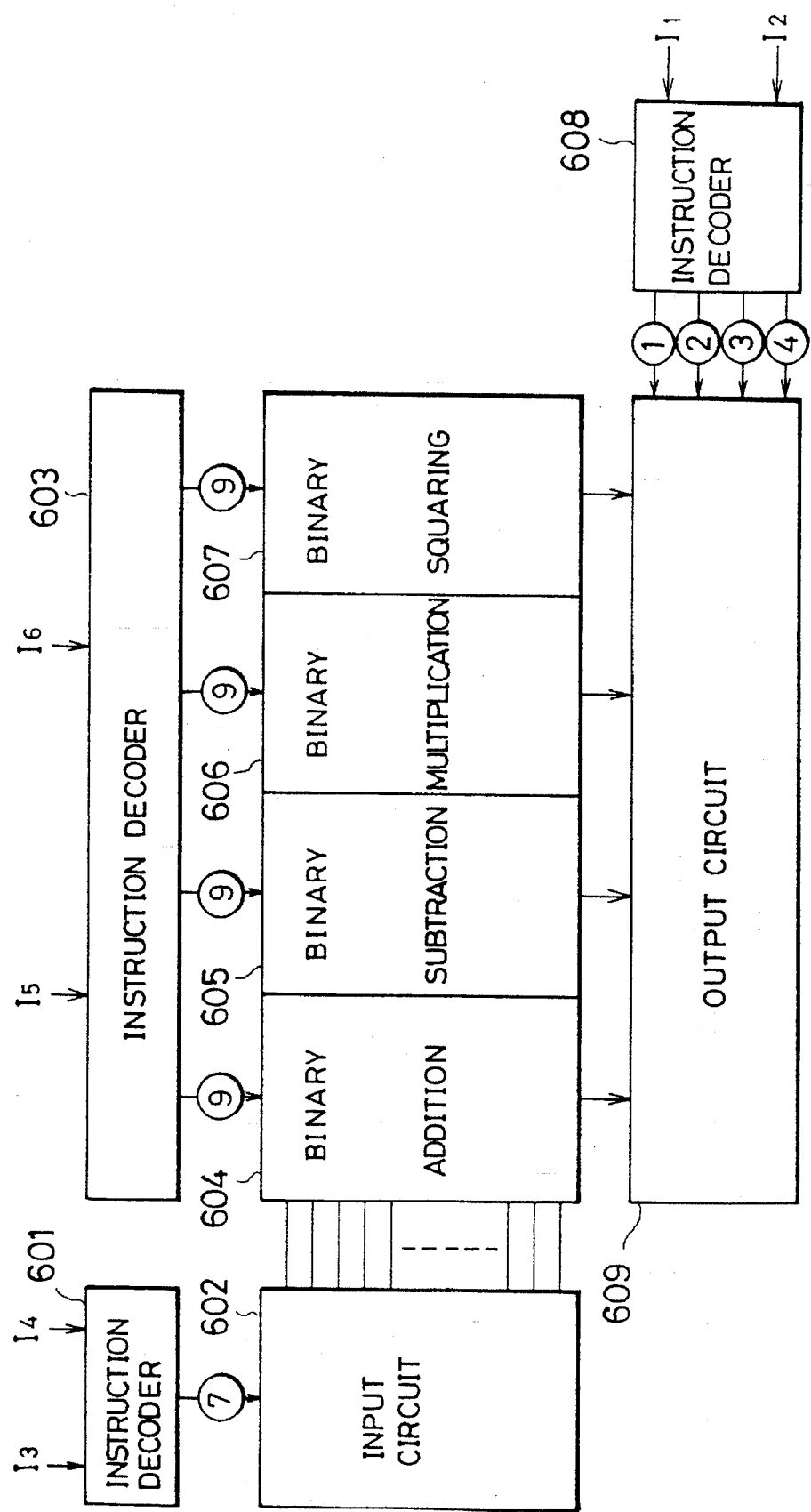
FIG. 4 is a block diagram showing one combination of the multi-functional operating circuit shown in FIG. 2.

In the combination shown in FIG. 4, the multi-functional operating circuit as shown in FIG. 2 is arranged to have an instruction decoder 601, a binary input circuit 602, an instruction decoder 603, operating units 604 to 607, an instruction decoder 608, and an output circuit 609. The instruction decoder 601 operates to receive the external instructions $I_3$ and $I_4$ and output a micro order 7 according to the values of the external instructions $I_3$ and $I_4$. The binary input circuit 602 is connected to the instruction decoder 601 so that the circuit 602 may be selected by a micro order 7 outputted from the instruction decoder 601. The instruction decoder 603 operates to input external instructions $I_5$ and $I_6$ and output a micro order 9 according to the values of the external instructions $I_5$ and $I_6$. The operating units 604 to 607 are connected to the instruction decoder 603 and operate to output the signals to the output circuit 9 from the micro order 9 outputted from the instruction decoder 603. The instruction decoder 608 operates to receive the external instructions $I_1$ and $I_2$ and output the micro order 1, 2, 3 or 4 according to the values of the inputted external instructions $I_1$ and $I_2$. The output circuit 609 is connected to the operating units 604 to 607 and the instruction decoder 608 and operates to output the operated results obtained by the operating units 604 to 607 according to the micro order outputted from the instruction decoder 608.

As mentioned above, since the input circuit 602 receives a binary signal, the instruction decoder 601 operates to output the micro order 7. Each of the operating units 604 to 607 is made of a binary OR circuit. Hence, the instruction decoder 603 serves to output the micro order 9. Then, by the micro order 1, 2, 3 or 4 outputted from the instruction decoder 608, the addition, the subtraction, the multiplication or the squaring is executed by the corresponding one of the operating units 604 to 607. The output circuit 609 outputs one of the operated results obtained by the operating units 604 to 607.

Figure 5:
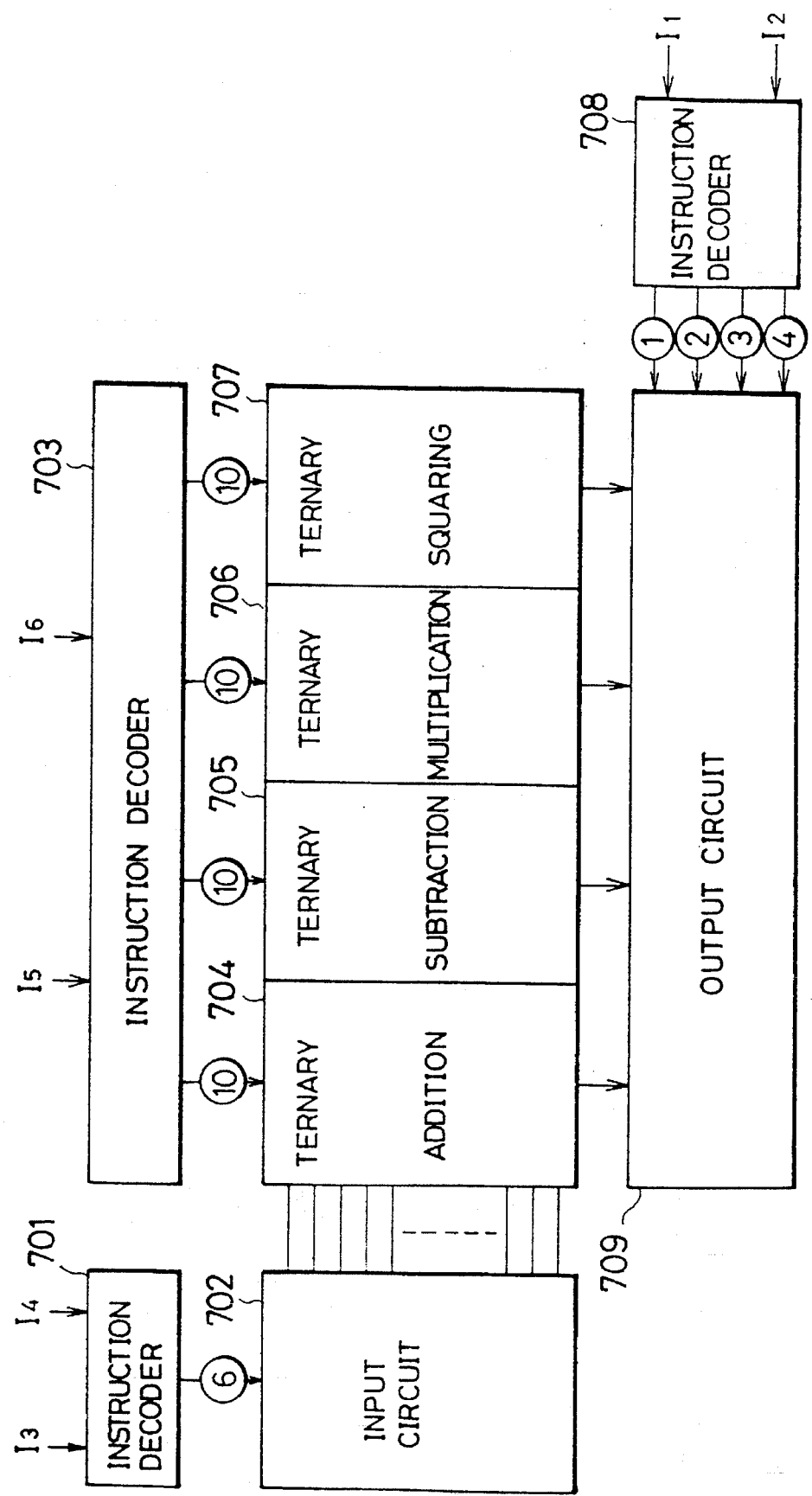
FIG. 5 is a block diagram showing another combination of the multi-functional operating circuit shown in FIG. 2.

In the combination shown in FIG. 5, the multi-functional operating circuit as shown in FIG. 2 is arranged to have an instruction decoder 701, a ternary input circuit 702, an instruction decoder 703, operating units 704 to 707, an instruction decoder 708, and an output circuit 709. The instruction decoder 701 operates to receive the external instructions $I_3$ and $I_4$ and output a micro order 6 according to the values of the external instructions $I_3$ and $I_4$. The ternary input circuit 702 is connected to the instruction decoder 701 and is selected by the micro order 6 outputted from the instruction decoder 701. The instruction decoder 703 operates to input the external instructions $I_5$ and $I_6$ and output the micro order 10 according to the values of the inputted external instructions $I_5$ and $I_6$. The operating units 704 to 707 are connected to the instruction decoder 703 and are selected by the micro order 10 outputted from the instruction decoder 703. The instruction decoder 708 operates to receive the external instructions $I_1$ and $I_2$ and output the micro order 1, 2, 3 or 4 according to the values of the inputted external instructions $I_1$ and $I_2$. The output circuit 709 is connected to the operating units 704 to 707 and the instruction decoder 708 and operates to output the operated results obtained by the operating units 704 to 707 according to the micro order outputted by the instruction decoder 708.

As mentioned above, since the input circuit 702 receives a ternary signal, the instruction decoder 701 outputs a micro order 6.

Each of the operating units 704 to 707 is composed of a ternary OR circuit. Hence, the instruction decoder 703 outputs the micro order 10.

By one of the micro orders 1, 2, 3 and 4 outputted from the instruction decoder 708, the corresponding one of addition, subtraction, multiplication and squaring is executed in the corresponding one of the operating units 704 to 707. The output circuit 709 outputs the operated results obtained by the operating units 704 to 707.

Figure 6:
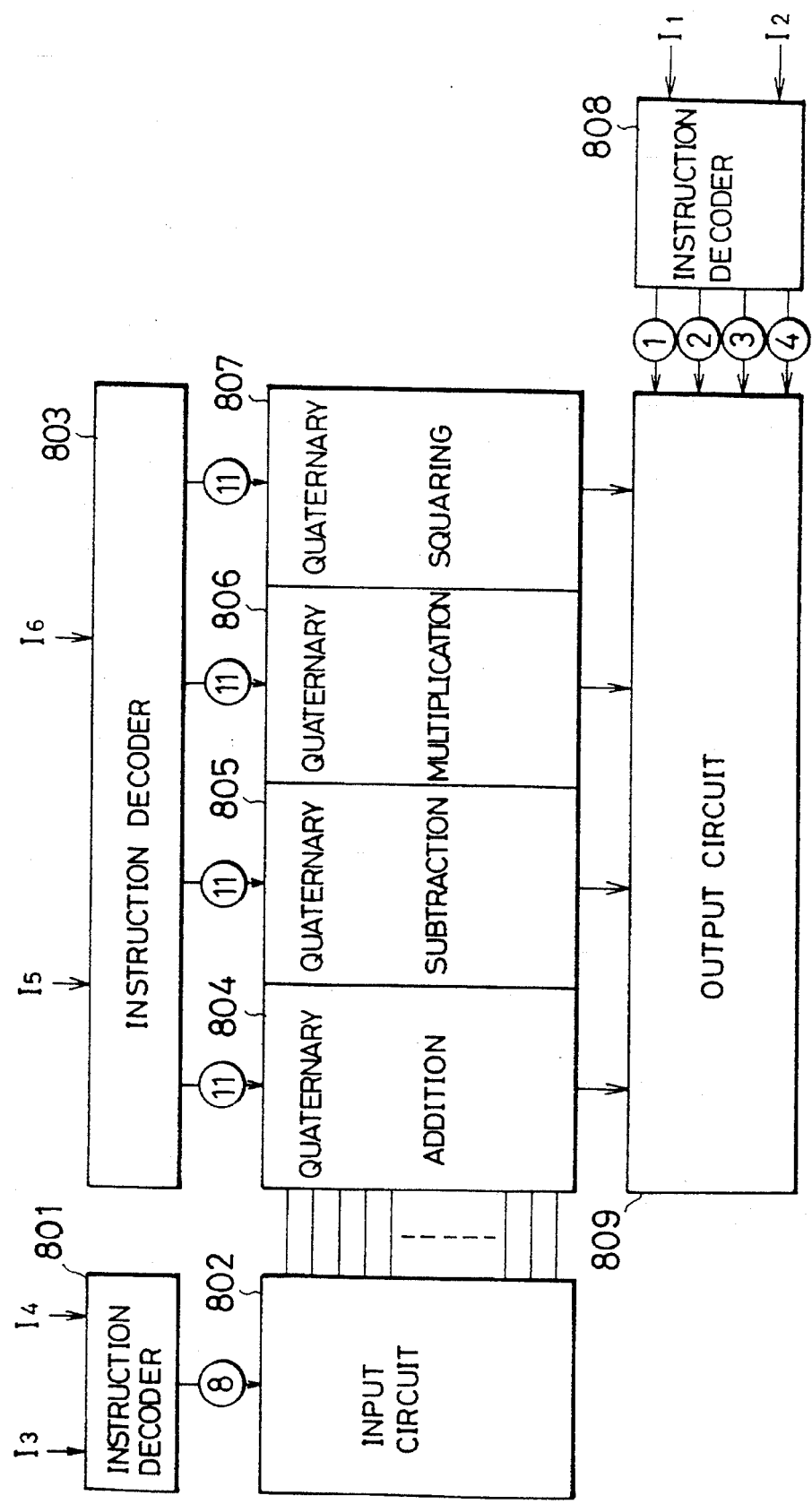
FIG. 6 is a block diagram showing another combination of the multi-functional operating circuit shown in FIG. 2.

In the combination shown in FIG. 6, the multi-functional operating circuit as shown in FIG. 2 is arranged to have an instruction decoder 801, a quaternary input circuit 802, an instruction decoder 803, operating units 804 to 807, an instruction decoder 808, and an output circuit 809. The instruction decoder 801 operates to receive the external instructions $I_3$ and $I_4$ and output a micro order 8 according to the values of the inputted external instructions $I_3$ and $I_4$. The quaternary input circuit 802 is connected to the instruction decoder 801 and is selected by the micro order 8 outputted from the instruction decoder 801. The instruction decoder 803 operates to receive the external instructions $I_5$ and $I_6$ and output the micro order 11 according to the values of the inputted external instructions $I_5$ and $I_6$. The operating units 804 to 807 are connected to the instruction decoder 803 and are selected by the micro order outputted from the instruction decoder 803. Each of the operating units 804 to 807 is composed of a quaternary OR circuit. The instruction decoder 808 operates to receive the external instructions $I_1$ and $I_2$ and output the micro order 1, 2, 3 or 4. The output circuit 809 are connected to the operating units 804 to 807 and the instruction decoder 808 and operate to output the operated results obtained by the operating units 804 to 807 according to the micro order outputted by the instruction decoder 808.

As mentioned above, since the input circuit 802 receives a quaternary signal, the instruction decoder 801 outputs the micro order 8. Further, since the operating units 804 to 807 are each composed of a quaternary OR circuit, the instruction decoder 803 outputs the micro order 11.

By the micro order 1, 2, 3 or 4 outputted from the instruction decoder 808, the addition, the subtraction, the multiplication or the squaring is executed in the corresponding one of the operating units 804 to 807. The output circuit 809 outputs the operated results obtained by the operating units 804 to 807.

Figure 7:
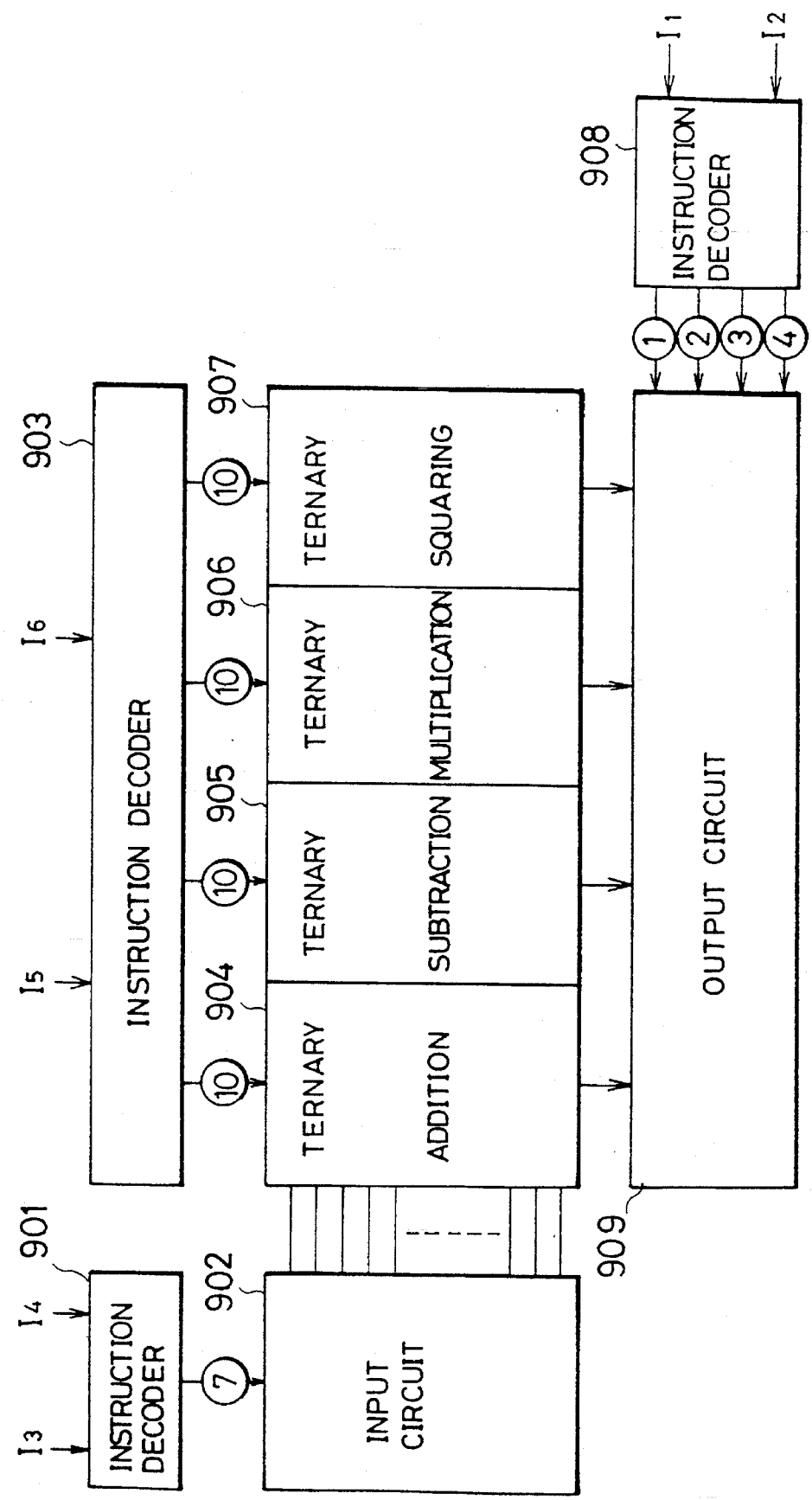
FIG. 7 is a block diagram showing another combination of the multi-functional operating circuit shown in FIG. 2.

In the combination shown in FIG. 7, the multi-functional operating circuit as shown in FIG. 2 is arranged to have an instruction order 901, a binary input circuit 902, an instruction decoder 903, operating units 904 to 907, an instruction decoder 908 and an output circuit 909. The instruction decoder 901 operates to receive the external instructions $I_3$ and $I_4$ and output the micro order 7 according to the values of the inputted external instructions $I_3$ and $I_4$. The binary input circuit 902 is connected to the instruction decoder 901 and is selected by the micro order 7 outputted from the instruction decoder 901. The instruction decoder 903 operates to receive the external instructions $I_5$ and $I_6$ and output the micro order according to the values of the inputted external instructions $I_5$ and $I_6$. The operating units 904 to 907 are connected to the instruction decoder 903 and are selected by the micro order 10 outputted from the instruction decoder 903. Each of the operating units is composed of a ternary OR circuit. The instruction decoder operates to receive the external instructions $I_1$ and $I_2$ and output the micro order 1, 2, 3 or 4 according to the values of the inputted external instructions $I_1$ and $I_2$. The output circuit 909 is connected to the operating units 904 to 907 and the instruction decoder 908 and operates to output the operated results obtained by the operating units 904 to 907 according to the micro order outputted from the instruction decoder 908.

As mentioned above, since the input circuit 902 receives a binary signal, the instruction decoder 901 outputs the micro order 7. Further, since the operating unit 904 to 907 are each composed of ternary OR circuit, the instruction decoder 903 outputs the micro order 10. By the micro order 1, 2, 3 or 4 outputted from the instruction decoder 908, the addition, the subtraction, the multiplication or the squaring is executed in the corresponding one of the operating units 904 to 907. The output circuit 909 outputs the operated results obtained by the operating units 904 to 907.

Figure 8:
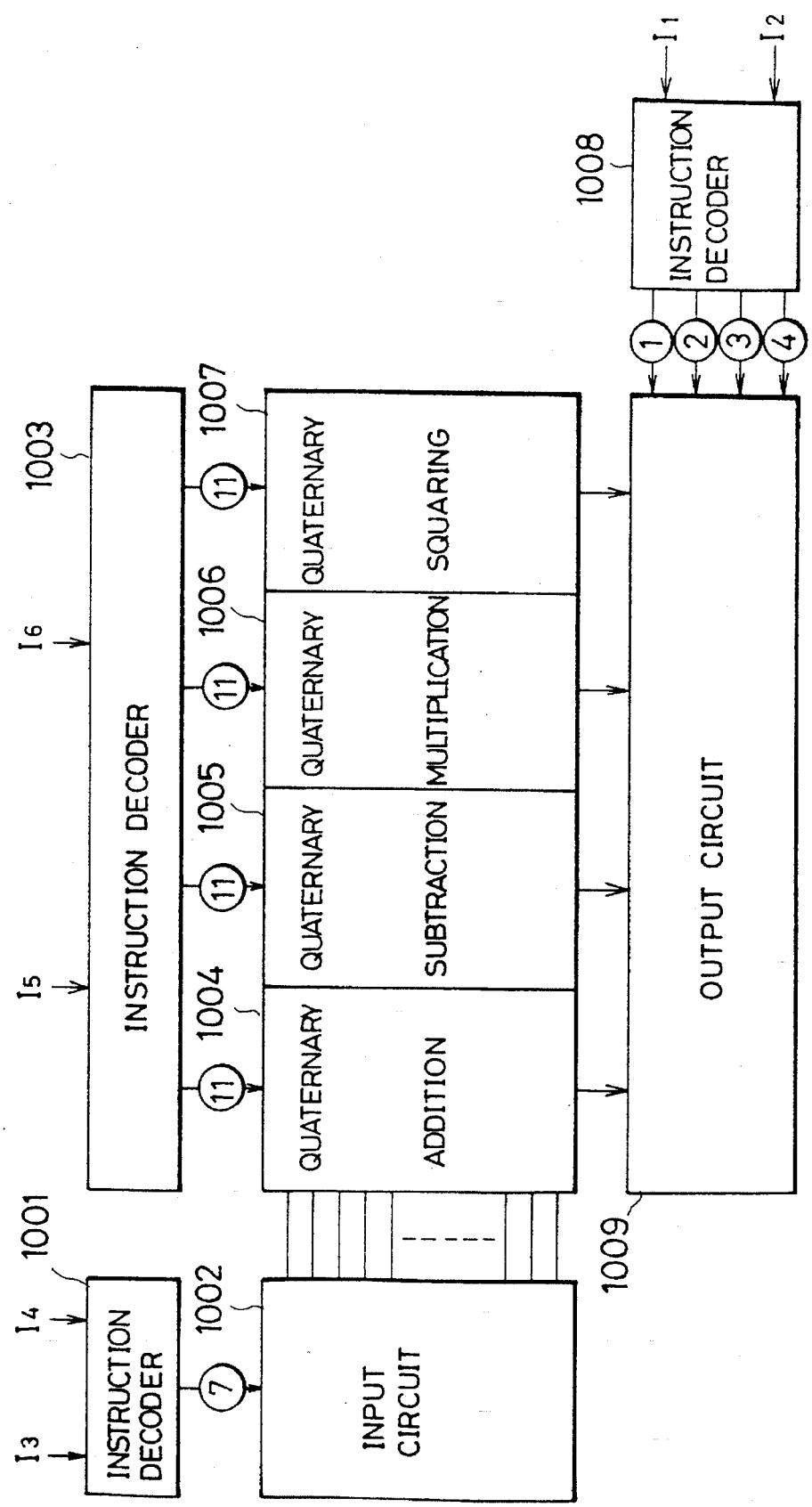
FIG. 8 is a block diagram showing another combination of the multi-functional operating circuit shown in FIG. 2.

In the arrangement shown in FIG. 8, the multi-functional operating circuit shown in FIG. 2 is arranged to have an instruction decoder 1001, a binary input circuit 1002, an instruction decoder 1003, operating units 1004 to 1007, an instruction decoder 1008, and an output circuit unit 1009.

In operation, the instruction decoder 1001 operates to receive external instructions $I_3$ and $I_4$ and output a micro order 7 according to the values of the external instructions $I_3$ and $I_4$. The binary input circuit 1002 is connected to the instruction decoder 1001 and is selected by the micro order 7 outputted from the instruction decoder 1001. The instruction decoder 1003 operates to receive external instructions $I_5$ and $I_{16}$ and output a micro order 11 according to the values of the external instructions $I_5$ and $I_6$. The operating units 1004 to 1007 are connected to the instruction decoder 1003 and are each composed of an OR circuit unit. The operating units 1004 to 1007 operate to output from a quaternary OR circuit selected by the micro order 11 outputted from the instruction decoder 1003. The instruction decoder 1008 operates to receive external instructions $I_1$ and $I_2$ and output micro orders 1, 2, 3 and/or 4 according to the values of the external instructions $I_1$ and $I_2$. The output circuit 1009 is connected to the operating units 1004 to 1007 and the instruction decoder 1008 and operate the operated results obtained by the operating units 1004 to 1007 according to the micro orders outputted from the instruction decoder 1008.

As mentioned above, since the input circuit 1002 receives a binary signal, the instruction decoder 1001 outputs a micro order 7. The OR circuits composing the operating units 1004 to 1007 are quaternary OR circuits. Hence, the instruction decoder 1003 outputs a micro order 11.

By the micro orders 1, 2, 3 and/or 4 outputted from the instruction decoder 1008, the addition, the subtraction, the multiplication and/or the squaring are executed in the operating units 1004 to 1007, respectively. The output circuit 1009 outputs the operated results obtained by the operating units 1004 to 1007.

Figure 9:
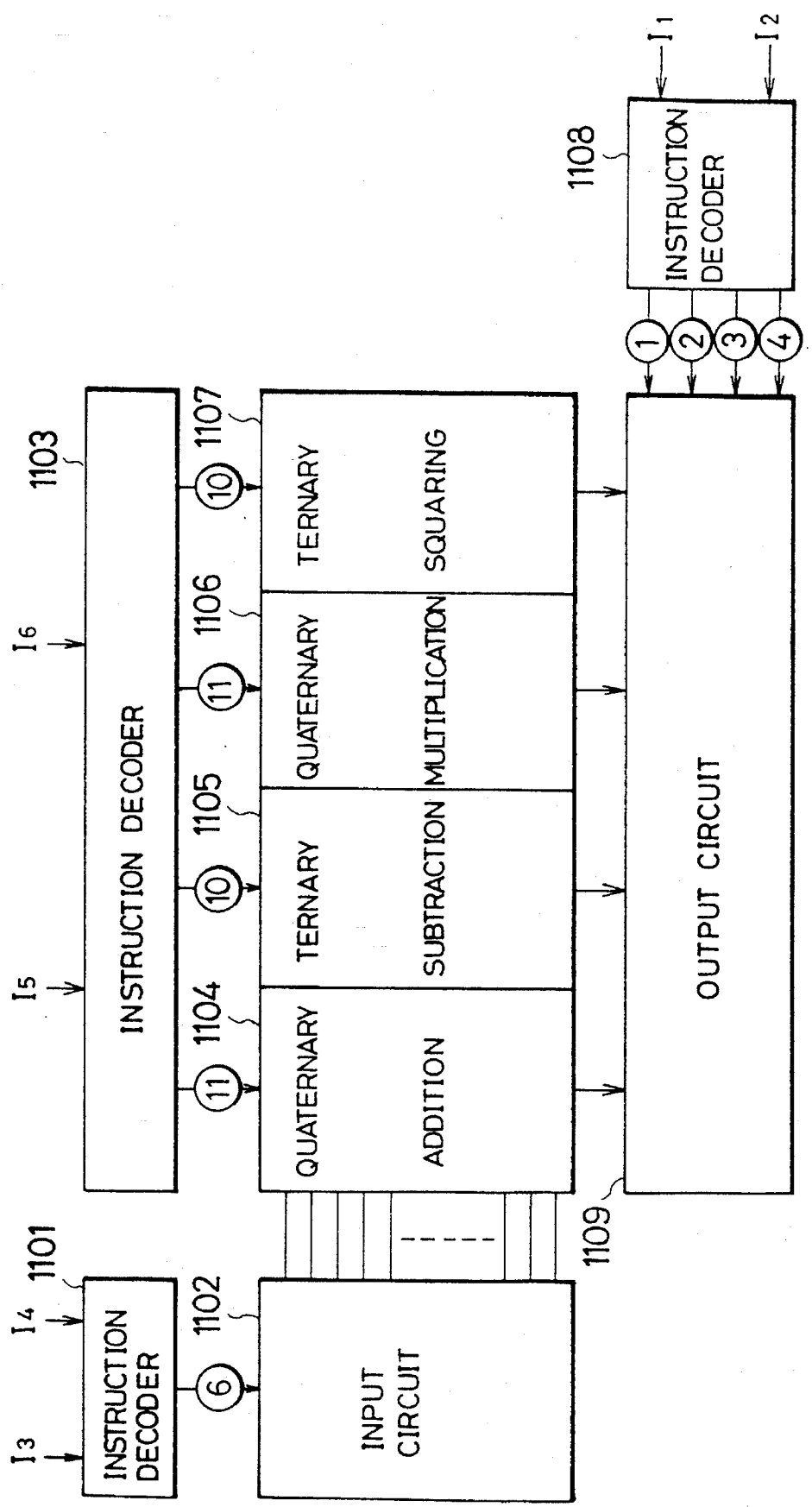
FIG. 9 is a block diagram showing another combination of the multi-functional operating circuit shown in FIG. 2.

In the combination shown in FIG. 9, the multi-functional operating circuit as shown in FIG. 2 is arranged to have an instruction decoder 1101, a ternary input circuit 1102, an instruction decoder 1103, operating units 1105 and 1107, the other type of operating units 1104 and 1106, an instruction decoder 1108 and an output circuit 1109.

In operation, the instruction decoder 1101 operates to receive external instructions $I_3$ and $I_4$ and output a micro order 6 according to the values of the external instructions $I_3$ and $I_4$. The ternary input circuit 1102 is connected to the instruction decoder 1101 and is selected by the micro order 6 outputted from the instruction decoder 1101. The instruction decoder 1103 operates to receive external instructions $I_5$ and $I_{16}$ and output micro orders 10 and 11 according to the values of the external instructions $I_5$ and $I_6$. The operating units 1105 and 1107 are connected to the instruction decoder 1103 and are each composed of a ternary OR circuit. The operating units 1105 and 1107 operate to output from a ternary OR circuit selected by the micro order 10 outputted from the instruction decoder 1103. The other operating units 1104 and 1106 are also connected to the instruction decoder 1103 and are each composed of a quaternary OR circuit. The other operating units 1104 and 1106 operate to output from a quaternary OR circuit selected by the micro order 11. The instruction decoder 1008 operates to receive external instructions $I_1$ and $I_2$ and output micro orders 1, 2, 3 and/or 4 according to the values of the received external instructions $I_1$ and $I_2$. The output circuit 1109 is connected to the instruction decoder 1108 and the operating units 1104 to 1107 and operates to output the operated results obtained by the operating units 1104 to 1107 according to the micro orders outputted from the instruction decoder 1108.

As mentioned above, since the input circuit 1102 receives a ternary signal, the instruction decoder 1101 operates to output the micro order 6.

The operating units 1104 and 1106 are each composed of a quaternary OR circuit. Hence, the instruction decoder 1103 operates to output the micro order 11. The operating units 1105 and 1107 are each composed of a ternary OR circuit. Hence, the instruction decoder 1103 operates to output the micro order 10.

By the micro orders 1, 2, 3 and/or 4, the addition, the subtraction, the multiplication and the squaring are executed by the corresponding one of the operating units 1104 to 1107. The output circuit 1109 operates to output the operated results obtained by the operating units 1104 to 1107.

Figure 10:
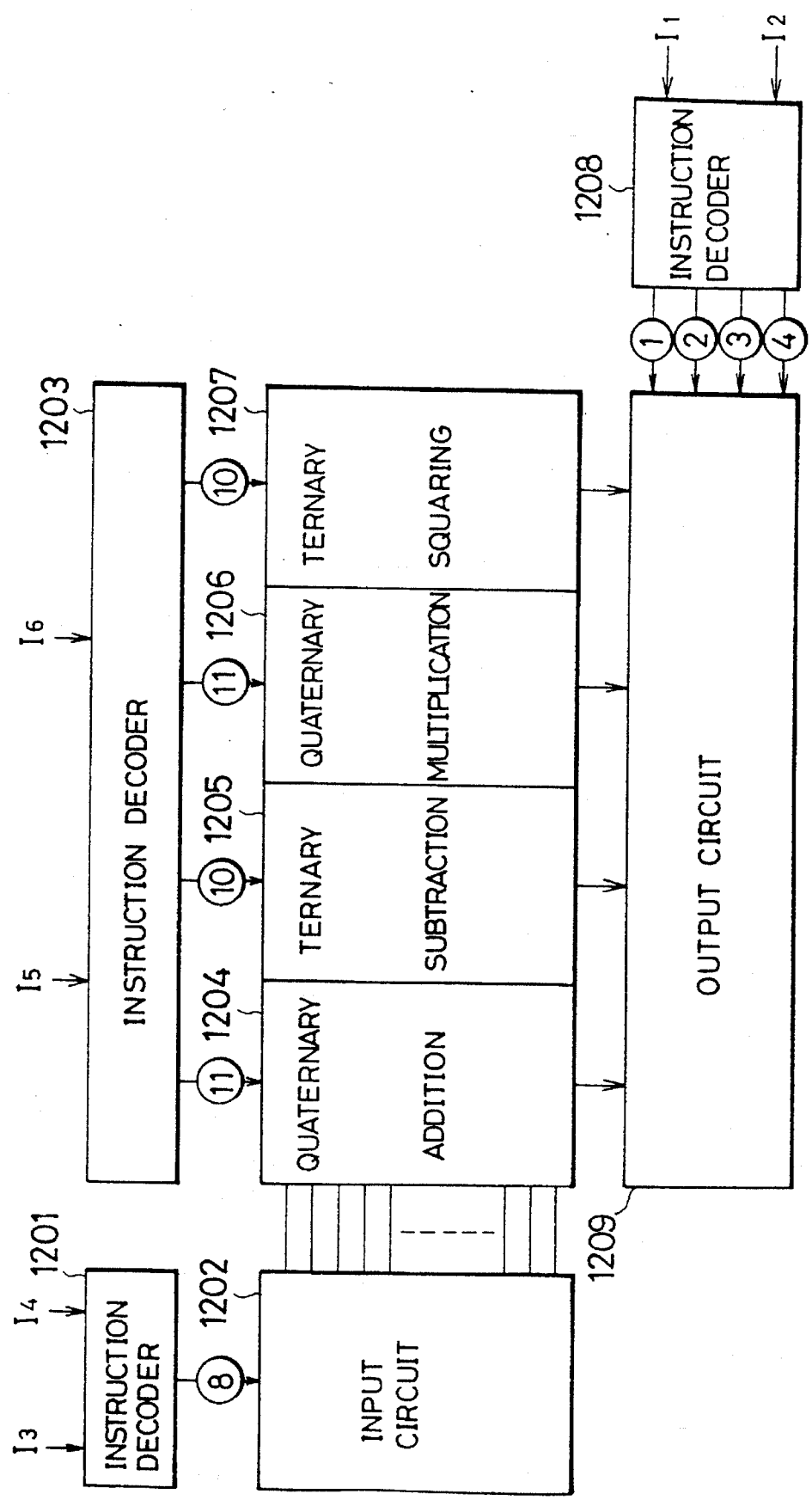
FIG. 10 is a block diagram showing another combination of the multi-functional operating circuit shown in FIG. 2.

In the combination as shown in FIG. 10, the multifunctional operating circuit as shown in FIG. 2 is arranged to have an instruction decoder 1201, a quaternary input circuit 1202, an instruction decoder 1203, operating units 1205 and 1207, the other operating units 1204 and 1206, an instruction decoder 1208 and an output circuit 1209.

In operation, the instruction decoder 1201 operates to receive external instructions $I_3$ and $I_4$ and output a micro order 8 according to the values of the external instructions $I_3$ and $I_4$. The quaternary input circuit 1202 is connected to the instruction decoder 1201 and is selected by the micro order 8 outputted from the instruction decoder 1201. The instruction decoder 1203 operates to receive external instructions $I_5$ and $I_6$ and output micro orders 10 and 11 according to the values of the external instructions $I_5$ and $I_6$. The operating units 1205 and 1207 are connected to the instruction decoder 1203 and are each composed of a ternary OR circuit. The operating units 1205 and 1207 operate to output from a ternary OR circuit selected by the micro order 10 outputted from the instruction decoder 1203. The other operating units 1204 and 1206 are connected to the instruction decoder 1203 and are each composed of a quaternary OR circuit. The operating units 1204 and 1206 operate to output from a quaternary OR circuit selected by the micro order 11. The instruction decoder 1208 operates to receive external instructions $I_1$ and $I_2$ and output micro orders 1, 2, 3 and/or 4 according to the values of the external instructions $I_1$ and $I_2$. The output circuit 1209 is connected to the operating units 1204 to 1207 and the instruction decoder 1208 and operates to output the operated results obtained by the operating units 1204 to 1207 according to the micro orders outputted from the instruction decoder 1208.

As mentioned above, since the input circuit 1202 receives a quaternary signal, the instruction decoder 1201 operates to output the micro order 8. Further, the operating units 1204 and 1206 are each composed of a quaternary OR circuit. Hence, the instruction decoder 1203 operates to output the micro order 11. The operating units 1205 and 1207 are each composed of a ternary OR circuit. Hence, the instruction decoder 1203 operates to output the micro order 10.

By the micro orders 1, 2, 3, and/or 4 outputted from the instruction decoder 1208, the addition, the subtraction, the multiplication and the squaring are executed by the corresponding ones of the operating units 1204 to 1207. The output circuit 1209 operates to output the operated results obtained by the operating units 1204 to 1207.

Figure 11:
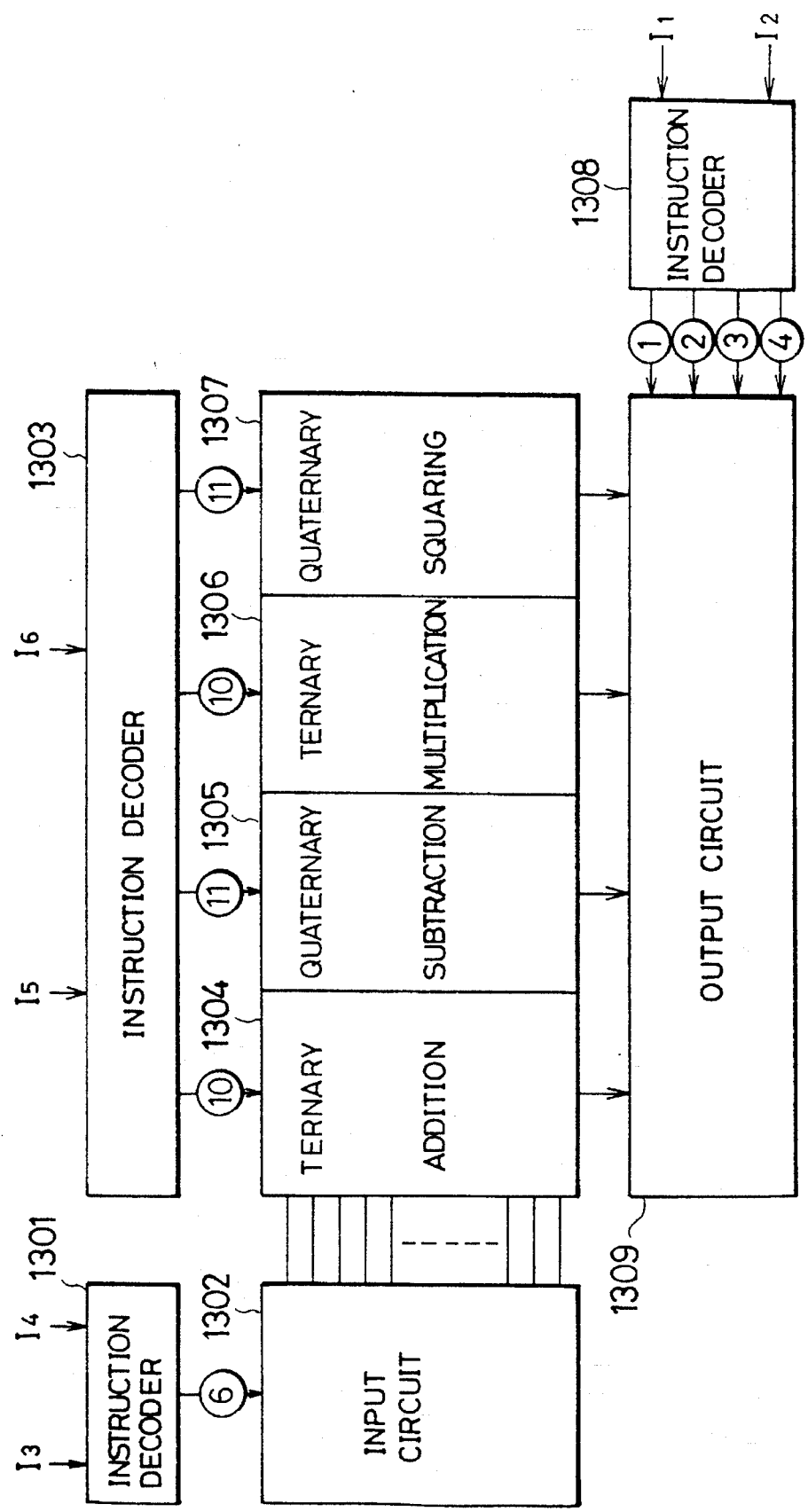
FIG. 11 is a block diagram showing another combination of the multi-functional operating circuit shown in FIG. 2.

In the combination as shown in FIG. 11, the multifunctional operating circuit as shown in FIG. 2 is arranged to have an instruction decoder 1301, a ternary input circuit 1302, an instruction decoder 1303, operating units 1304 and 1306, the other operating units 1305 and 1307, an instruction decoder 1308 and an output circuit 1309.

In operation, the instruction decoder 1301 operates to receive external instructions $I_3$ and $I_4$ and output a micro order 6 according to the values of the external instructions $I_3$ and $I_4$. The ternary input circuit 1302 is connected to the instruction decoder 1301 and is selected by the micro order 6 outputted from the instruction decoder 1301. The instruction decoder 1303 operates to receive external instructions $I_5$ and $I_6$ and output micro orders 10 and 11 according to the values of the external instructions $I_5$ and $I_6$. The operating units 1304 and 1306 are connected to the instruction decoder 1303 and are each composed of a ternary OR circuit. The operating units 1304 and 1306 operate to output from a ternary OR circuit selected by the micro order 10 outputted from the instruction decoder 1303. The other operating units 1305 and 1307 are connected to the instruction decoder 1303 and are each composed of a quaternary OR circuit. The operating units 1305 and 1307 operate to output from a quaternary OR circuit selected by the micro order 11. The instruction decoder 1308 operates to receive external instructions $I_1$ and $I_2$ and output micro orders 1, 2, 3 and/or 4 according to the values of the external instructions $I_1$ and $I_2$. The circuit output 1309 is connected to the operating units 1304 to 1307 and the instruction decoder 1308 and operates to output the operated results obtained by the operating units 1304 to 1307 according to the micro orders outputted from the instruction decoder 1308.

As mentioned above, since the input circuit 1302 receives a ternary signal, the instruction decoder 1301 operates to output the micro order 6. Further, the operating units 1305 and 1307 are each composed of a quaternary OR circuit. Hence, the instruction decoder 1303 operates to output the micro order 11. The operating units 1304 and 1306 are each composed of a ternary OR circuit. Hence, the instruction decoder 1303 operates to output the micro order 10.

By the micro orders 1, 2, 3, and/or 4 outputted from the instruction decoder 1308, the addition, the subtraction, the multiplication and the squaring are executed by the corresponding ones of the operating units 1304 to 1307. The output circuit 1309 operates to output the operated results obtained by the operating units 1304 to 1307.

Figure 12:
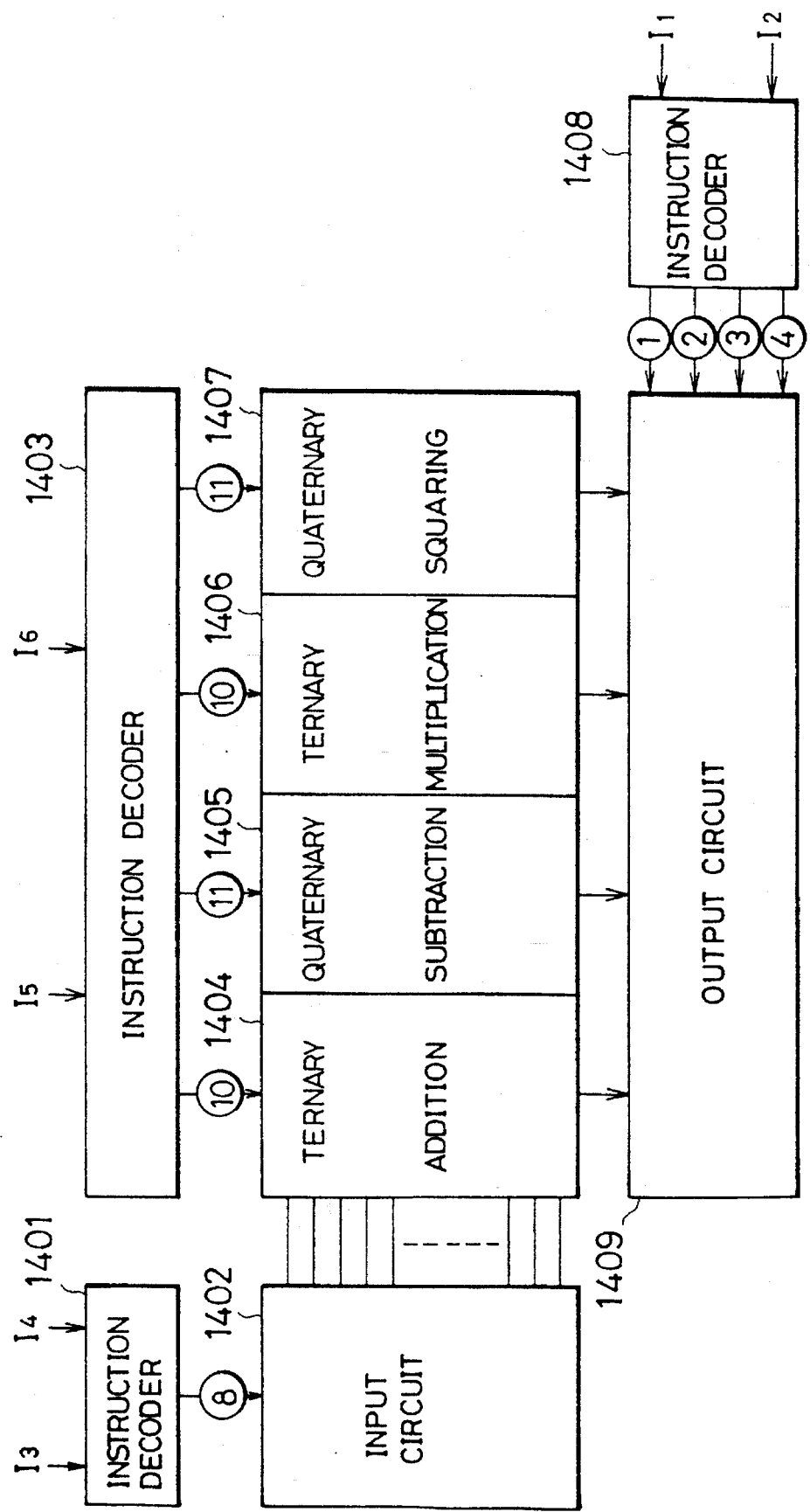
FIG. 12 is a block diagram showing another combination of the multi-functional operating circuit shown in FIG. 2.

In the combination as shown in FIG. 12, the multifunctional operating circuit as shown in FIG. 2 is arranged to have an instruction decoder 1401, a quaternary input circuit 1402, an instruction decoder 1403, operating units 1404 and 1406, the other operating units 1405 and 1407, an instruction decoder 1408 and an output circuit 1409.

In operation, the instruction decoder 1401 operates to receive external instructions $I_3$ and $I_4$ and output a micro order 8 according to the values of the external instructions $I_3$ and $I_4$. The quaternary input circuit 1402 is connected to the instruction decoder 1401 and is selected by the micro order 8 outputted from the instruction decoder 1401. The instruction decoder 1403 operates to receive external instructions $I_5$ and $I_6$ and output micro orders 10 and 11 according to the values of the external instructions $I_5$ and $I_6$. The operating units 1404 and 1406 are connected to the instruction decoder 1403 and are each composed of a ternary OR circuit. The operating units 1404 and 1406 operate to output from a ternary OR circuit selected by the micro order 10 outputted from the instruction decoder 1403. The other operating units 1405 and 1407 are connected to the instruction decoder 1403 and are each composed of a quaternary OR circuit. The operating units 1405 and 1407 operate to output from a quaternary OR circuit selected by the micro order 11. The instruction decoder 1408 operates to receive external instructions $I_1$ and $I_2$ and output micro orders 1, 2, 3 and/or 4 according to the values of the external instructions $I_1$ and $I_2$. The circuit output 1409 is connected to the operating units 1404 to 1407 and the instruction decoder 1408 and operates to output the operated results obtained by the operating units 1404 to 1407 according to the micro orders outputted from the instruction decoder 1408.

As mentioned above, since the input circuit 1402 receives a quaternary signal, the instruction decoder 1401 operates to output the micro order 8. Further, the operating units 1405 and 1407 are each composed of a quaternary OR circuit. Hence, the instruction decoder 1403 operates to output the micro order 11. The operating units 1404 and 1406 are each composed of a ternary OR circuit. Hence, the instruction decoder 1403 operates to output the micro order 10.

By the micro orders 1, 2, 3, and/or 4 outputted from the instruction decoder 1408, the addition, the subtraction, the multiplication and the squaring are executed by the corresponding ones of the operating units 1404 to 1407. The output circuit 1409 operates to output the operated results obtained by the operating units 1404 to 1407.

Figure 13:
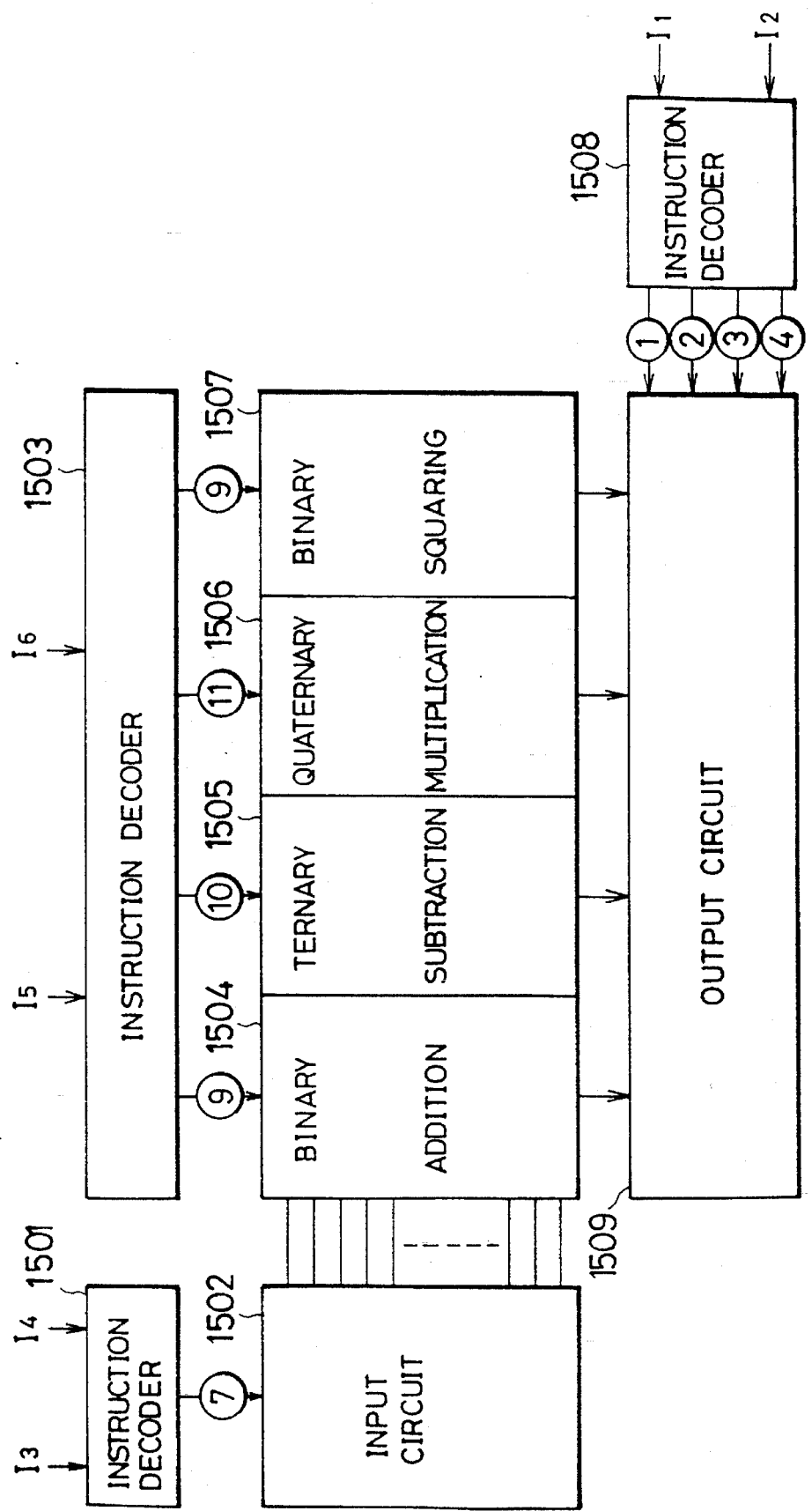
FIG. 13 is a block diagram showing another combination of the multi-functional operating circuit shown in FIG. 2.

In the combination as shown in FIG. 13, the multifunctional operating circuit as shown in FIG. 2 is arranged to have an instruction decoder 1501, a binary input circuit 1502, an instruction decoder 1503, operating units 1504 and 1507, the other operating units 1505 and 1506, an instruction decoder 1508 and an output circuit 1509.

In operation, the instruction decoder 1501 operates to receive external instructions $I_3$ and $I_4$ and output a micro order 7 according to the values of the external instructions $I_3$ and $I_4$. The binary input circuit 1502 is connected to the instruction decoder 1501 and is selected by the micro order 7 outputted from the instruction decoder 1501. The instruction decoder 1503 operates to receive external instructions $I_5$ and $I_6$ and output micro orders 9, 10 and 11 according to the values of the external instructions $I_5$ and $I_6$. The operating units 1504 and 1507 are connected to the instruction decoder 1503 and are each composed of a binary OR circuit. The operating unit 1505 is connected to the instruction decoder 1503 and composed of a ternary OR circuit and operates to output from a ternary OR circuit selected by the micro order 10. The operating unit 1506 is connected to the instruction decoder 1503 and composed of a quaternary OR circuit and operates to output from a quaternary OR circuit selected by the micro order 11. The instruction decoder 1508 operates to receive external instructions $I_1$ and $I_2$ and output micro orders 1, 2, 3 and/or 4 according to the values of the external instructions $I_1$ and $I_2$. The circuit output 1509 is connected to the operating units 1504 to 1507 and the instruction decoder 1508 and operates to output the operated results obtained by the operating units 1504 to 1507 according to the micro orders outputted from the instruction decoder 1508.

As mentioned above, since the input circuit 1502 receives a binary signal, the instruction decoder 1501 operates to output the micro order 7. Further, the operating units 1504 and 1507 are each composed of a binary OR circuit. Hence, the instruction decoder 1503 operates to output the micro order 9. The operating unit 1505 is composed of a ternary OR circuit. Hence, the instruction decoder 1503 operates to output the micro order 10. The operating unit 1506 is composed of a quaternary OR circuit. Hence, the instruction decoder 1503 operates to output the micro order 11.

By the micro orders 1, 2, 3, and/or 4 outputted from the instruction decoder 1508, the addition, the subtraction, the multiplication and the squaring are executed by the corresponding ones of the operating units 1504 to 1507. The output circuit 1509 operates to output the operated results obtained by the operating units 1504 to 1507.

Figure 14:
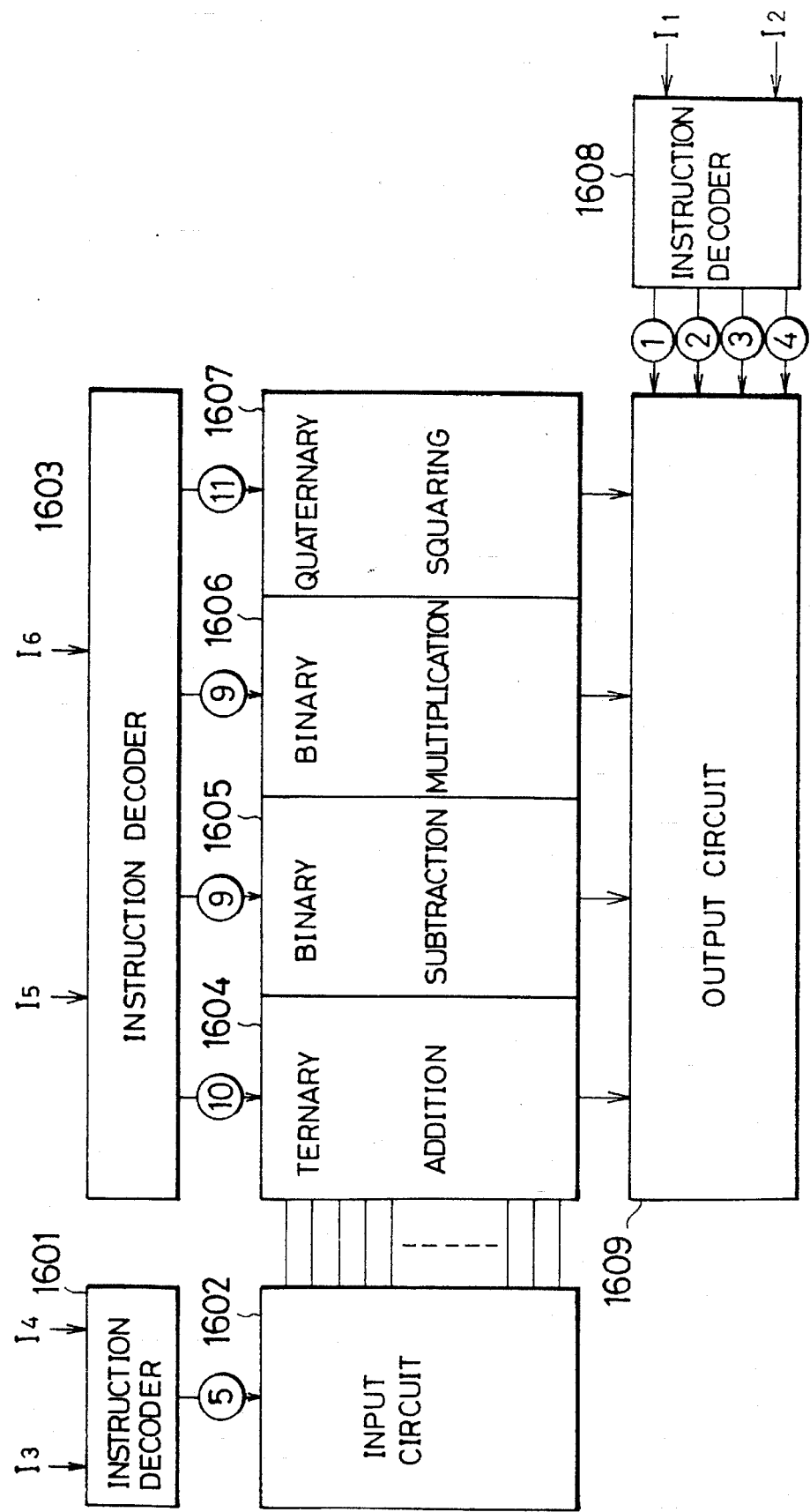
FIG. 14 is a block diagram showing another combination of the multi-functional operating circuit shown in FIG. 2.

In the combination as shown in FIG. 14, the multifunctional operating circuit as shown in FIG. 2 is arranged to have an instruction decoder 1601, a binary input circuit 1602, an instruction decoder 1603, operating units 1604 to 1607, an instruction decoder 1608 and an output circuit 1609.

In operation, the instruction decoder 1601 operates to receive external instructions $I_3$ and $I_4$ and output a micro order 5 according to the values of the external instructions $I_3$ and $I_4$. The binary input circuit 1602 is connected to the instruction decoder 1601 and is selected by the micro order 5 outputted from the instruction decoder 1601. The instruction decoder 1603 operates to receive external instructions $I_5$ and $I_6$ and output micro orders 9, 10 and 11 according to the values of the external instructions $I_5$ and $I_6$. The operating units 1605 and 1606 are connected to the instruction decoder 1603 and are each composed of a binary OR circuit. The operating units 1605 and 1606 operate to output from a binary OR circuit selected by the micro order 9 outputted from the instruction decoder 1603. The operating unit 1604 is connected to the instruction decoder 1603 and is composed of a ternary OR circuit. The operating unit 1604 operates to output from a ternary OR circuit selected by the micro order 10. The operating unit 1607 is also connected to the instruction decoder 1603 and is composed of a quaternary OR circuit. The operating unit 1607 operates to output from a quaternary OR circuit selected by the micro order 11. The instruction decoder 1608 operates to receive external instructions $I_1$ and $I_2$ and output micro orders 1, 2, 3 and/or 4 according to the values of the external instructions $I_1$ and $I_2$. The circuit output 1609 is connected to the operating units 1604 to 1607 and the instruction decoder 1608 and operates to output the operated results obtained by the operating units 1604 to 1607 according to the micro orders outputted from the instruction decoder 1608.

As mentioned above, since the input circuit 1602 receives a binary signal, the instruction decoder 1601 operates to output the micro order 5. Further, the operating units 1605 and 1606 are each composed of a binary OR circuit. Hence, the instruction decoder 1603 operates to output the micro order 9. The operating unit 1604 is composed of a ternary OR circuit. Hence, the instruction decoder 1603 operates to output the micro order 10. The operating unit 1607 is composed of a quaternary OR circuit. Hence, the instruction decoder 1603 operates to output the micro order 11.

By the micro orders 1, 2, 3, and/or 4 outputted from the instruction decoder 1608, the addition, the subtraction, the multiplication and the squaring are executed by the corresponding ones of the operating units 1604 to 1607. The output circuit 1609 operates to output the operated results obtained by the operating units 1604 to 1607.

Figure 15:
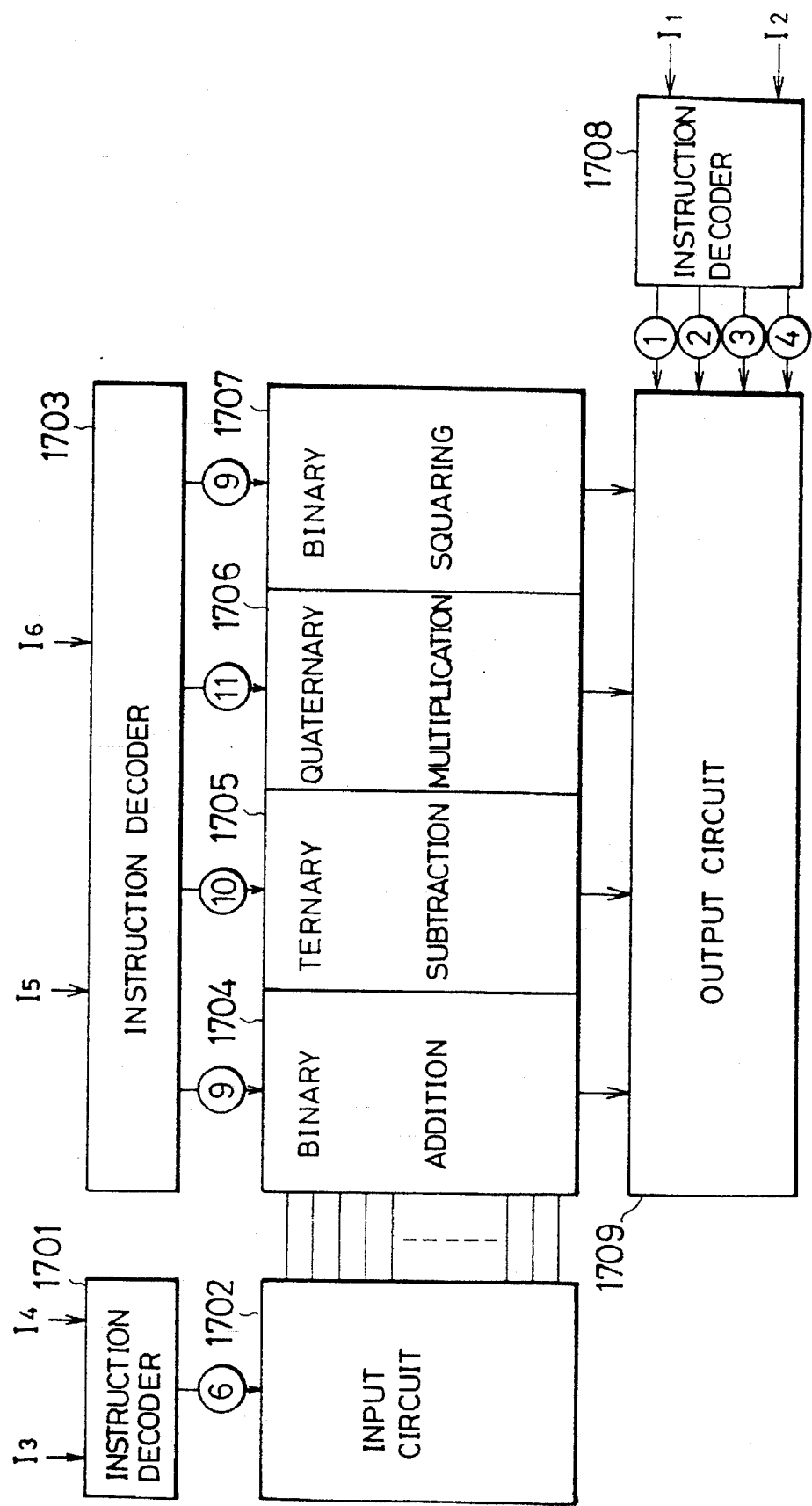
FIG. 15 is a block diagram showing another combination of the multi-functional operating circuit shown in FIG. 2.

In the combination as shown in FIG. 15, the multi-functional operating circuit as shown in FIG. 2 is arranged to have an instruction decoder 1701, a ternary input circuit 1702, an instruction decoder 1703, operating units 1704 to 1707, an instruction decoder 1708 and an output circuit 1709.

In operation, the instruction decoder 1701 operates to receive external instructions $I_3$ and $I_4$ and output a micro order 6 according to the values of the external instructions $I_3$ and $I_4$. The ternary input circuit 1702 is connected to the instruction decoder 1701 and is selected by the micro order 6 outputted from the instruction decoder 1701. The instruction decoder 1703 operates to receive external instructions $I_5$ and $I_6$ and output micro orders 9, 10 and 11 according to the values of the external instructions $I_5$ and $I_6$. The operating units 1704 and 1707 are connected to the instruction decoder 1703 and are each composed of a binary OR circuit. The operating units 1704 and 1707 operate to output from a binary OR circuit selected by the micro order 9 outputted from the instruction decoder 1703. The operating unit 1705 is connected to the instruction decoder 1703 and is composed of a ternary OR circuit. The operating units 1705 operates to output from a ternary OR circuit selected by the micro order 10. The operating unit 1706 is also connected to the instruction decoder 1708 and is composed of a quaternary OR circuit. The operating unit 1706 operates to output from a quaternary circuit selected by the micro order 11. The instruction decoder 1708 operates to receive external instructions $I_1$ and $I_2$ and output micro orders 1, 2, 3 and/or 4 according to the values of the external instructions $I_1$ and $I_2$. The circuit output 1709 is connected to the operating units 1704 to 1707 and the instruction decoder 1708 and operates to output the operated results obtained by the operating units 1704 to 1707 according to the micro orders outputted from the instruction decoder 1708.

As mentioned above, since the input circuit 1702 receives a ternary signal, the instruction decoder 1701 operates to output the micro order 6. Further, the operating units 1704 and 1707 are each composed of a binary OR circuit. Hence, the instruction decoder 1703 operates to output the micro order 9. The operating unit 1705 is composed of a ternary OR circuit. Hence, the instruction decoder 1703 operates to output the micro order 10. The operating unit 1706 is composed of a quaternary OR circuit. Hence, the instruction decoder 1703 operates to output the micro order 11.

By the micro orders 1, 2, 3, and/or 4 outputted from the instruction decoder 1708, the addition, the subtraction, the multiplication and the squaring are executed by the corresponding ones of the operating units 1704 to 1707. The output circuit 1709 operates to output the operated results obtained by the operating units 1704 to 1707.

Figure 16:
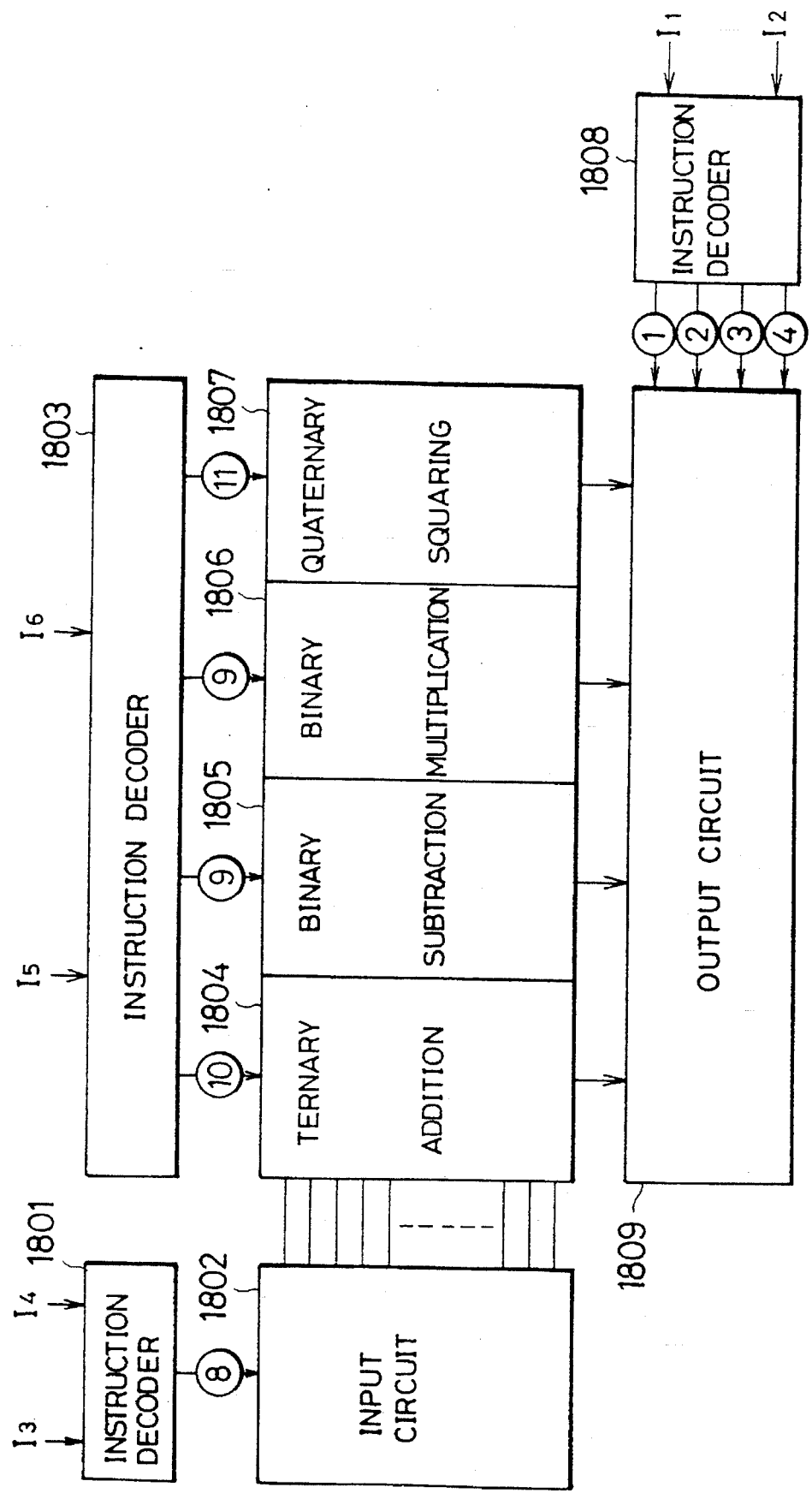
FIG. 16 is a block diagram showing another combination of the multi-functional operating circuit shown in FIG. 2.

In the combination as shown in FIG. 16, the multi-functional operating circuit as shown in FIG. 2 is arranged to have an instruction decoder 1801, a quaternary input circuit 1802, an instruction decoder 1803, operating units 1804 to 1807, an instruction decoder 1808 and an output circuit 1809.

In operation, the instruction decoder 1801 operates to receive external instructions $I_3$ and $I_4$ and output a micro order 8 according to the values of the external instructions $I_3$ and $I_4$. The quaternary input circuit 1802 connected to the instruction decoder 1801 is selected by the micro order 8 outputted from the instruction decoder 1801. The instruction decoder 1803 operates to receive external instructions $I_5$ and $I_6$ and output micro orders 9, 10 and 11 according to the values of the external instructions $I_5$ and $I_6$. The operating units 1805 and 1806 are connected to the instruction decoder 1803 and are each composed of a binary OR circuit. The operating unit 1804 is connected to the instruction decoder 1803 and is composed of a ternary OR circuit. The operating unit 1804 operates to output from a ternary OR circuit selected by the micro order 10 outputted from the instruction decoder 1803. The other operating unit 1807 is also connected to the instruction decoder 1803 and composed of a quaternary OR circuit. The operating unit 1807 operates to output from a quaternary OR circuit selected by the micro order 11. The instruction decoder 1808 operates to receive external instructions $I_1$ and $I_2$ and output micro orders 1, 2, 3 and/or 4 according to the values of the external instructions $I_1$ and $I_2$. The circuit output 1809 is connected to the operating units 1804 to 1807 and the instruction decoder 1808 and operates to output the operated results obtained by the operating units 1804 to 1807 according to the micro orders outputted from the instruction decoder 1808.

As mentioned above, since the input circuit 1802 receives a quaternary signal, the instruction decoder 1801 operates to output the micro order 8. Further, the operating units 1805 and 1806 are each composed of a binary OR circuit. Hence, the instruction decoder 1803 operates to output the micro order 9. The operating unit 1804 is composed of a ternary OR circuit. Hence, the instruction decoder 1803 operates to output the micro order 10. The operating unit 1807 is composed of a quaternary OR circuit. Hence, the instruction decoder 1803 operates to output the micro order 11.

By the micro orders 1, 2, 3, and/or 4 outputted from the instruction decoder 1808, the addition, the subtraction, the multiplication and the squaring are executed by the corresponding ones of the operating units 1804 to 1807. The output circuit 1809 operates to output the operated results obtained by the operating units 1804 to 1807.

That is, as mentioned above, the multi-functional operating circuit having an arrangement shown in FIG. 2 is capable of executing various operations as shown in FIGS. 4 to 16 according to a micro order outputted in response to an external instruction. Since the external instruction dynamically changes with time, the operating function dynamically changes accordingly. The input circuit may be statically controlled. The OR circuit may be statically controlled as well. In general, the output circuit is dynamically controlled, because it serves to output the operated results.

Figure 17:
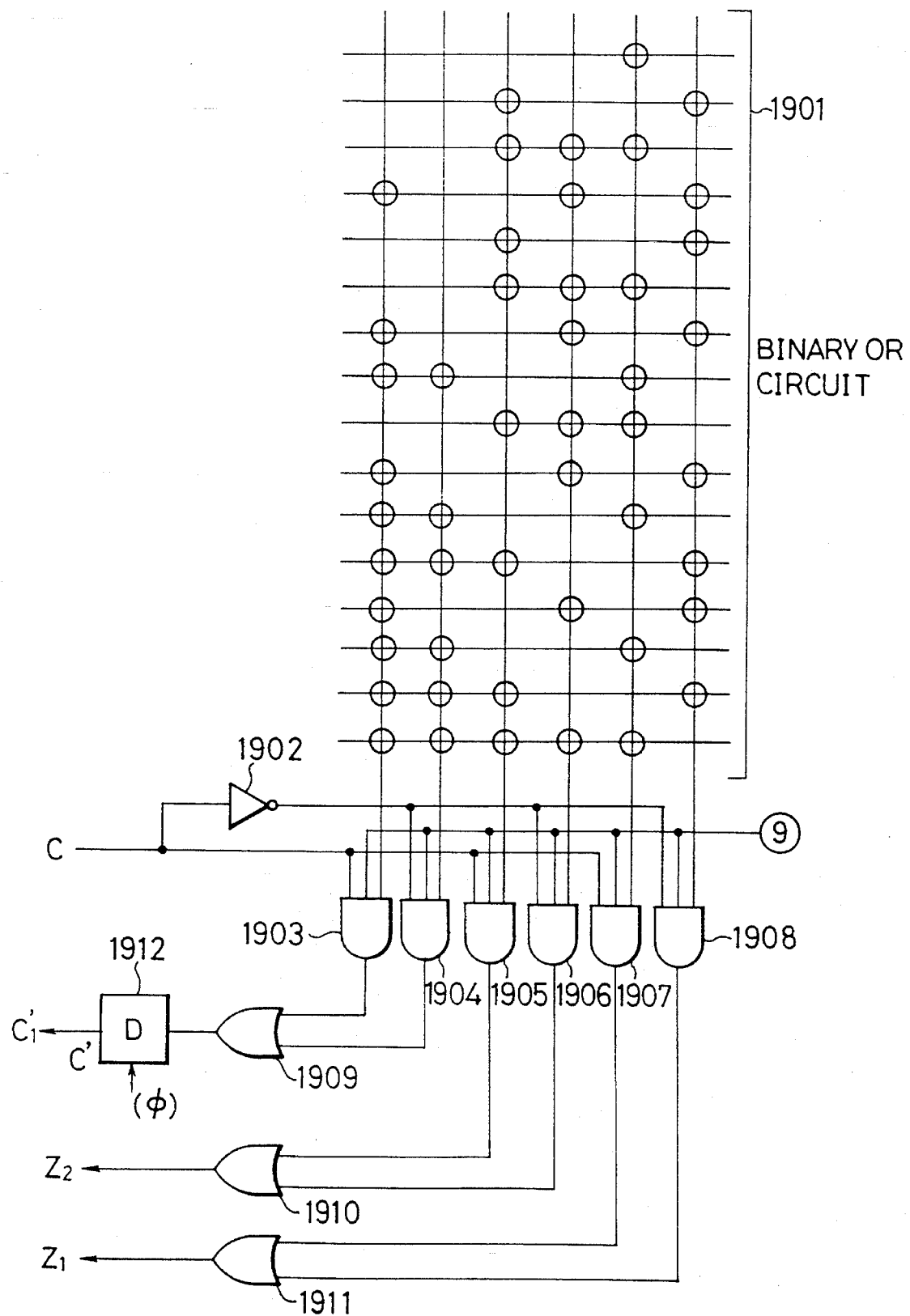
FIG. 17 is a block diagram showing an arrangement of a binary adding circuit included in the circuit 1 of FIG. 1.

FIG. 17 shows an arrangement of a binary adding circuit corresponding to the circuit unit [1] shown in FIG. 1. The binary adding circuit as shown in FIG. 17 is arranged to have a binary OR circuit 1901, a NOT circuit element 1902 connected to a carry input C, an AND circuit element 1903 to 1908, OR circuit elements 1909, 1910 and 1911, and a delay circuit element 1912.

The OR circuit unit shown in FIG. 17 and each OR circuit units to be described below in the following drawings include components indicated by ○. These components stand for multi-functional elements or quantizing functional elements.

Figure 18:
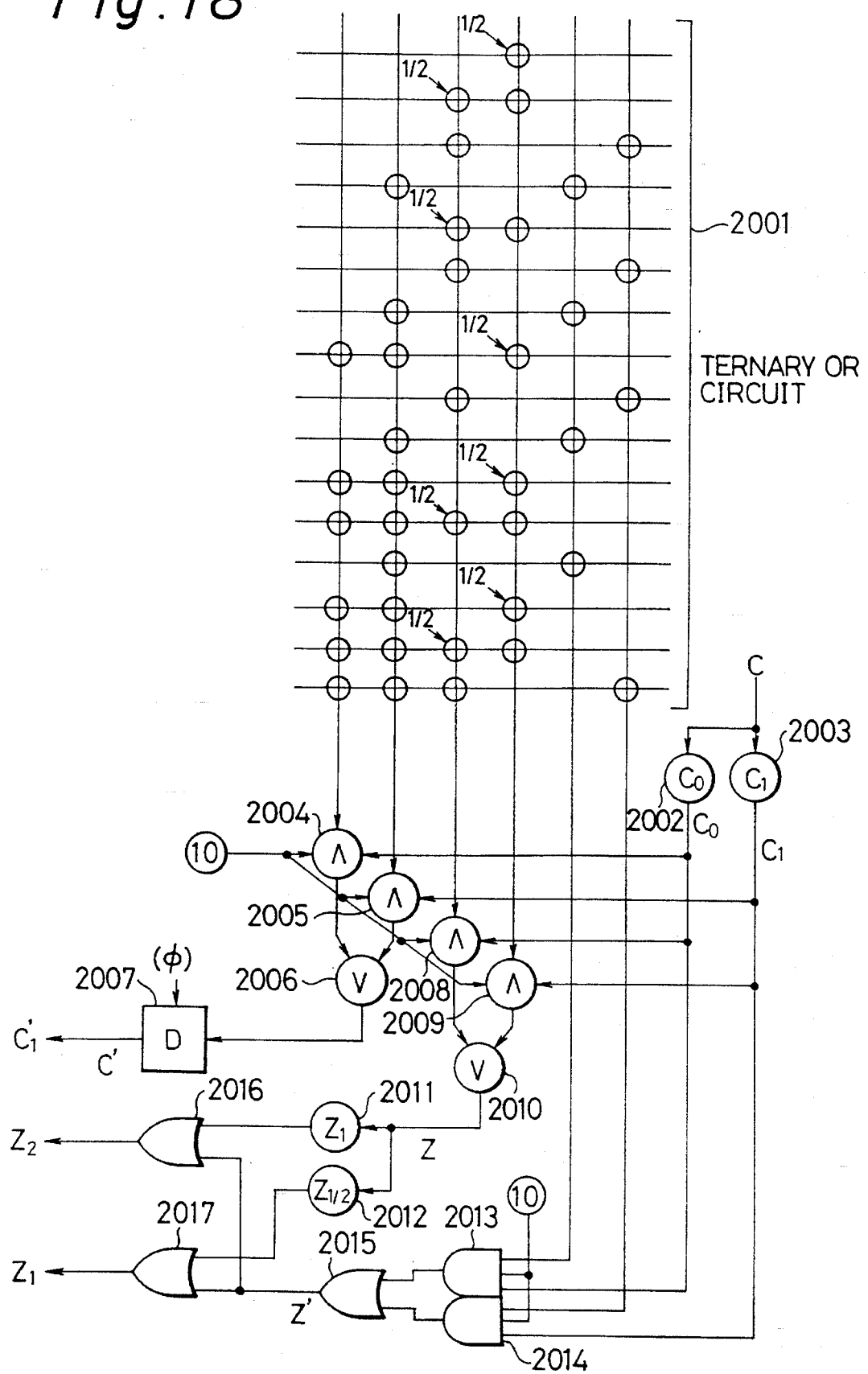
FIG. 18 is a block diagram showing an arrangement of a ternary adding circuit included in the circuit [2] of FIG. 1.

FIG. 18 shows an arrangement of a ternary adding circuit corresponding to the circuit unit [2] shown in FIG. 1. The ternary adding circuit shown in FIG. 18 is arranged to have a ternary OR circuit 2001, I/O elements 2002 and 2003 connected to a carry input C, AND circuit elements 2004, 2005, 2008 and 2009, I/O elements 2011 and 2012, AND circuit elements 2013 and 2014, and OR circuit elements 2015 to 2017.

Figure 19:
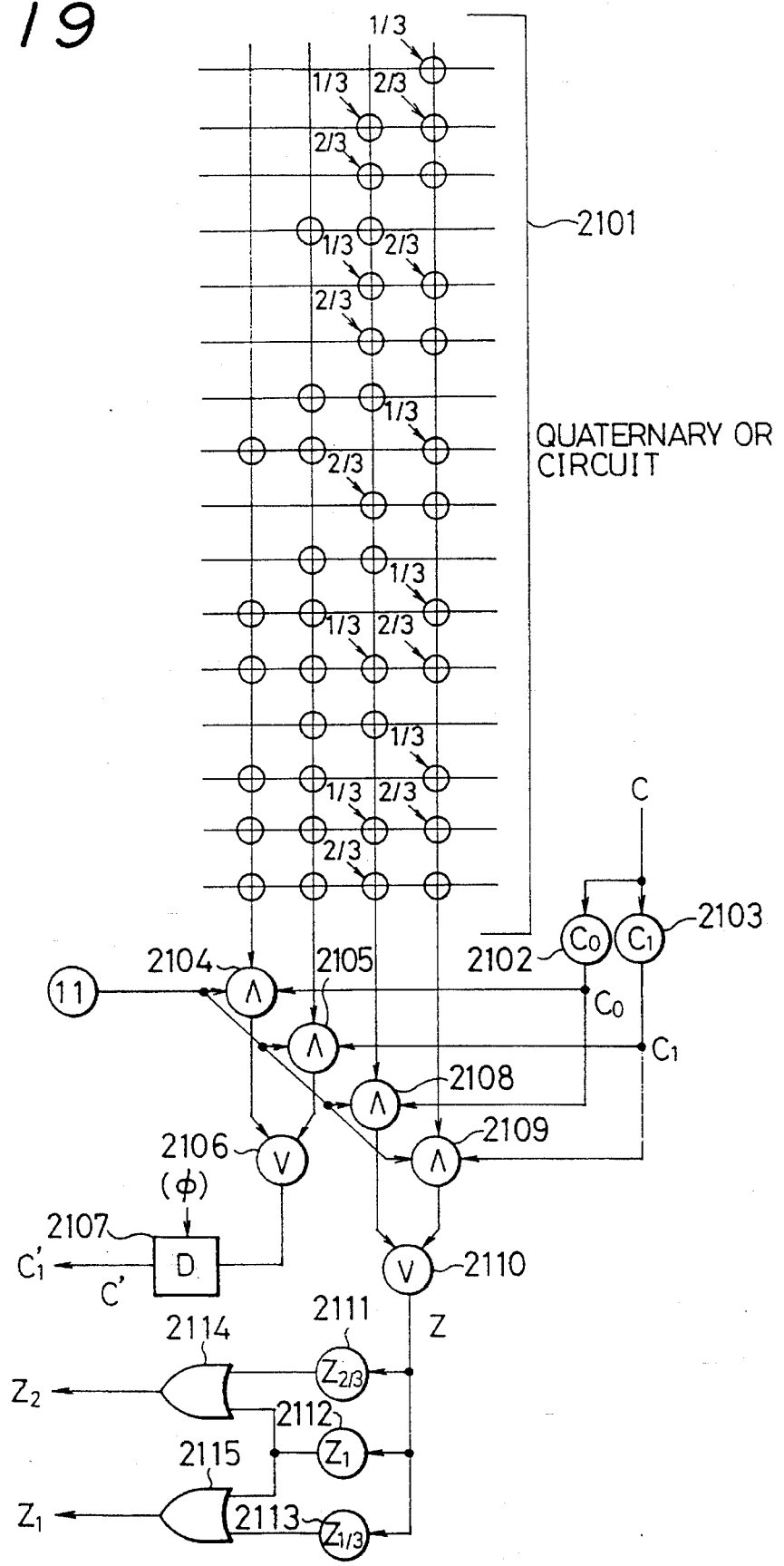
FIG. 19 is a block diagram showing an arrangement of a quaternary adding circuit included in the circuit [3] of FIG. 1.

FIG. 19 shows an arrangement of a quaternary adding circuit corresponding to the circuit unit [3] as shown in FIG. 1. The quaternary adding circuit shown in FIG. 19 is arranged to have a quaternary OR circuit 2101, I/O elements 2102 and 2103 connected to a carry input C, AND circuit elements 2104, 2105, 2108 and 2109, OR circuit elements 2106 and 2110, a delay circuit element 2107, I/O elements 2111, 2112 and 2113, and OR circuit elements 2114 and 2115.

The detailed arrangements and operations of the multi-valued adding circuits as shown in FIG. 17 to 19 are not described herein, because they are described in the Japanese Patent Application No. Hei 4-316680 filed by the same inventors as the present invention.

Figure 20:
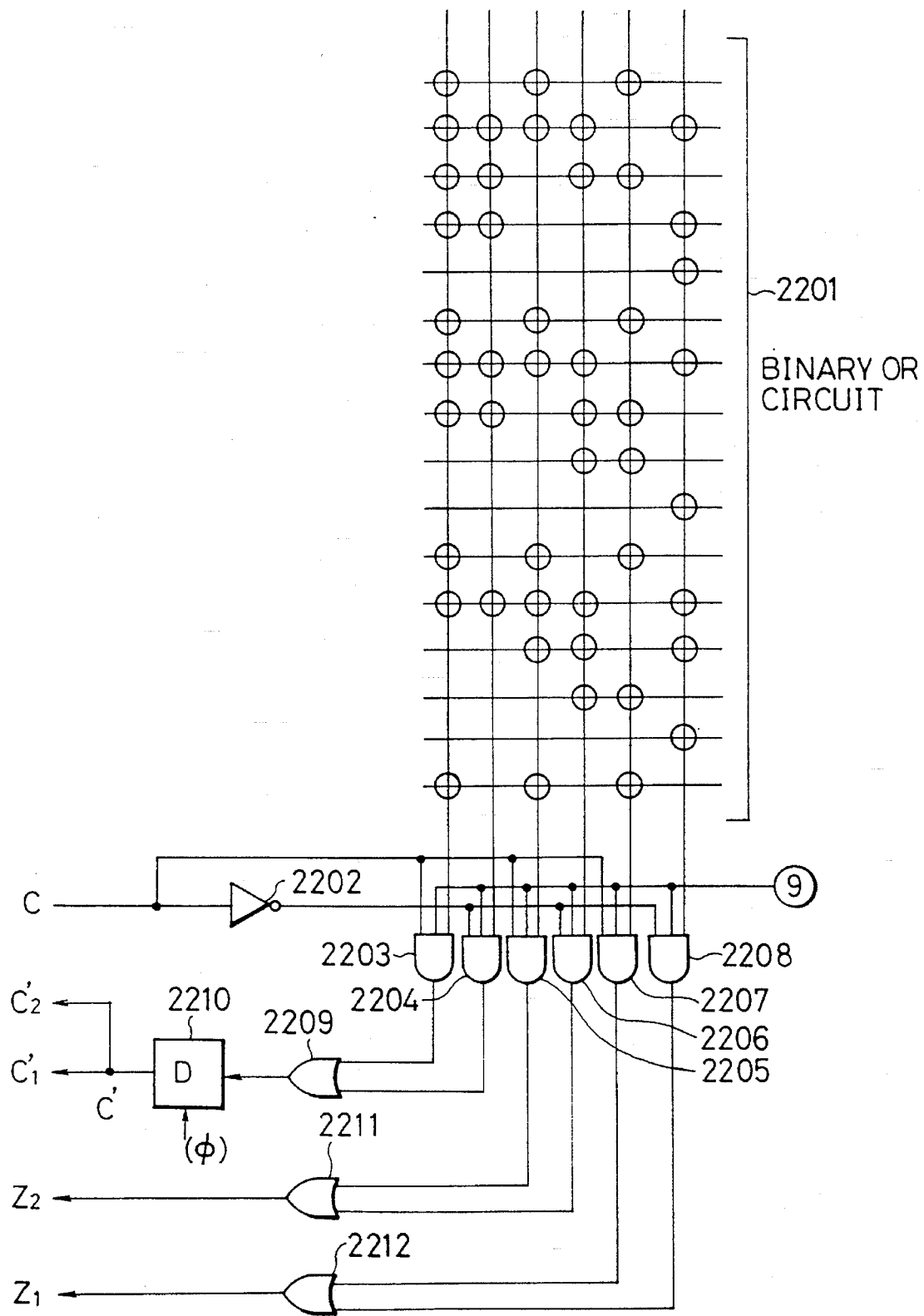
FIG. 20 is a block diagram showing an arrangement of a binary subtracting circuit included in the circuit [4] of FIG. 1.

FIG. 20 shows an arrangement of a binary subtracting circuit corresponding to the circuit unit [4] shown in FIG. 1. The binary subtracting circuit shown in FIG. 20 is arranged to have a binary OR circuit 2201, a NOT circuit element 2202, AND circuit elements 2203 to 2208, OR circuit elements 2209, 2211, and 2212, and a delay circuit element 2210.

Figure 21:
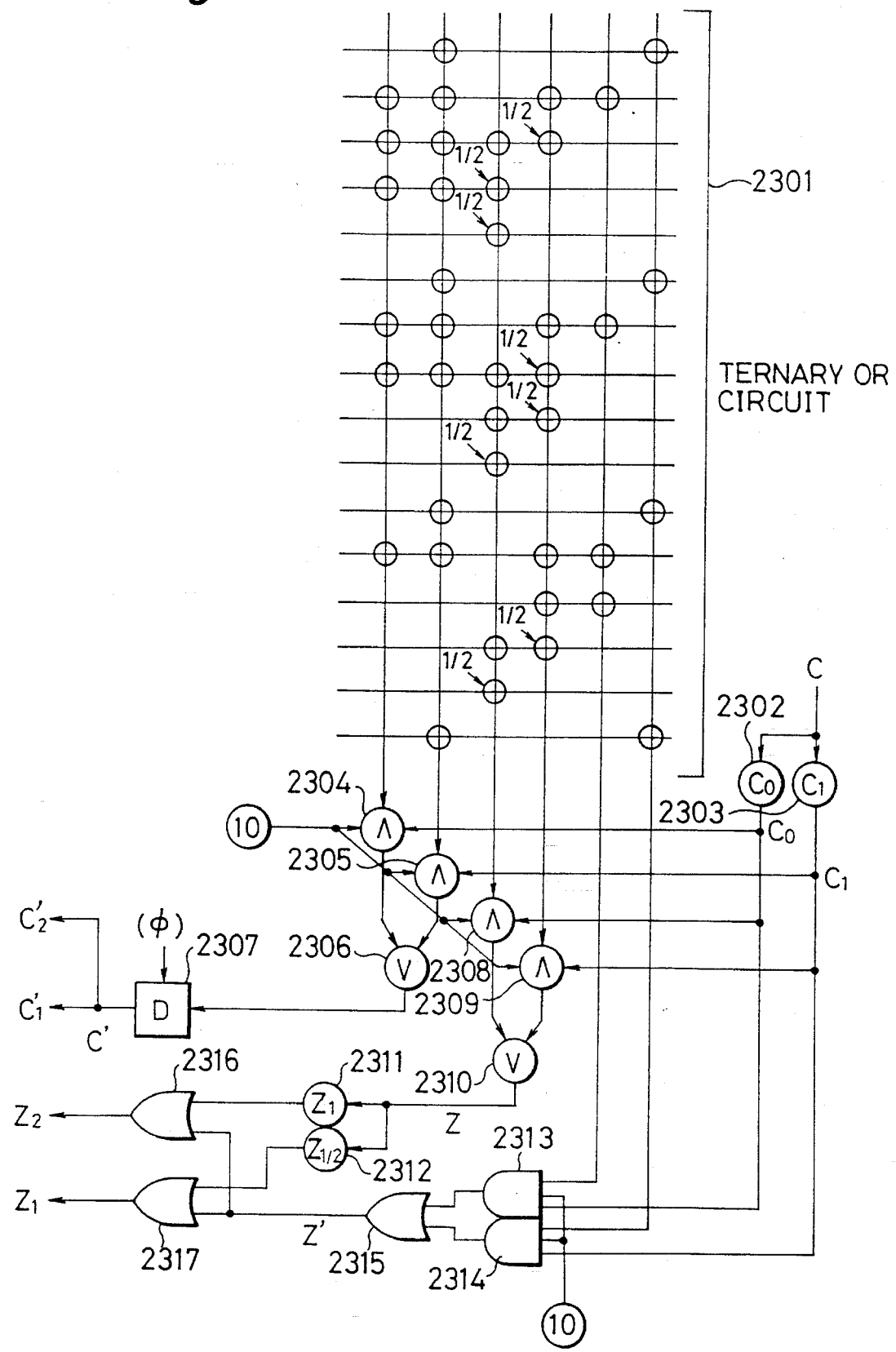
FIG. 21 is a block diagram showing an arrangement of a ternary subtracting circuit included in the circuit [5] of FIG. 1.

FIG. 21 shows an arrangement of a ternary subtracting circuit corresponding to the circuit unit [5] shown in FIG. 1. The ternary subtracting circuit shown in FIG. 21 is arranged to have a ternary OR circuit 2301, I/O elements 2302 and 2303 connected to a carry input C, AND circuit elements 2304, 2305, 2308 and 2309, OR circuit elements 2306 and 2310, a delay circuit element 2307, I/O elements 2311 and 2312, AND circuit elements 2313 and 2314, and OR circuit elements 2315 to 2317.

Figure 22:
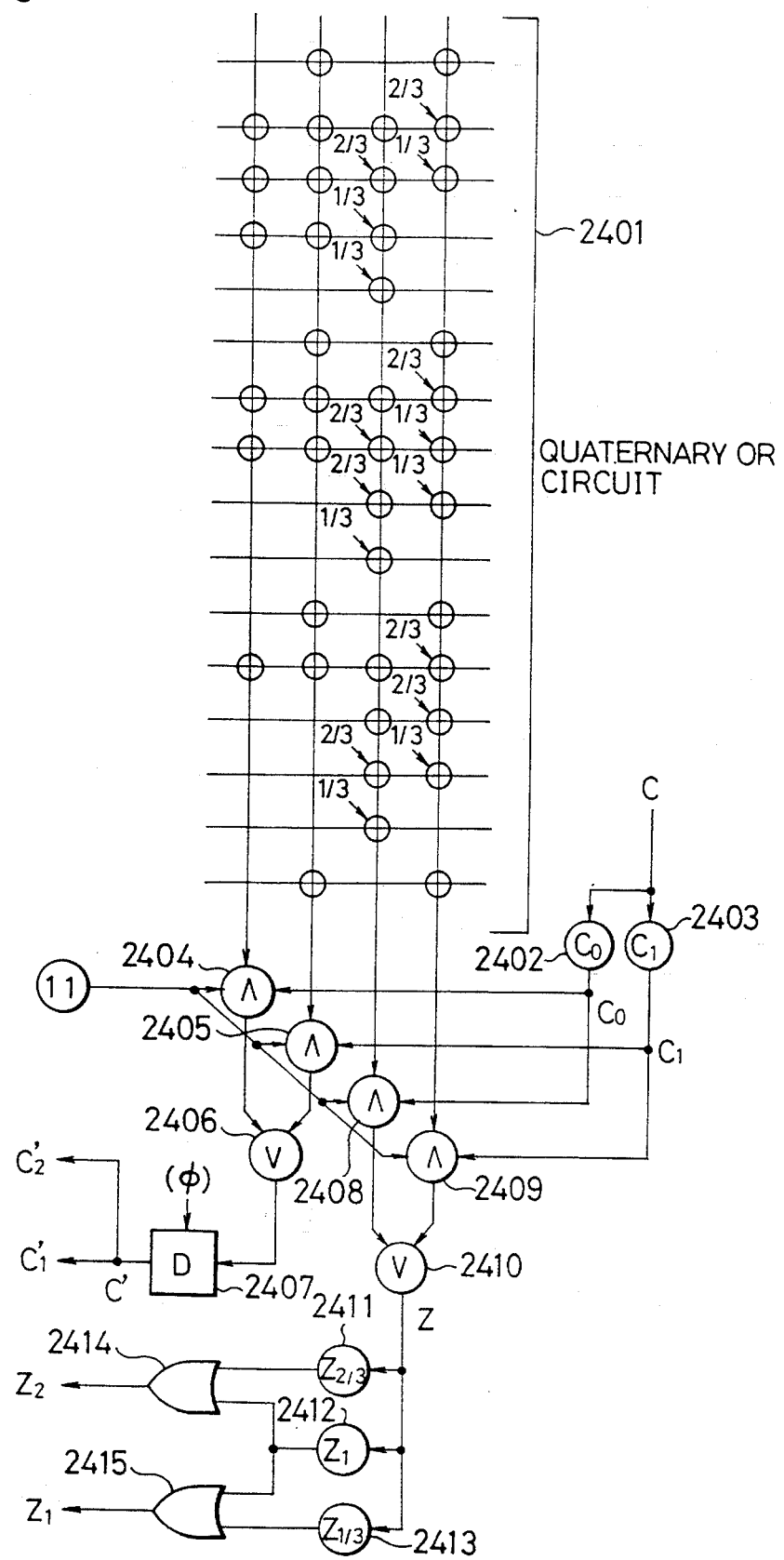
FIG. 22 is a block diagram showing an arrangement of a quaternary subtracting circuit included in the circuit [6] of FIG. 1.

FIG. 22 shows an arrangement of a quaternary subtracting circuit corresponding to the circuit unit [6] shown in FIG. 1. The quaternary subtracting circuit shown in FIG. 22 is arranged to have a quaternary OR circuit 2401, I/O elements 2402 and 2403 connected to a carry input C, AND circuit elements 2404, 2405, 2408 and 2409, OR circuit elements 2406 and 2410, a delay circuit element 2407, I/O elements 2411, 2412 and 2413, and OR circuit elements 2414 and 2415.

The detailed arrangements and operations of the multi-valued subtracting circuits as shown in FIGS. 20 to 22 are not described herein, because they are described in the Japanese Patent Application No. Hei 4-308455 filed by the same inventors as the present invention.

FIG. 23 shows arrangements of a binary multiplying circuit and a squaring circuit corresponding to the circuit units [7] and [10] shown in FIG. 1. The binary multiplying circuit as shown in FIG. 23 is arranged to have a binary OR circuit 2501, I/O elements 2502, 2503 and 2504 connected to a carry input C, AND circuit elements 2505, 2506, 2507, 2510, 2511, 2512, 2515, 2516, 2517, 2519, 2520, and 2521, OR circuit elements 2508, 2513, 2518 and 2522, and delaying circuit elements 2509 and 2514. The squaring circuit is composed of elements on the lines 1, 6, 11 and 16 included in the OR circuit 2501.

FIG. 24 shows arrangements of a ternary multiplying circuit and a squaring circuit corresponding to the circuit units [8] and [11] shown in FIG. 1. The ternary multiplying circuit shown in FIG. 24 is arranged to have a ternary OR circuit 2601, I/O elements 2602 to 2604 connected to a carry input C, AND circuit elements 2605 to 2607, 2612 to 2614, 2618, 2619 and 2620, a delaying circuit element 2609, I/O elements 2610 and 2611, I/O elements 2616 and 2617, and OR circuit elements 2621 to 2623. The squaring circuit is composed of elements on the lines 1, 6, 11 and 16 contained in the OR circuit 2601.

FIG. 25 shows arrangements of a quaternary multiplying circuit and a squaring circuit corresponding to the circuit units [9] and [12] shown in FIG. 1. The quaternary multiplying circuit shown in FIG. 25 is arranged to have a quaternary OR circuit 2701, I/O elements 2702 to 2704 connected to a carry input C, AND circuit elements 2705 to 2707 and 2712 to 2714, a delay circuit element 2709, I/O elements 2710 and 2711, and OR circuit elements 2708, 2715, 2719 and 2720. The squaring circuit is composed of elements on the lines 1, 6, 11 and 16 contained in the OR circuit 2601.

The detailed arrangements and operations of the multi-valued multiplying circuit and the squaring circuit as shown in FIGS. 23 to 25 are not described herein, because they are described in the Japanese Patent Application No. Hei 4290134 filed by the same inventor as the present invention.

In the adding circuit, the subtracting circuit, the multiplying circuit and the squaring circuit shown in FIGS. 17 to 25, micro orders 9, 10 and 11 are applied thereto. The micro order 9 is for selecting the binary OR circuit. The micro order 10 is for selecting a ternary OR circuit. The micro order 11 is for selecting a quaternary OR circuit.

Figure 26:
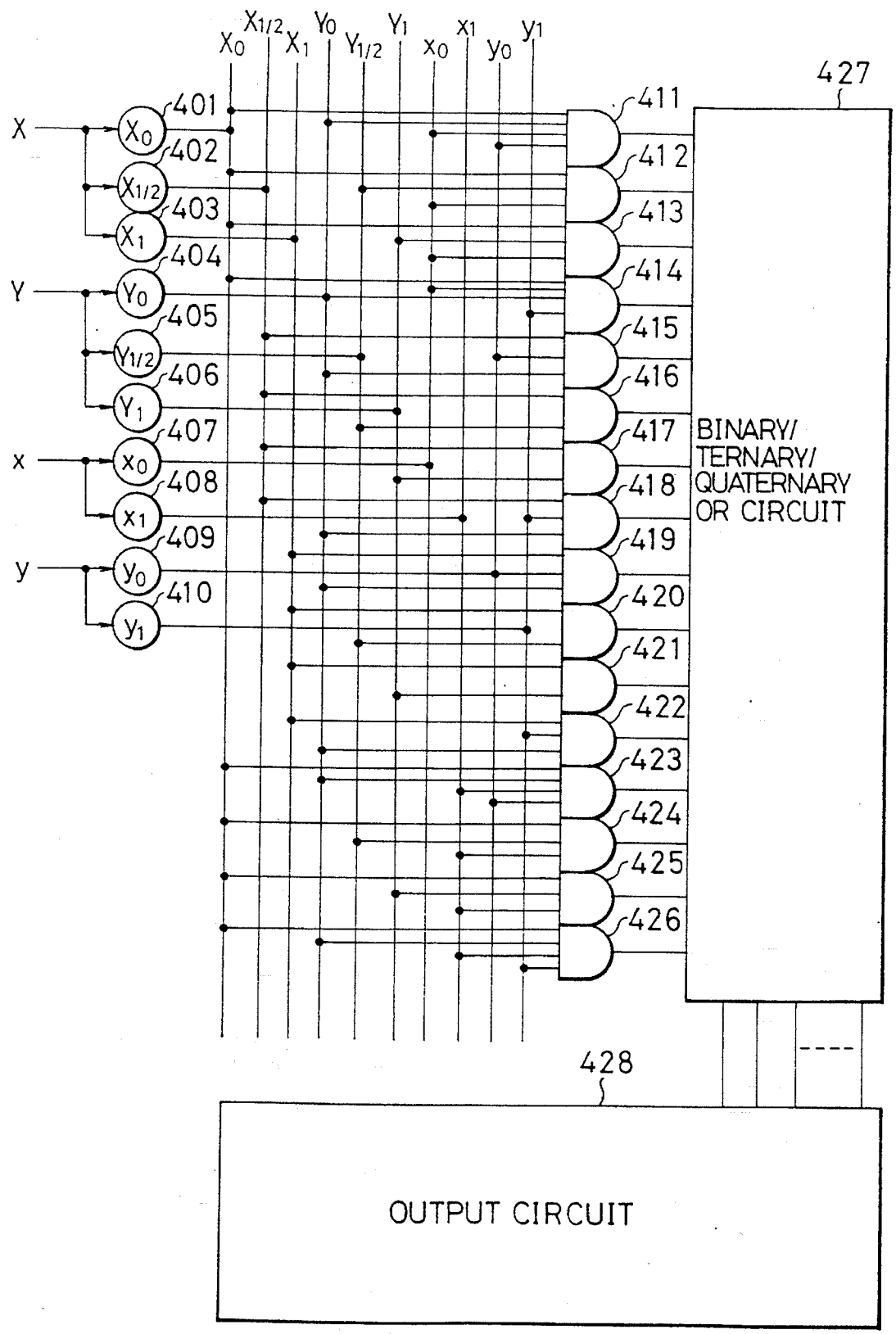
FIG. 26 is a block diagram showing an arrangement of a ternary/binary input circuit which is an example of an input circuit part of FIG. 2.
Figure 27:
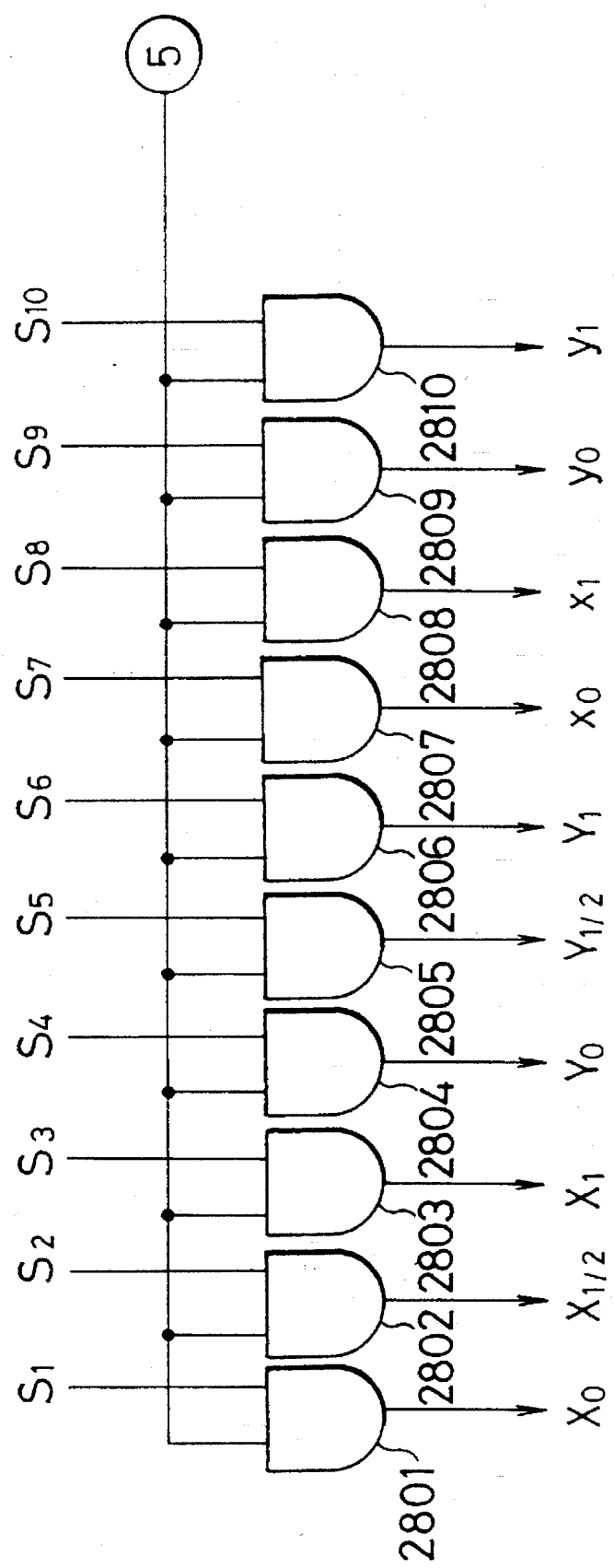
FIG. 27 is a block diagram showing an arrangement of an input unit from a binary signal output in the multi-functional operating circuit according to the present invention.
Figure 28:
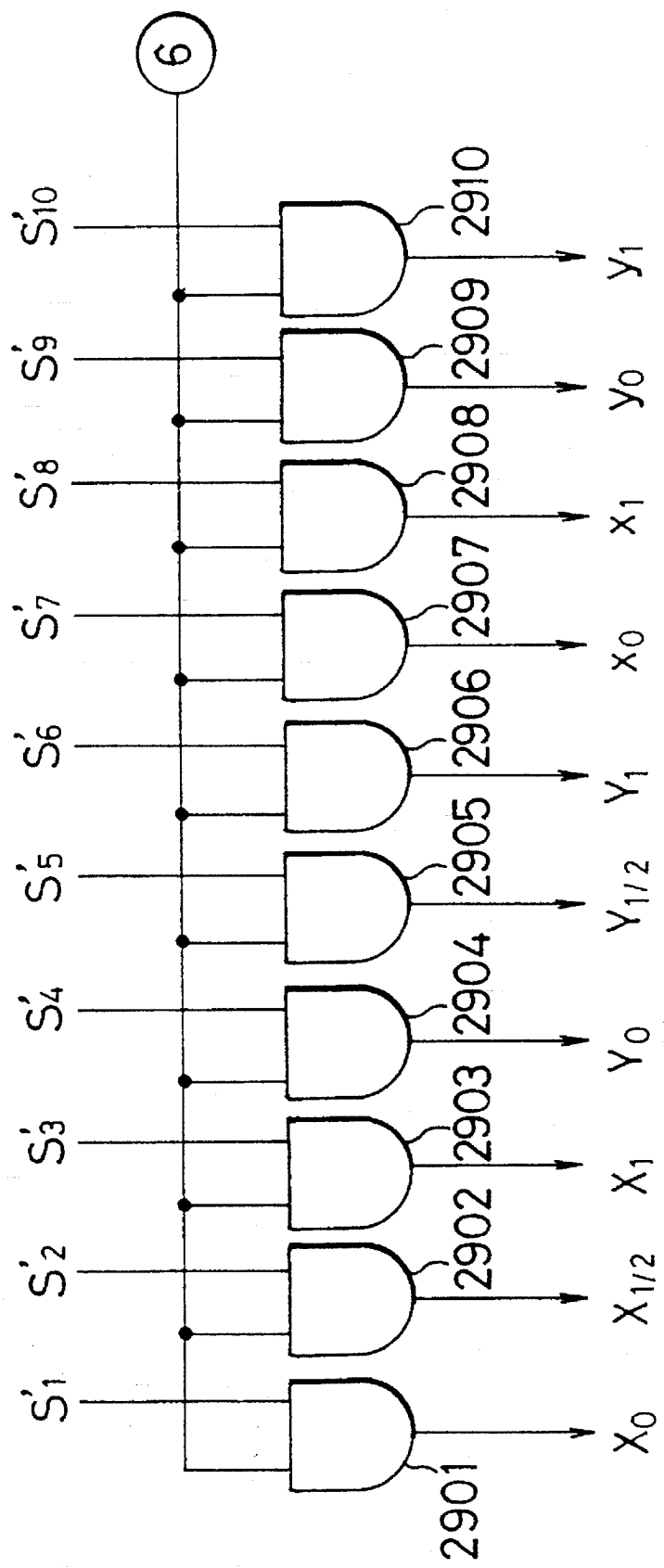
FIG. 28 is a block diagram showing an arrangement of an input unit from an equivalent circuit (ternary) in the multi-functional operating circuit according to the present invention.

FIGS. 27 and 28 show circuit arrangements used as an input circuit shown in FIG. 26, which is a part of the multi-functional operating unit shown in FIG. 2.

FIG. 27 shows a circuit arrangement for outputting signals $X_0$, $X_{1/2}$, $X_1$, $Y_0$, $Y_{1/2}$, $Y_1$, $x_0$, $x_1$, $y_0$ and $Y_1$ shown in the upper part (described as lines) of FIG. 26. This circuit is composed of AND circuit elements 2801 to 2810. These AND circuit elements 2801 to 2810 operate to receive binary signals $S_1$, $S_2$, $S_3$, $S_4$, $S_5$, $S_6$, $S_7$, $S_8$, $S_9$ and $S_{10}$ and a micro order 5 for selecting a binary signal through the effect of a ternary/binary input unit and output binary signals $X_0$, $X_{1/2}$, $X_1$, $Y_0$, $Y_{1/2}$, $Y_1$, $x_0$, $x_1$, $y_0$ and $y_1$.

FIG. 28 shows a circuit arrangement for outputting signals $X_0$, $X_{1/2}$, $X_1$, $Y_0$, $Y_{1/2}$, $Y_1$, $x_0$, $x_1$, $y_0$ and $y_1$ from the equivalent circuit shown in the left part of FIG. 26 (described as columns). This circuit is composed of AND circuit elements 2901 to 2910, which operate to receive binary signals $S_1'$, $S_2'$, $S_3'$, $S_4'$, $S_5'$, $S_6'$, $S_7'$, $S_8'$, $S_9'$ and $S_{10}'$ and a micro order 6 for selecting a ternary signal through the effect of a ternary value/binary value input unit and output ternary signals $X_0$, $X_{1/2}$, $X_1$, $Y_0$, $Y_{1/2}$, $x_0$, $x_1$, $y_0$ and $y_1$.

Figure 29:
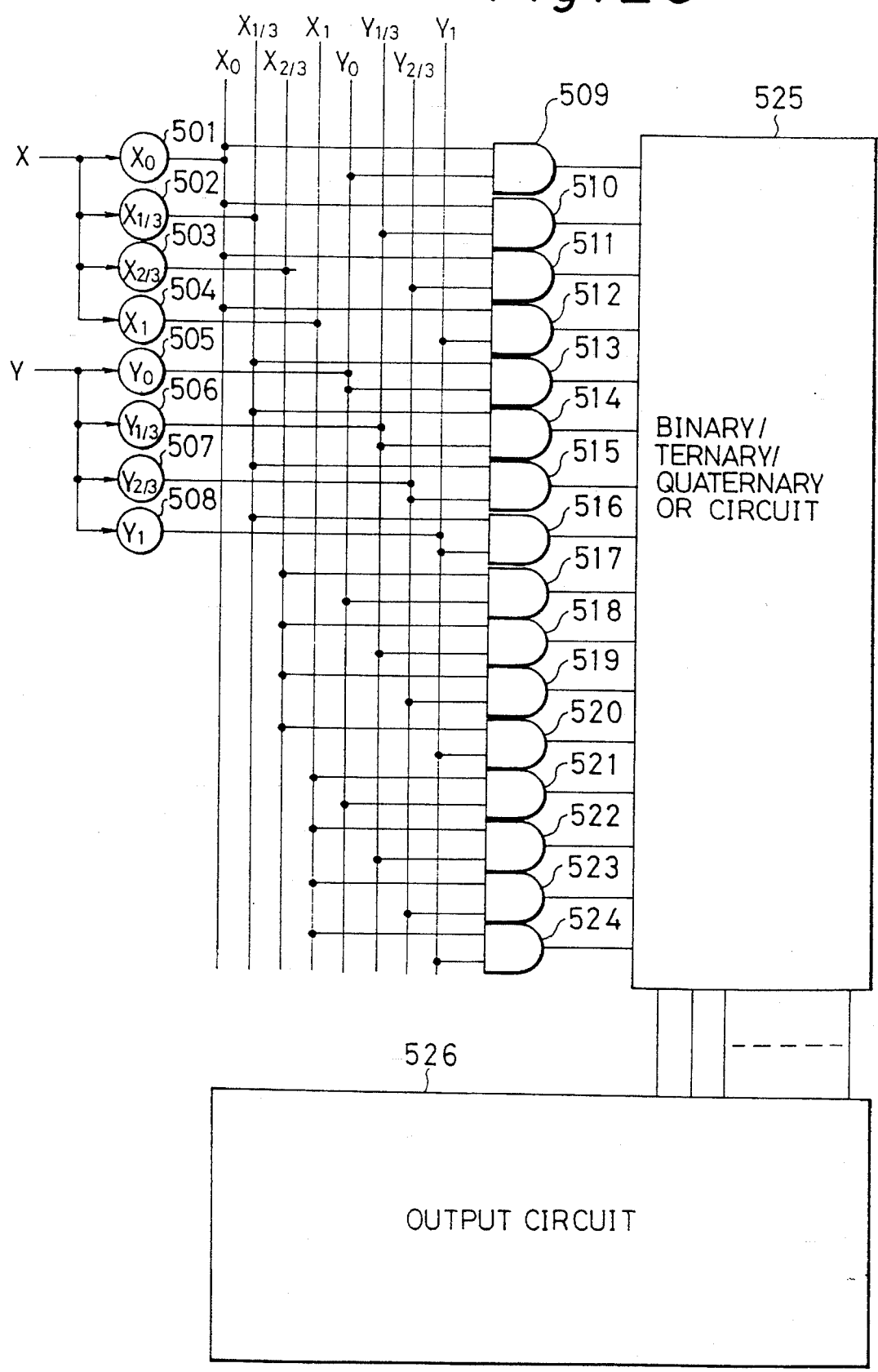
FIG. 29 is a block diagram showing an arrangement of a quaternary/binary input circuit which is an example of an input circuit part shown in FIG. 2.
Figure 30:
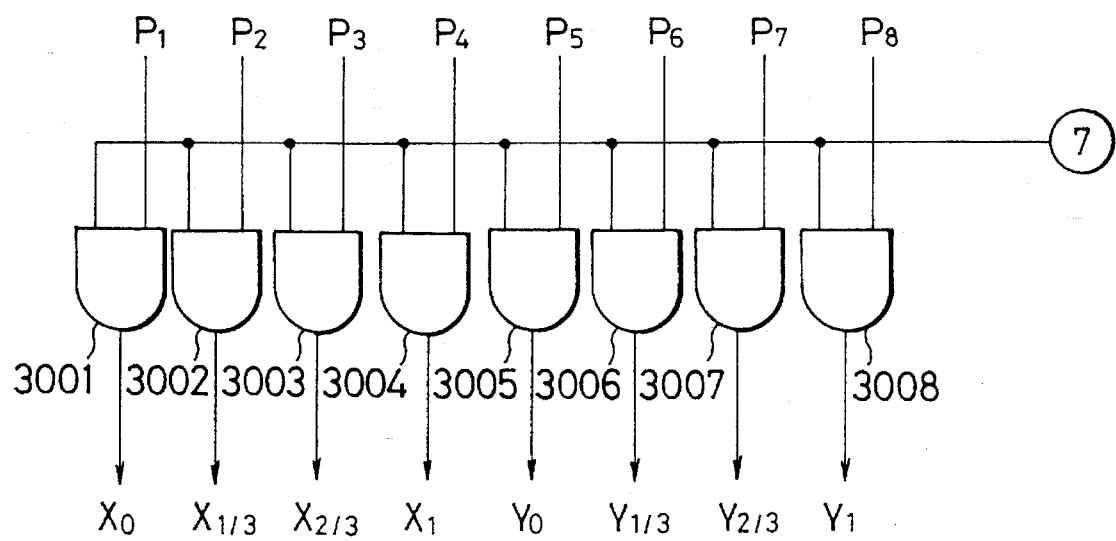
FIG. 30 is a block diagram showing an arrangement of an input unit from a binary signal output in the multi-functional operating circuit according to the present invention.
Figure 31:
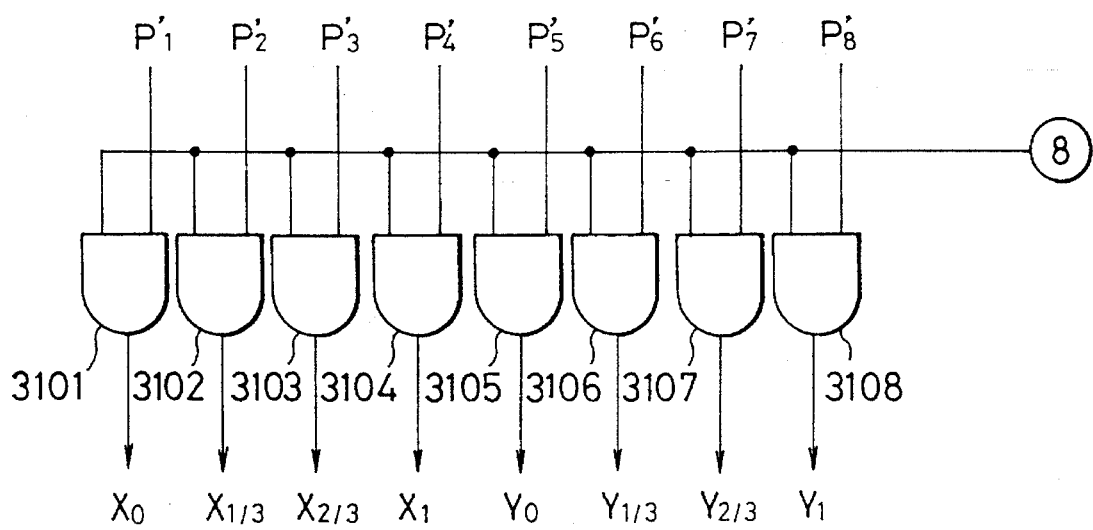
FIG. 31 is a block diagram showing an arrangement of an input unit from an equivalent circuit (quaternary) in the multi-functional operating circuit according to the present invention.

FIGS. 30 and 31 show circuit arrangements used as an input circuit unit of FIG. 29 of the multivalued operating circuit, which is a part of the multi-functional operating circuit shown in FIG. 2.

FIG. 30 shows a circuit arrangement for outputting signals $X_0$, $X_{1/3}$, $X_{2/3}$, $X_1$, $Y_0$, $Y_{1/3}$, $Y_{2/3}$ and $Y_1$ shown in the upper part of FIG. 29 (described as a line). The circuit is composed of AND circuit elements 3001 to 3008, which operate to receive binary signals $P_1$, $P_2$, $P_3$, $P_4$, $P_5$, $P_6$, $P_7$ and $P_8$ and a micro order 7 for selecting a binary signal through the effect of a quaternary/binary input unit and output binary signals $X_0$, $X_{1/3}$, $X_{2/3}$, $X_1$, $Y_0$, $Y_{1/3}$, $Y_{2/3}$ and $Y_1$.

FIG. 31 shows a circuit arrangement for outputting signals $X_0$, $X_{1/3}$, $X_{2/3}$, $X_1$, $Y_0$, $Y_{1/3}$, $Y_{2/3}$ and $Y_1$ from an equivalent circuit, shown in the left part of FIG. 29 (described as columns). This circuit is composed of AND circuit elements 3101 to 3108, which operate to receive binary signals $P_1'$, $P_2'$, $P_3'$, $P_4'$, $P_5'$, $P_6'$, $P_7'$ and $P_8'$ and a micro order 8 for selecting a quaternary signal through the effect of a quaternary/binary input circuit unit and output quaternary signals $X_0$, $X_{1/3}$, $X_{2/3}$, $X_1$, $Y_0$, $Y_{1/3}$, $Y_{2/3}$ and $Y_1$.

Figure 32A:
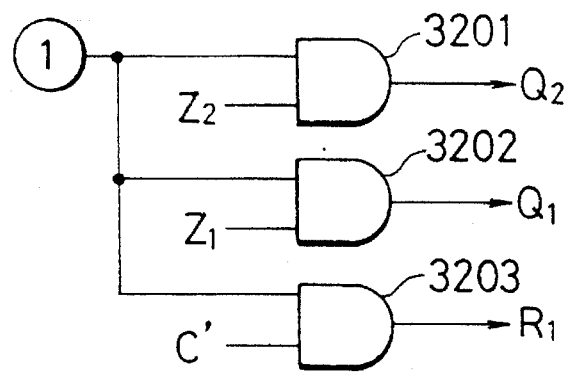
FIGS. 32a to 32c are block diagrams showing a binary, a ternary and a quaternary arrangements of an addition output unit in the multi-functional operating circuit according to the present invention.
Figure 32B:
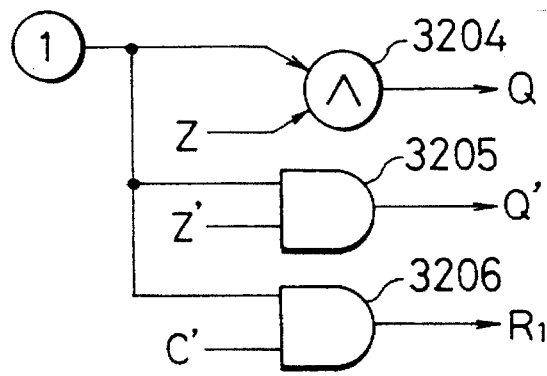
Figure 32C:
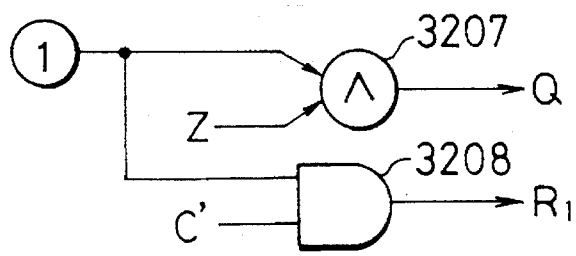

FIGS. 32a, 32b, 32c show arrangements of an adding and outputting circuit. FIG. 32a shows an adding and outputting circuit for outputting a binary signal, which is composed of AND circuit elements 3201 to 3203. The inputs of the AND circuit elements 3201 to 3203 correspond to the outputs of the binary adding circuit shown in FIG. 17. FIG. 32b shows an adding and outputting circuit for outputting a ternary signal, which is composed of AND circuit elements 3204 to 3206. The inputs of the AND circuit elements 3204 to 3206 correspond to the outputs of the ternary adding circuit shown in FIG. 18, respectively. FIG. 32c shows an adding and outputting circuit for outputting a quaternary signal, which is composed of AND circuit elements 3207 to 3208. The inputs of the AND circuit elements 3207 to 3208 correspond to the outputs of the quaternary adding circuit shown in FIG. 19.

In FIG. 32, $Q_2$, $Q_1$, Q and Q' denote the added results. $R_1$ denotes a carry output. A micro order 1 denotes a micro order for addition.

Figure 33A:
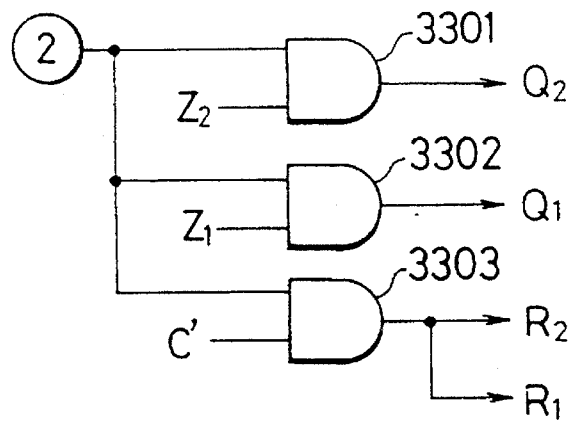
FIGS. 33a to 33c are block diagrams showing a binary, a ternary and a quaternary arrangements of a subtracting output unit in the multi-functional operating circuit according to the present invention
Figure 33B:
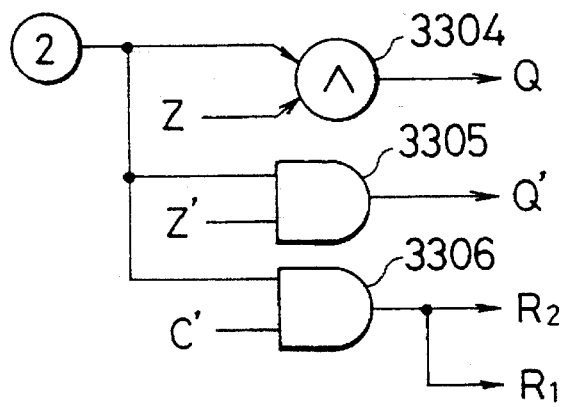
Figure 33C:
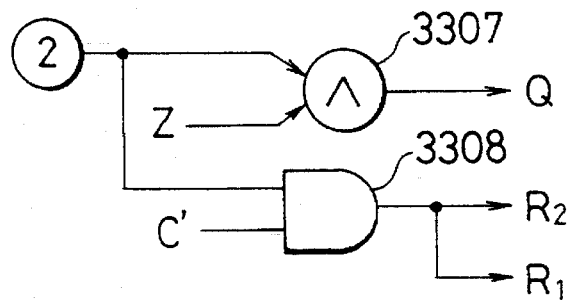

FIGS. 33a, 33b, 33c show arrangements of a subtracting and outputting circuit. FIG. 33a shows a subtracting and outputting circuit for outputting a binary signal, which is composed of AND circuit elements 3301 to 3303. The inputs of the AND circuit elements 3301 to 3303 correspond to the outputs of the binary subtracting circuit shown in FIG. 20, respectively. FIG. 33b shows a subtracting and outputting circuit for outputting a ternary signal, which is composed of AND circuit elements 3304 to 3306. The inputs of the AND circuit elements 3304 to 3306 correspond to the outputs of the ternary subtracting circuit shown in FIG. 21. FIG. 33c shows a subtracting and outputting circuit for outputting a quaternary signal, which is composed of AND circuit elements 3307 to 3308. The inputs of the AND circuit elements 3307 to 3308 correspond to the outputs of the quaternary subtracting circuit shown in FIG. 22, respectively.

In FIG. 33, $Q_2$, $Q_1$, Q and Q' denote the subtracted results. $R_2$ and $R_1$ denote borrow outputs. A micro order 2 denotes a micro order for subtraction.

Figure 34A:
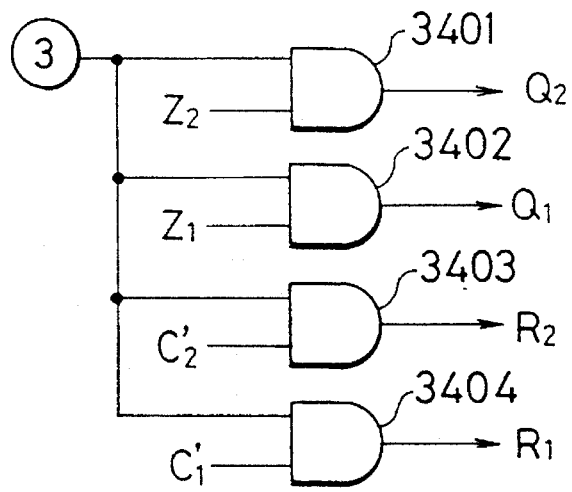
FIGS. 34a to 34c are block diagrams showing a binary, a ternary and a quaternary arrangements of a multiplication output unit in the multi-functional operating circuit according to the present invention.
Figure 34B:
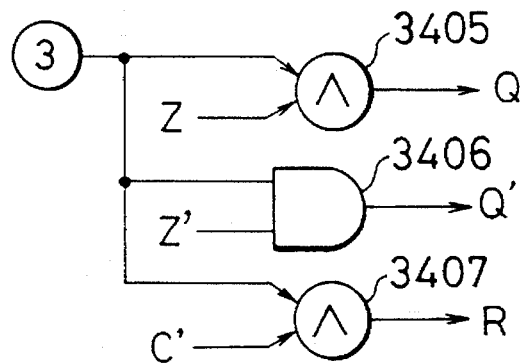
Figure 34C:
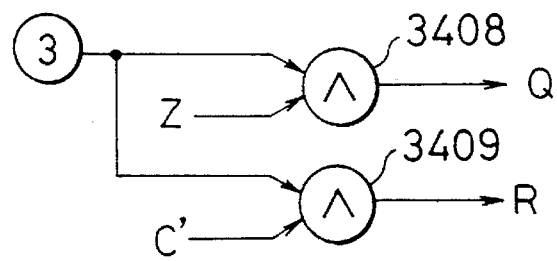

FIGS. 34a, 34b, 34c show arrangements of a multiplying and outputting circuit. FIG. 34a shows a multiplying and outputting circuit for outputting a binary signal, which is composed of AND circuit elements 3401 to 3404. The inputs of the AND circuit elements 3401 to 3404 correspond to the outputs of the binary multiplying circuit shown in FIG. 23, respectively. FIG. 34b shows a multiplying and outputting circuit for outputting a ternary signal, which is composed of AND circuit elements 3405 to 3407. The inputs of the AND circuit elements 3405 to 3407 correspond to the outputs of the ternary multiplying circuit shown in FIG. 24, respectively. FIG. 34c shows a multiplying and outputting circuit for outputting a quaternary signal, which is composed of AND circuit elements 3408 to 3409. The inputs of the AND circuit elements 3408 to 3409 correspond to the outputs of the quaternary multiplying circuit shown in FIG. 25, respectively.

In FIG. 34, $Q_2$, $Q_1$, Q and Q' denote the multiplied results. $R_2$, $R_1$ and R denote carry outputs. A micro order 3 denotes a micro order for multiplication.

Figure 35A:
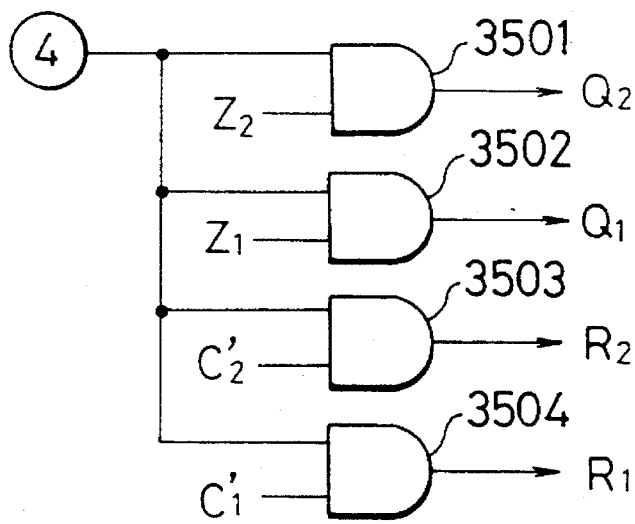
FIGS. 35a to 35c are block diagrams showing a binary, a ternary and a quaternary arrangements of a squaring output unit in the multi-functional operating circuit according to the present invention.
Figure 35B:
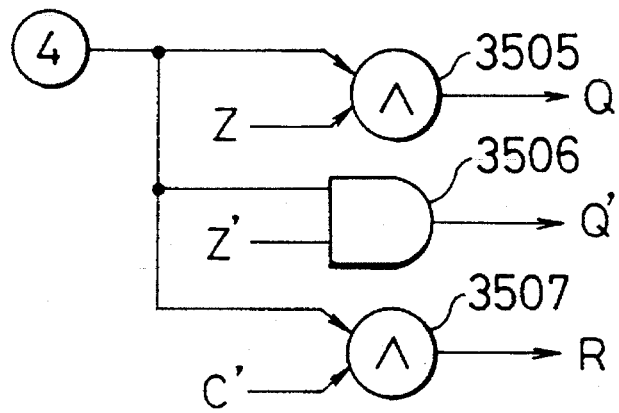
Figure 35C:
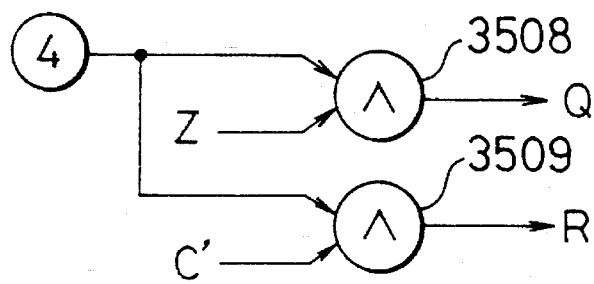

FIGS. 35a, 35b, 35c show arrangements of a squaring and outputting circuit. FIG. 35a shows a squaring and outputting circuit for outputting a binary signal, which is composed of AND circuit elements 3501 to 3504. The inputs of the AND circuit elements 3501 to 3504 correspond to the output of the binary squaring circuit shown in FIG. 23, respectively. FIG. 35b shows a squaring and outputting circuit for outputting a ternary signal, which is composed of AND circuit elements 3505 to 3507. The inputs of the AND circuit elements 3505 to 3507 correspond to the outputs of the ternary squaring circuit shown in FIG. 24, respectively. FIG. 35c shows a squaring and outputting circuit for outputting a quaternary signal, which is composed of AND circuit elements 3508 to 3509. The inputs of the AND circuit elements 3508 to 3509 correspond to the outputs of the quaternary squaring circuit shown in FIG. 25, respectively.

In FIG. 35, $Q_2$, $Q_1$, Q and Q' denote the squared results. $R_2$, $R_1$ and R denote carry outputs. A micro order 4 denotes a micro order for squaring.

Next, the multi-functional operating circuit according to the present invention enables to realize various logical operations and logical expressions such as pattern matching in addition to the foregoing numerical operations. Hereafter, the representative logical operation is discussed below.

Assuming that the quaternary logical variants X and Y are displayed as a matrix, the following expressions (1) and (2) can be obtained.

$$X = \begin{bmatrix} 0 & 1/3 & 2/3 & 1 \\ 0 & 1/3 & 2/3 & 1 \\ 0 & 1/3 & 2/3 & 1 \\ 0 & 1/3 & 2/3 & 1 \end{bmatrix} \quad (1)$$

$$Y = \begin{bmatrix} 0 & 0 & 0 & 0 \\ 1/3 & 1/3 & 1/3 & 1/3 \\ 2/3 & 2/3 & 2/3 & 2/3 \\ 1 & 1 & 1 & 1 \end{bmatrix} \quad (2)$$

The row indicates $X_0$, $X_{1/3}$, $X_{2/3}$ and $X_1$ from the left to the right. The column indicates $Y_0$, $Y_{1/3}$, $Y_{2/3}$ and $Y_1$ from the top to the bottom. 0, 1/3, 2/3 and 1 denote factors for displaying a matrix.

The expression (3) is an AND logic matrix indicated below.

$$AND;\ XY = \begin{bmatrix} 0 & 0 & 0 & 0 \\ 0 & 1/3 & 1/3 & 1/3 \\ 0 & 1/3 & 2/3 & 2/3 \\ 0 & 1/3 & 2/3 & 1 \end{bmatrix} \quad (3)$$

The expression (4) is an OR logic matrix indicated below.

$$OR;\ X+Y = \begin{bmatrix} 0 & 1/3 & 2/3 & 1 \\ 1/3 & 1/3 & 2/3 & 1 \\ 2/3 & 2/3 & 2/3 & 1 \\ 1 & 1 & 1 & 1 \end{bmatrix} \quad (4)$$

The expression (5) is a NND logic matrix indicated below.

$$NAND;\ \overline{XY} = \begin{bmatrix} 1 & 1 & 1 & 1 \\ 1 & 2/3 & 2/3 & 2/3 \\ 1 & 2/3 & 1/3 & 1/3 \\ 1 & 2/3 & 1/3 & 0 \end{bmatrix} \quad (5)$$

The expression (6) is a NOR logic matrix indicated below.

$$NOR; \overline{X+Y} = \begin{bmatrix} 1 & 2/3 & 1/3 & 0 \\ 2/3 & 2/3 & 1/3 & 0 \\ 1/3 & 1/3 & 1/3 & 0 \\ 0 & 0 & 0 & 0 \end{bmatrix} \quad (6)$$

The expression (7) is an exclusive OR logic matrix of X and Y indicated below.

$$X \oplus Y = \begin{bmatrix} 0 & 1/3 & 2/3 & 1 \\ 1/3 & 1/3 & 2/3 & 2/3 \\ 2/3 & 2/3 & 1/3 & 1/3 \\ 1 & 2/3 & 1/3 & 0 \end{bmatrix} \quad (7)$$

The expression (8) is a (X≡Y) logic matrix indicated below.

$$(X \equiv Y) = \begin{bmatrix} 1 & 0 & 0 & 0 \\ 0 & 1 & 0 & 0 \\ 0 & 0 & 1 & 0 \\ 0 & 0 & 0 & 1 \end{bmatrix} \quad (8)$$

The expression (9) is a (X>Y) logic matrix indicated below.

$$(X > Y) = \begin{bmatrix} 0 & 1 & 1 & 1 \\ 0 & 0 & 1 & 1 \\ 0 & 0 & 0 & 1 \\ 0 & 0 & 0 & 0 \end{bmatrix} \quad (9)$$

The expression (10) is a (X<Y) logic matrix indicated below.

$$(X < Y) = \begin{bmatrix} 0 & 0 & 0 & 0 \\ 1 & 0 & 0 & 0 \\ 1 & 1 & 0 & 0 \\ 1 & 1 & 1 & 0 \end{bmatrix} \quad (10)$$

These matrixes makes the functions as their logical expressions. For a binary output, (0, 1/3, 2/3, 1) corresponds to (00, 01, 10, 11). For a ternary output, (0, 1/3, 2/3, 1) corresponds to (00, ½ 0, 10, 01). For a quaternary output, (0, 1/3, 2/3, 1) corresponds to (0, 1/3, 2/3, 1) of its own.

Figure 36:
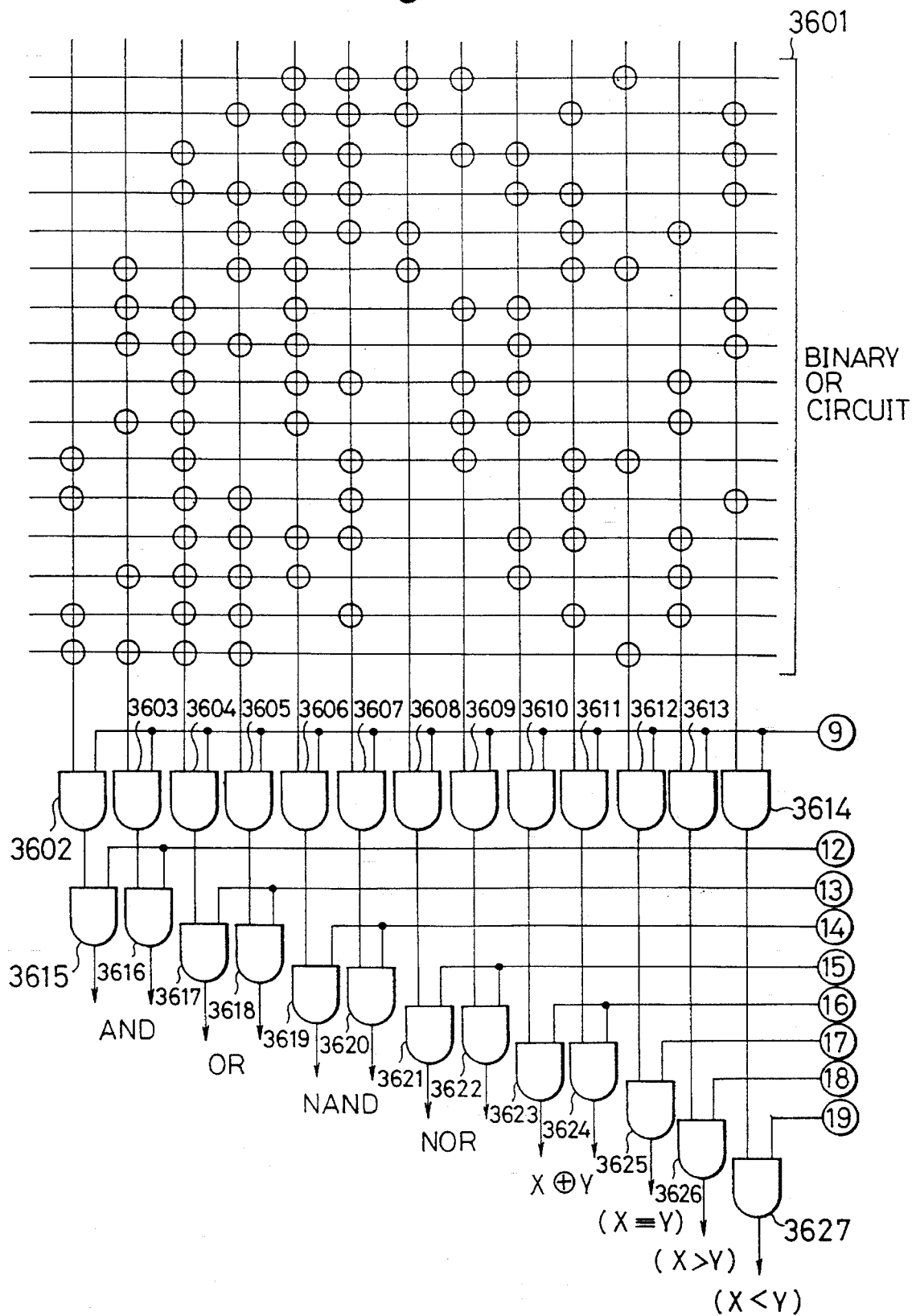
FIG. 36 is a block diagram showing an arrangement of a binary output logic operating circuit in the multi-functional operating circuit according to the present invention.

FIG. 36 shows a circuit arrangement for outputting a binary signal, which operate to execute the logical operations as shown in the expressions (3) to (10).

The circuit of FIG. 36 is arranged to have a binary OR circuit 3601, AND circuit elements 3602 to 3614 connected to the binary OR circuit 3601 and a micro order 9, an AND circuit element 3615 connected to the AND circuit element 3602 and a micro order 12, an AND circuit element 3616 connected to the AND circuit element 3603 and a micro order 12, an AND circuit element 3617 connected to the AND circuit element 3604 and a micro order 13, an AND circuit element 3618 connected to the AND circuit element 3605 and the micro order 13, an AND circuit element 3619 connected to the AND circuit element 3606 and a micro order 14, an AND circuit element 3620 connected to the AND circuit element 3607 and the micro order 14, an AND circuit element 3621 connected to the AND circuit element 3608 and a micro order 15, an AND circuit element 3622 connected to the AND circuit element 3609 and the micro order 15, an AND circuit element 3623 connected to the AND circuit element 3610 and a micro order 16, an AND circuit element 3624 connected to the AND circuit element 3611 and the micro order 16, an AND circuit element 3625 connected to the AND circuit element 3612 and a micro order 17, an AND circuit element 3626 connected to the AND circuit element 3613 and a micro order 18, and an AND circuit element 3627 connected to the AND circuit element 3614 and a micro order 19.

Herein, the micro order 9 is one for selecting a binary OR circuit. The micro order 12 is one for selecting an AND. The micro order 13 is one for selecting an OR. The micro order 14 is one for selecting a NAND. The micro order 15 is one for selecting a NOR. The micro order 16 is one for selecting an exclusive OR of X and Y. The micro order 17 is one for selecting (X≡Y). The micro order 18 is one for selecting (X>Y). The micro order 19 is one for selecting (X<Y).

Figure 37:
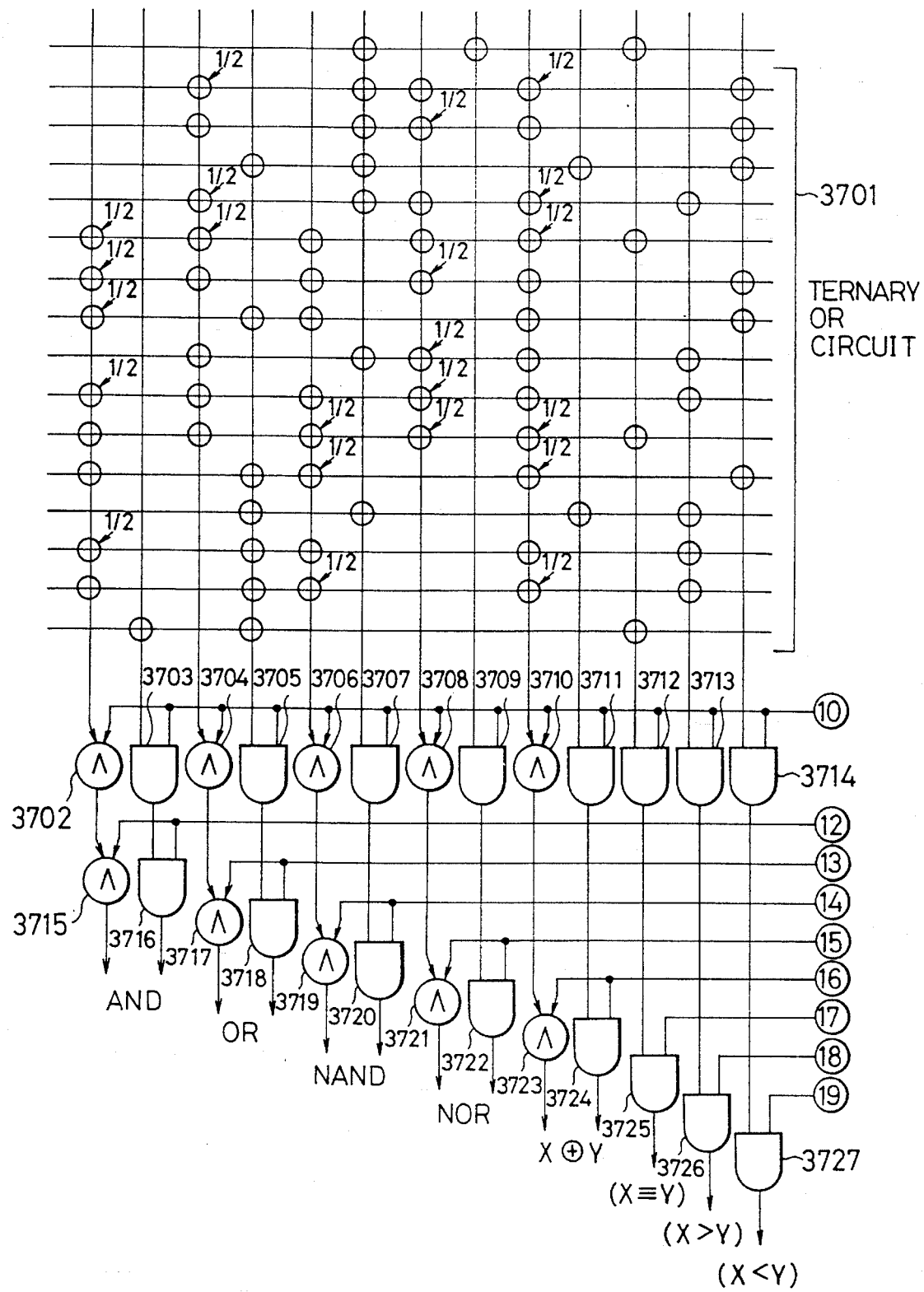
FIG. 37 is a block diagram showing an arrangement of a ternary output logic operating circuit in the multi-functional operating circuit according to the present invention.

FIG. 37 shows a circuit arrangement for outputting a ternary signal, which is capable of executing the logical operations of the expressions (3) to (10).

The circuit shown in FIG. 37 is arranged to have a ternary OR circuit 3701; AND circuit elements 3702 to 3714 connected to the ternary OR circuit 3701 and the micro order 10; an AND circuit element 8715 connected to the AND circuit element 3702 and the micro order 12; an AND circuit element 3716 connected to the AND circuit element 3703 and the micro order 12; an AND circuit element 3717 connected to the AND circuit element 3704 and a micro order 13; an AND circuit element 3718 connected to the AND circuit element 3705 and the micro order 13; an AND circuit element 3719 connected to the AND circuit element 3706 and a micro order 14; an AND circuit element 3720 connected to the AND circuit element 3707 and the micro order 14; an AND circuit element 3721 connected to the AND circuit element 3708 and a micro order 15; an AND circuit element 3722 connected to the AND circuit element 3709 and the micro order 15; an AND circuit element 3723 connected to the AND circuit element 3710 and a micro order 16; an AND circuit element 3724 connected to the AND circuit element 3711 and a micro order 16; an AND circuit element 3725 connected to the AND circuit element 3712 and a micro order 17; an AND circuit element 3726 connected to the AND circuit element 3713 and a micro order 18; and an AND circuit element 3727 connected to the AND circuit element 3714 and a micro order The micro order 10 is one for selecting a ternary OR circuit. The micro order 12 is one for selecting an AND. The micro order 13 is one for selecting an OR. The micro order 14 is one for selecting a NAND. The micro order 15 is one for selecting a NOR. The micro order 16 is one for selecting an exclusive OR of X and Y. The micro order 17 is one for selecting (X≡Y). The micro order 18 is one for selecting (X>Y). The micro order 19 is one for selecting (X<Y).

Figure 38:
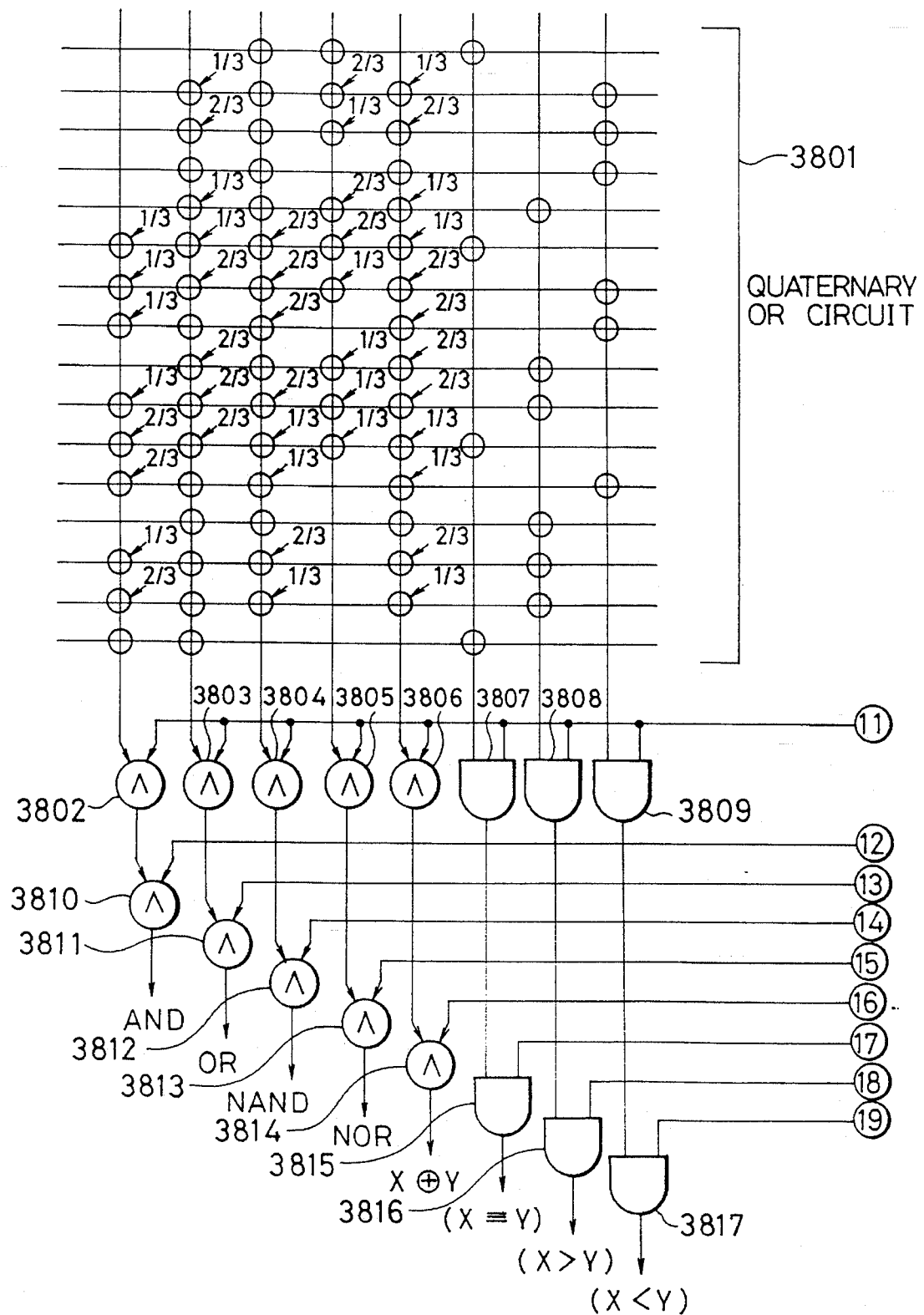
FIG. 38 is a block diagram showing an arrangement of a quaternary output logic operating circuit in the multi-functional operating circuit according to the present invention.

FIG. 38 shows a circuit arrangement for outputting quaternary signal, which is capable of performing logical operations expressed in the expressions (3) to (10).

The circuit shown in FIG. 38 is arranged to have a quaternary OR circuit 3801; AND circuit elements 3802 to 3809 connected to the quaternary OR circuit 3801 and a micro order 11; an AND circuit element 3810 connected to the AND circuit element 3802 and a micro order 12; an AND circuit element 3811 connected to the AND circuit element 3803 and a micro order 13; an AND circuit element 3812 connected to the AND circuit element 3804 and a micro order 14; an AND circuit element 3813 connected to the AND circuit element 3805 and a micro order 15; an AND circuit element 3814 connected to the AND circuit element 3806 and a micro order 16; an AND circuit element 3815 connected to the AND circuit element 3807 and a micro order 17; an AND circuit element 3816 connected to the AND circuit element 3808 and a micro order 18; and an AND circuit element 3817 connected to the AND circuit element 3809 and a micro order 19.

Herein, the micro order 11 is one for selecting a quaternary OR circuit. The micro order 12 is one for selecting an AND. The micro order 13 is one for selecting an OR. The micro order 14 is one for selecting a NAND. The micro order 15 is one for selecting a NOR. The micro order 16 is one for selecting an exclusive OR of X and Y. The micro order 17 is one for selecting (X≡Y). The micro order 18 is one for selecting (X>Y). The micro order 19 is one for selecting (X<Y).

FIG. 39 shows an allocation table of instruction codes, in which the instruction codes for variously combinable operating circuits as shown in FIG. 1 are extended to the logical operations and the other additional operations. The circuit shown in FIG. 1 is an operating system in which 48 (4×4×3) combinations of operations are made possible in response to an instruction consisting of 6 bits. On the other hand, the circuit shown in FIG. 39 is an operating system in which 192 (16×4×3) combinations of operations are made possible in response to an external instruction consisting of eight bits of $I_1, I_2, I_3, I_4, I_5, I_6, I_7$ and $I_8$.

Furthermore, the multi-functional operating circuit may be extended to the multi-functional operating circuit.

Figure 3A:
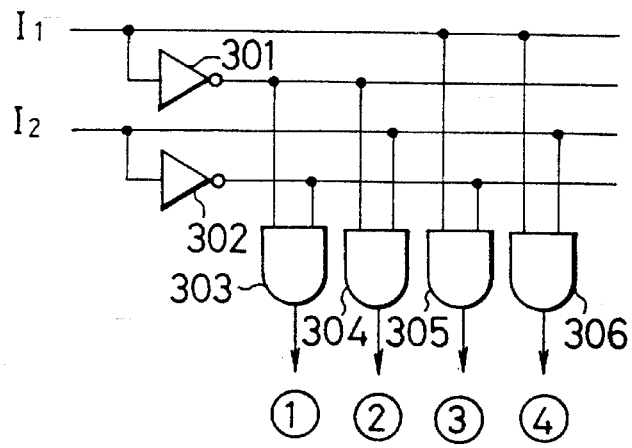
FIGS. 3a to 3c are block diagrams showing an arrangement of an instruction decoder included in the circuit shown in FIG. 2.
Figure 3B:
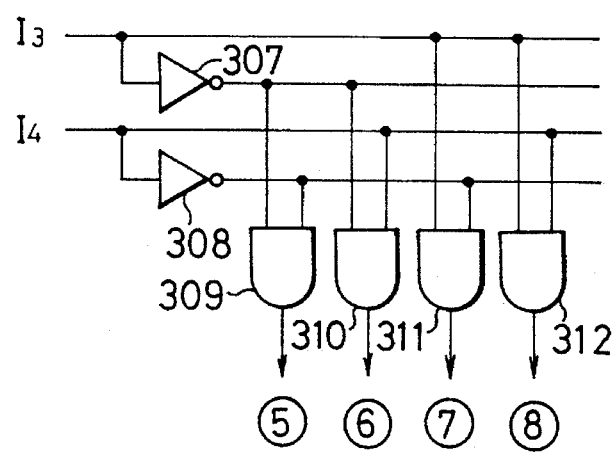
Figure 3C:
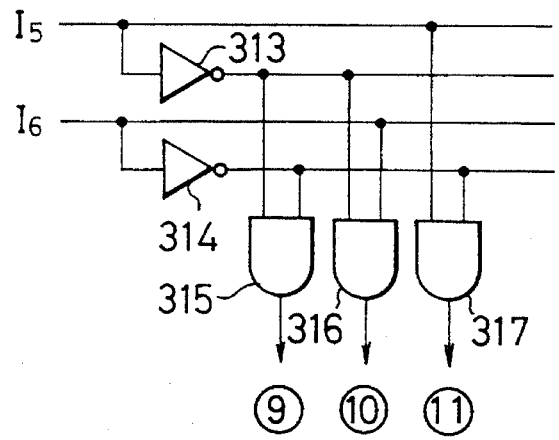
Figure 40A:
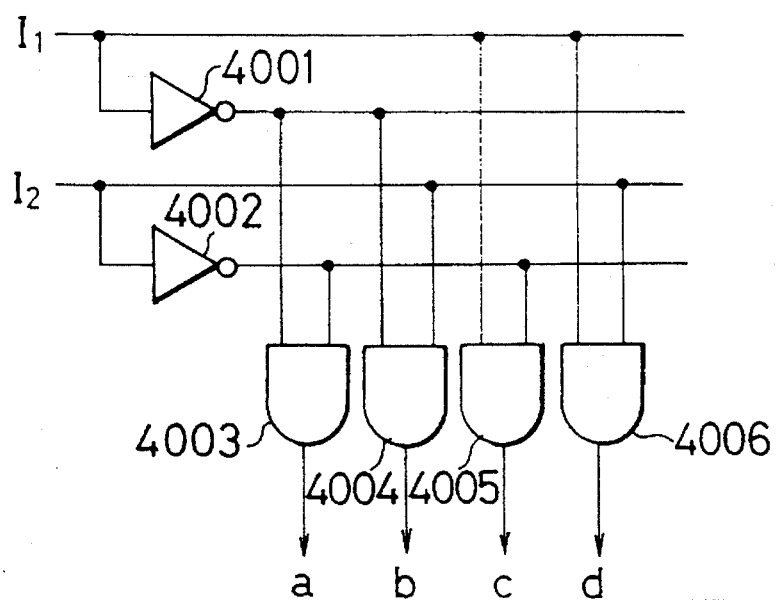
FIG. 40a is a block diagram showing one part of an arrangement of an instruction decoder corresponding to the instruction code allocation table of FIG. 39.
Figure 40B:
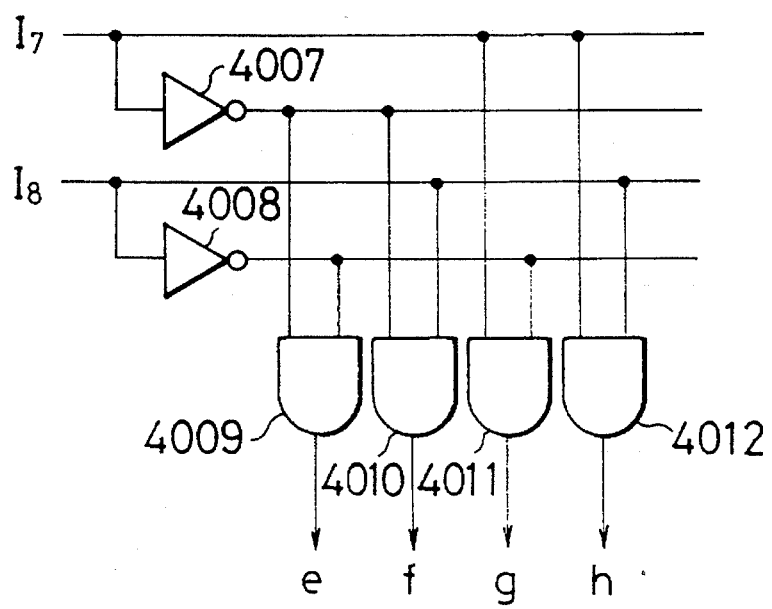
FIG. 40b is a block diagram showing another part of an arrangement of an instruction decoder corresponding to the instruction code allocation table of FIG. 39.
Figure 40C:
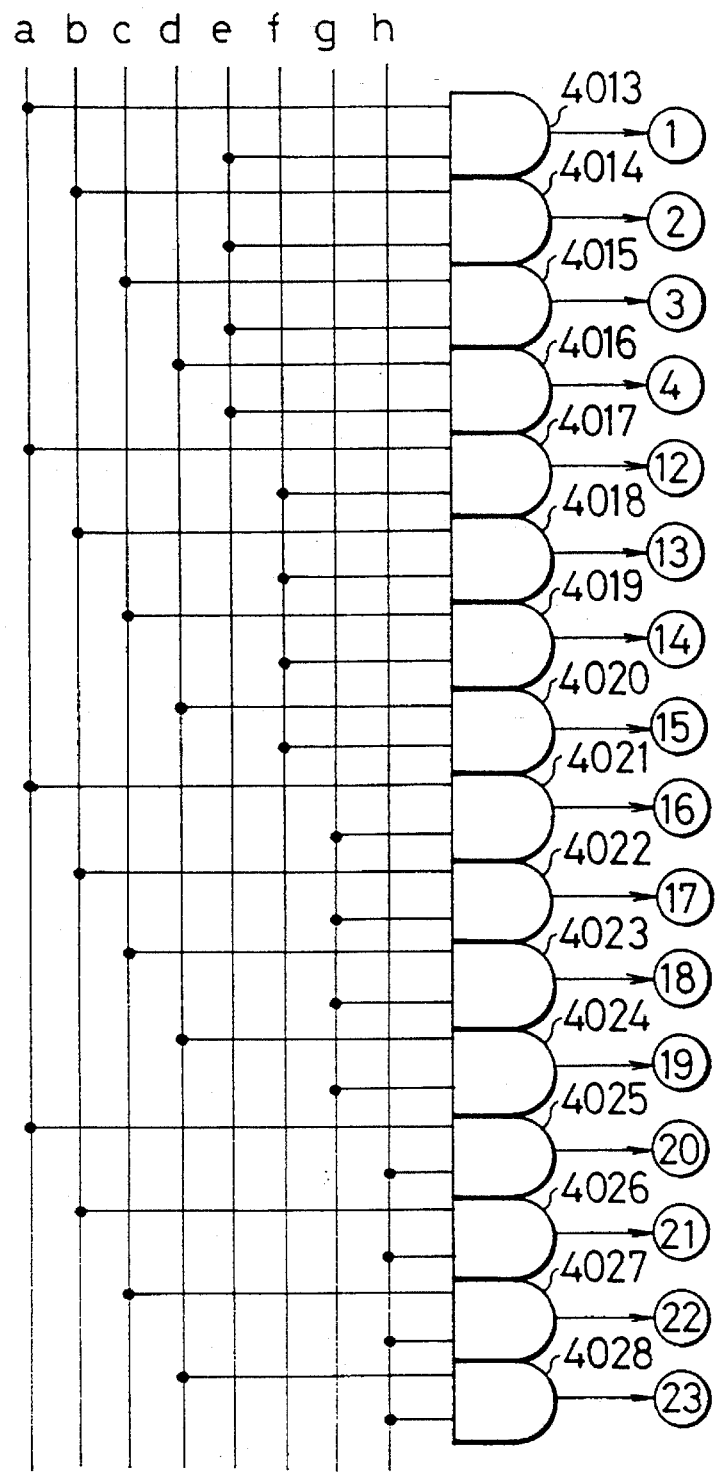
FIG. 40c is a block diagram showing another part of an arrangement of an instruction decoder corresponding to the instruction code allocation table of FIG. 39.

The circuits as shown in FIGS. 40a, 40b and 40c show circuit arrangements of an instruction decoder extended from the instruction decoder shown in FIG. 3. In the instruction decoders shown in FIGS. 40a, 40b and 40c, an instruction decoder for the micro orders 5, 6, 7 and 8 and the instruction decoder for the micro orders 9, 10 and 11 are common to the instruction decoder shown in FIG. 3. Hence, the description about these instruction decoders is not illustrative.

The micro orders 1, 2, 3, 4, 12, 13, 14, . . . , 23 are created by the circuit arrangements shown in FIGS. 40a, 40b and 40c in response to the external instructions $I_1, I_2, I_7$ and $I_8$.

The circuit shown in FIG. 40a is composed of NOT circuit elements 4001 and 4002 and AND circuit elements 4003 to 4006. The circuit shown in FIG. 40b is composed of NOT circuit elements 4007, 4008 and AD circuit element 4009 to 4012. The circuit shown in FIG. 40c is composed of AND circuit elements 4013 to 4028 for outputting micro orders 1 to 4 and 12 to 23.

Figure 41:
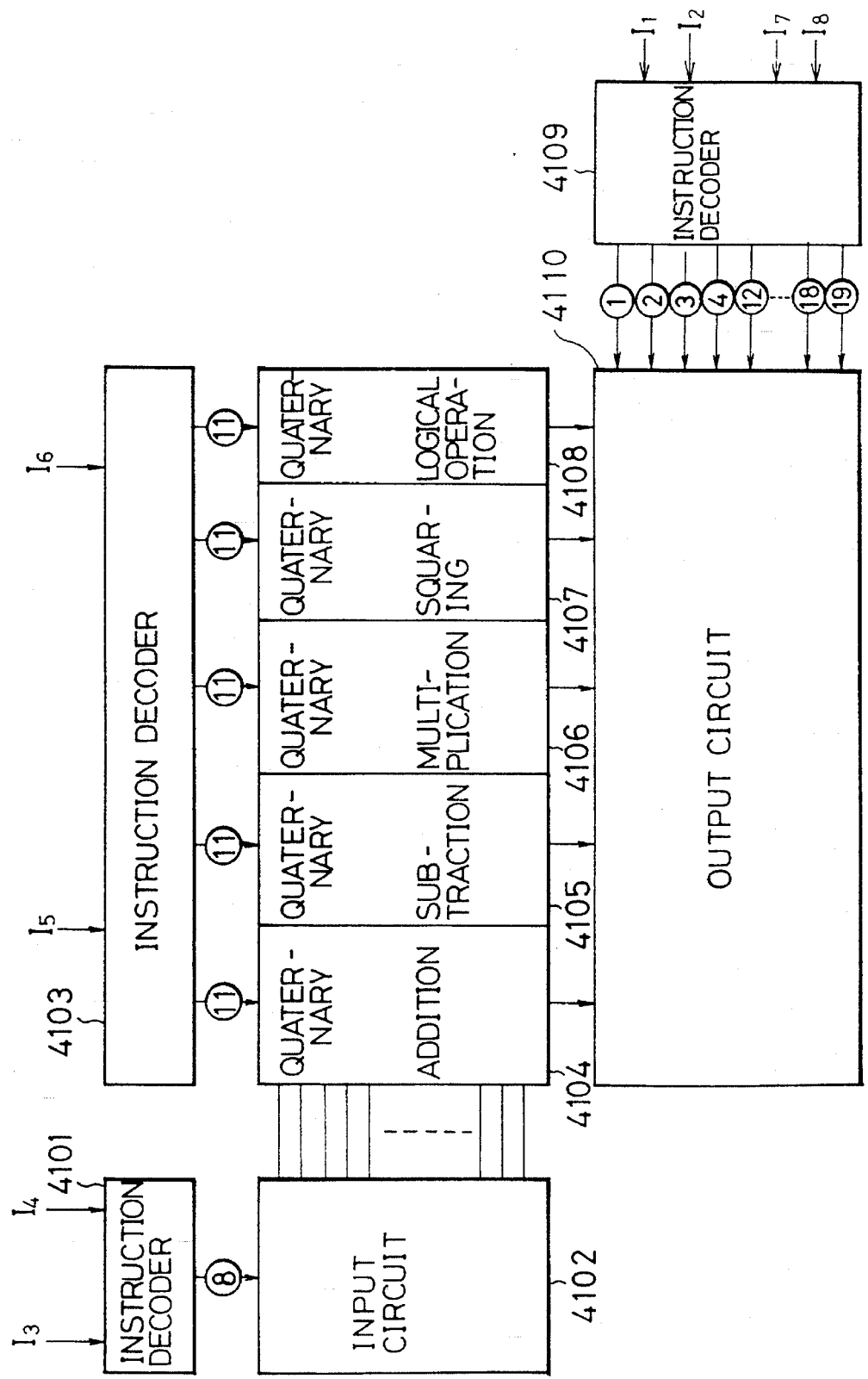
FIG. 41 is a block diagram showing one combination having added logic operations in the multi-functional operating circuit according to the present invention.

FIG. 41 shows one executable combination of various operations such as an addition, a subtraction, a multiplication, a squaring and a logical operation.

The micro order 8 is one for selecting a quaternary input circuit. Hence, it can treat a quaternary input signal. Further, the micro order 11 is for selecting a quaternary OR circuit. Hence, the circuits shown in FIGS. 19, 22, 25 and 38 are selected for an addition, a subtraction, a multiplication, a squaring, and a logical operation.

The output circuit shown in FIG. 41 is dynamically or statically selected in response to the micro orders 1, 2, 3, 4, 12 to 19 and operates to execute various operating functions. This is one example. In actual, the logical operations are allowed to be added to the representative combinations as shown in FIG. 4 to FIG. 16.

Figure 42:
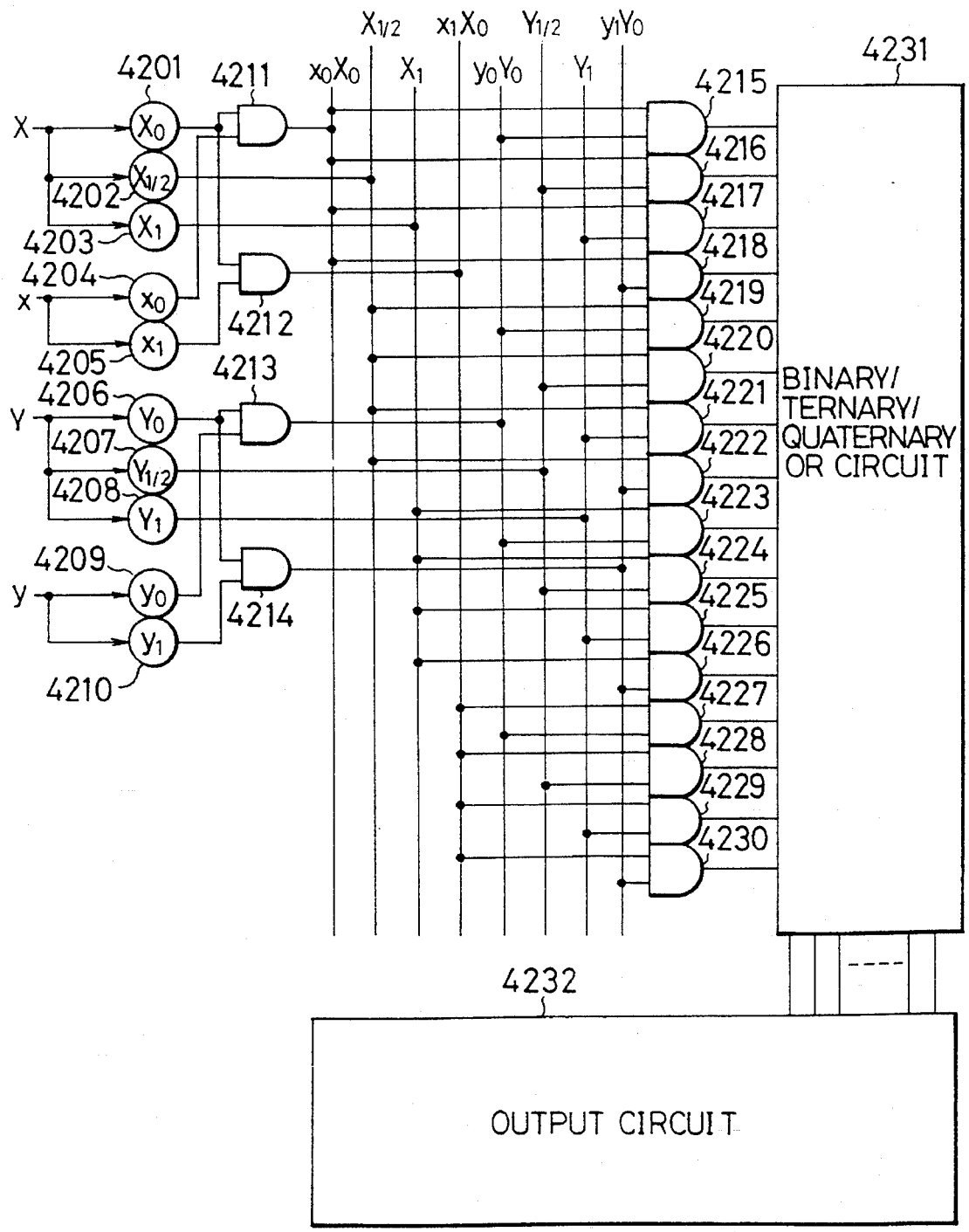
FIG. 42 is a block diagram showing another arrangement of a ternary/binary input circuit included in the multi-functional operating circuit according to the present invention.

FIG. 42 shows an arrangement of a ternary/binary input circuit to be replaced with a ternary/binary input circuit shown in FIG. 28. The part where the circuit of FIG. 28 is located may be replaced with the circuit of FIG. 42. In the case of using the circuit of FIG. 42, the circuit of FIG. 28 may be used as it is. If the circuit of FIG. 42 is used as an input unit from a binary signal output as shown in FIG. 27, it is necessary to change it to the circuit arrangement shown in FIG. 43.

Figure 43:
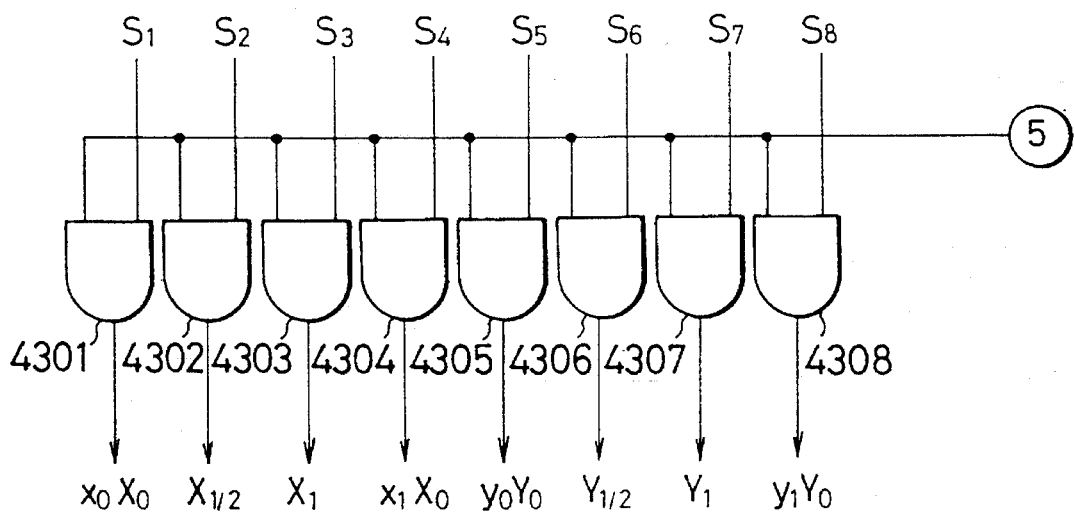
FIG. 43 is a block diagram showing another arrangement of an input unit from a binary signal output in the multi-functional operating circuit according to the present invention.

The circuit shown in FIG. 43 shows a circuit arrangement for outputting signals $x_0X_0, X_{1/2}, X_1, x_1X_0, y_0Y_0, Y_{1/2}, Y_1$, and $y_1Y_0$, represented in the upper part of FIG. 42 (described as a row). This circuit is composed of AND circuit elements 4301 to 4308. The AND circuit elements 4301 to 4308 are arranged to receive binary signals $S_1, S_2, S_3, S_4, S_5, S_6, S_7$ and $S_8$ and the micro order 5 for selecting a binary signal and output binary signals $x_0X_0, X_{1/2}, X_1, x_1X_0, y_0Y_0, Y_{1/2}, Y_1$, and $y_1Y_0$.

The foregoing architecture may be widely used as an effective way even if it configures a multivalued operating module.

Figure 44:
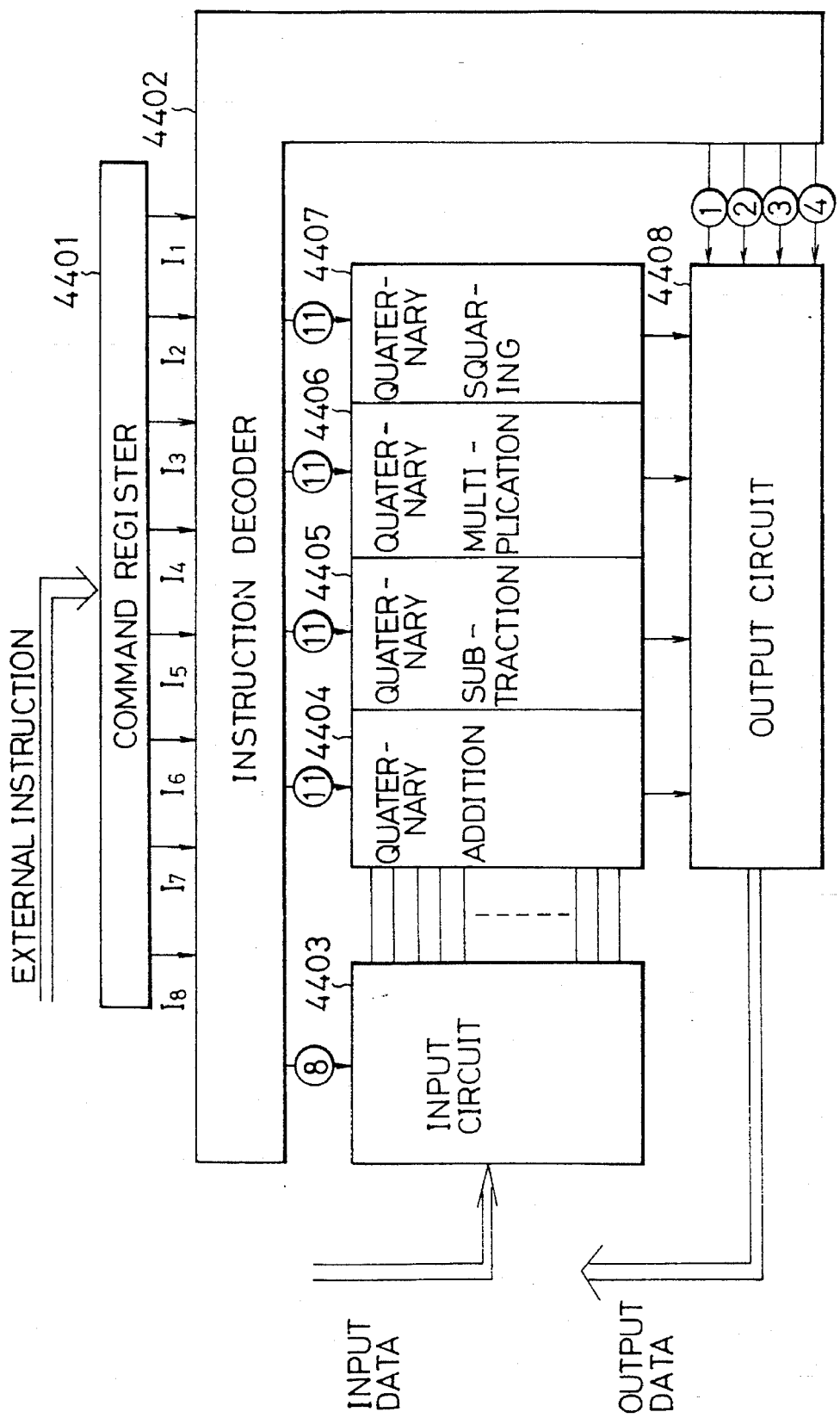
FIG. 44 is a block diagram showing an example of an operating module having a command register included in the multi-functional operating circuit according to the present invention.

FIG. 44 shows one combination of FIG. 6 in which the operating circuits are made complex.

The multi-functional operating circuit shown in FIG. 44 is arranged to have a command register 4401 for receiving an external instruction and outputting external instructions $I_1$ to $I_8$; an instruction decoder 4402 connected to the command register 4401 and for receiving the external instructions $I_1$ to $I_8$ outputted from the command register 4401 and outputting micro orders 1 to 4, 8 and 11; an input circuit 4403 being connected to the instruction decoder 4402 and for receiving a micro order 8 outputted from the instruction decoder 4402 and the external input data and outputting a quaternary signal; operating circuits 4404 to 4407 being connected to the instruction decoder 4402 and the input circuit 4403 and for executing an addition, a subtraction, a multiplication and a squaring operation of quaternary values based on the micro order 11 outputted from the instruction decoder 4402 and a quaternary signal outputted from the input circuit 4403; and an output circuit 4408 being connected to the instruction decoder 4402 and the operating circuits 4404 to 4407 and for receiving a quaternary operated result given by the operating circuits 4404 to 4407 based on the micro orders 1 to 4 based on the instruction decoder 4402 and supplying it as the output data.

The multi-functional operating circuit shown in FIG. 44 is one example of an operating module in which the command register 4401 is installed as a register interface for decoding an external instruction consisting of eight bits and executing each operation. The instruction inputted from the external is temporarily stored in the command register 4401 and dynamically or statically selects and executes the necessary operations in response to each micro order outputted from the instruction decoder 4402.

Figure 45:
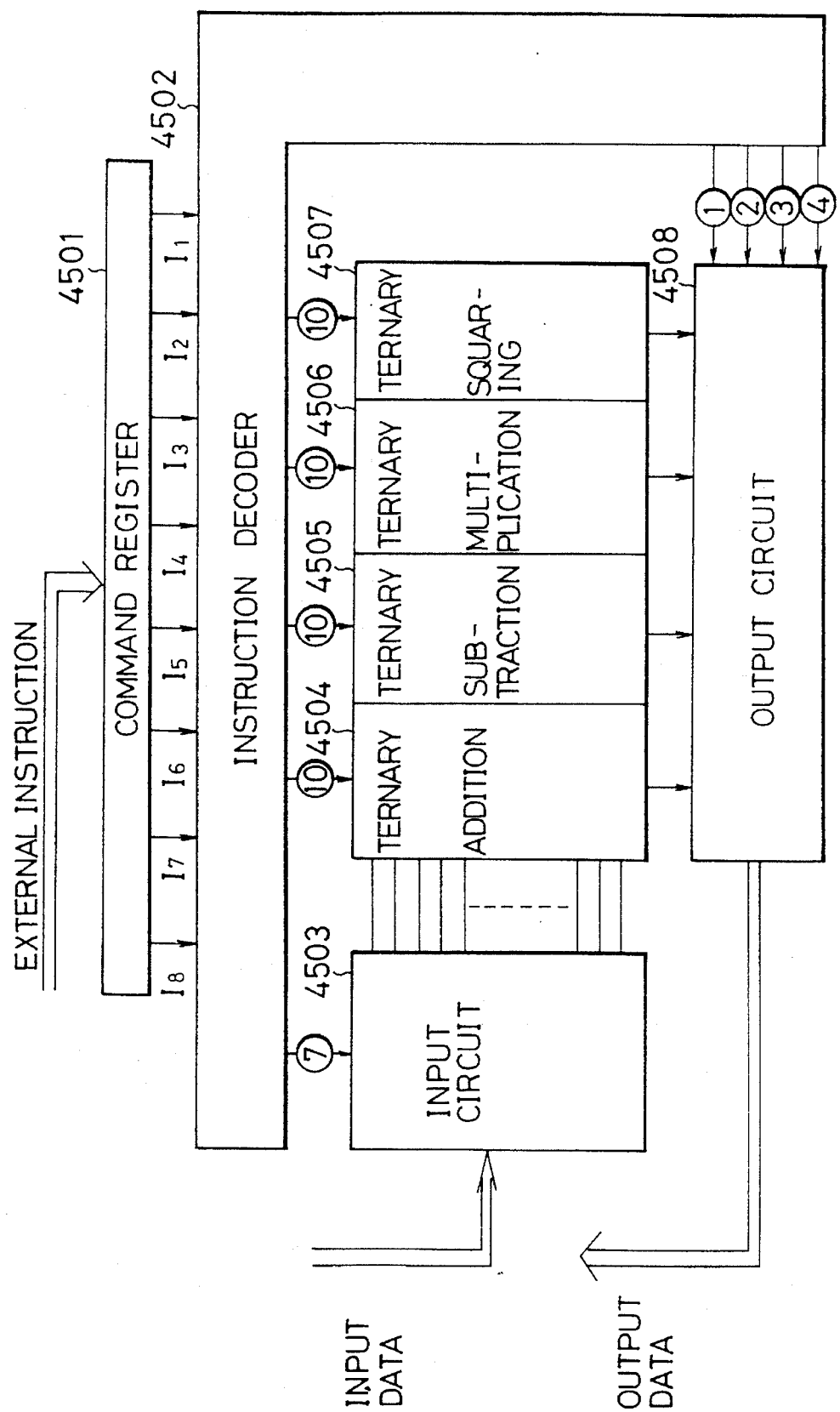
FIG. 45 is a block diagram showing an operating module having a command register included in the multi-functional operating circuit according to the present invention.

FIG. 45 shows one example of a combination in which various operating circuits are made complex, which corresponds to the circuit of FIG. 7.

The multi-functional operating circuit shown in FIG. 45 is arranged to have a command register 4501 for receiving an external instruction and outputting external instructions $I_1$ to $I_8$; an instruction decoder 4502 being connected to the command register 4501 and for receiving the external instructions $I_1$ to $I_8$ outputted from the command register 4501 and outputting micro orders 1 to 4, 7 and 10; an input circuit 4503 being connected to the instruction decoder 4502 and for receiving the micro order 7 outputted from the instruction decoder 4502 and the input data from the external and outputting a binary signal; operating circuits 4504 to 4507 being connected to the instruction decoder 4502 and the input circuit 4503 and for executing ternary operations of an addition, a subtraction, a multiplication and a squaring operation based on the micro order 10 outputted form the instruction decoder 4502 and a binary signal outputted from the input circuit 4503; and an output circuit 4508 being connected to the instruction decoder 4502 and the operating circuits 4504 to 4507 and for receiving a ternary operated result given by the operating circuits 4504 to 4507 based on the micro orders 1 to 4 outputted from the instruction decoder 4502 and supplying it as the output data.

The multi-functional operating circuit shown in FIG. 45 is an operating module in which the command register 4501 is installed as a register interface for decoding an external instruction consisting of 8 bits and executing various operations. The instruction inputted from the external is temporarily stored in the command register 4501 and dynamically or statically selects and executes various operations in response to the micro orders outputted through the instruction decoder 4502.

In addition, this register interface may similarly apply to another representative combination as shown in FIGS. 4 to 16.

Figure 46:
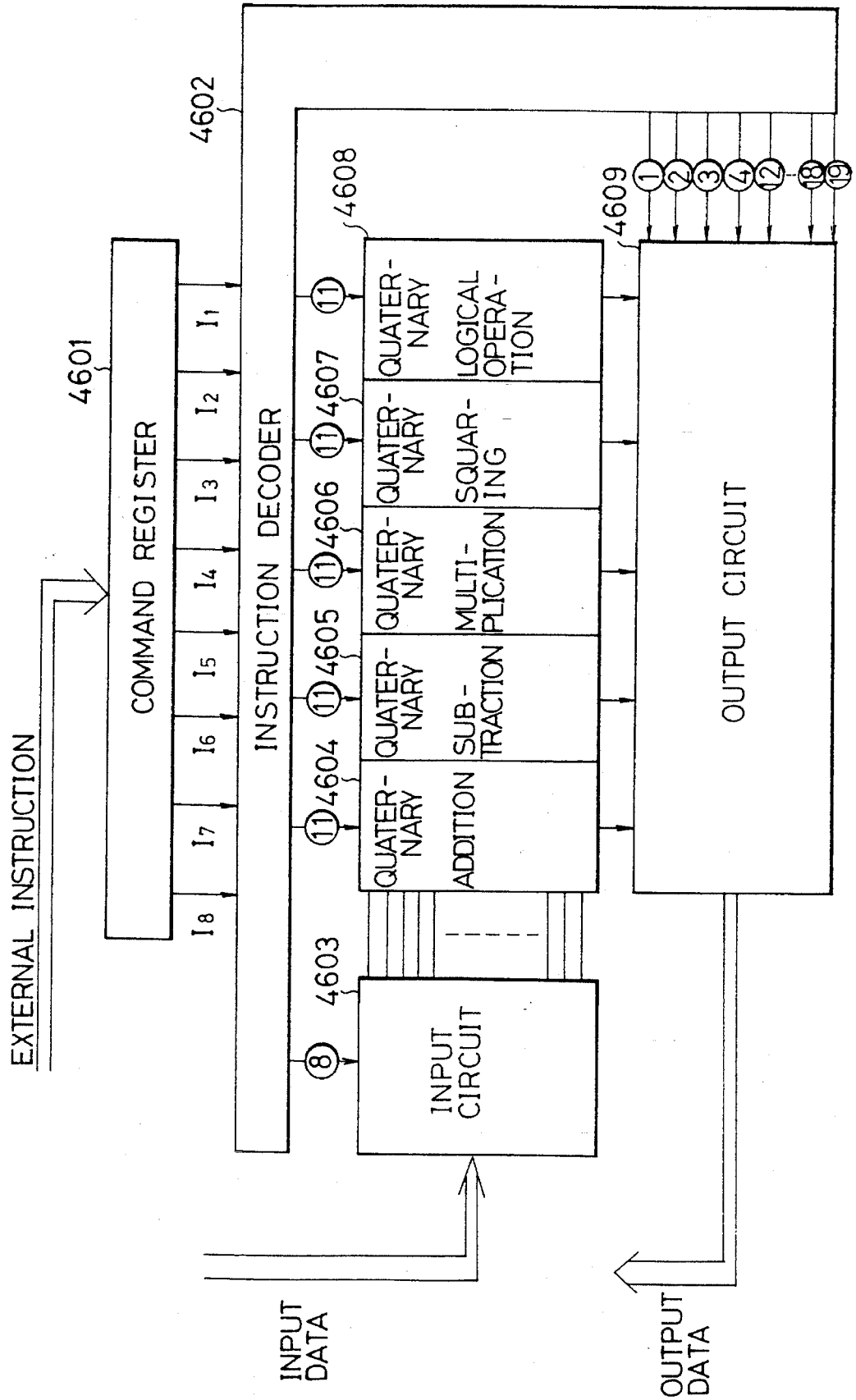
FIG. 46 is a block diagram showing another operating module having a command register included in the multi-functional operating circuit according to the present invention.

FIG. 46 shows an example of a combination in which various operating circuits are made complex, which corresponds to the circuit arrangement of FIG. 41.

The multi-functional operating circuit as shown in FIG. 46 is arranged to have a command register 4601 for receiving an external instruction and outputting external instructions $I_1$ to $I_8$; an instruction decoder 4602 being connected to the command register 4601 and for receiving the external instructions $I_1$ to $I_8$ outputted from the command register 4601 and outputting micro orders 1 to 4, 8, 11 and 12 to 19; an input circuit 4608 being connected to the instruction decoder 4602 and for receiving the micro order 8 outputted form the instruction decoder 4602 and the input data from the external and outputting a quaternary signal; operating circuits 4604 to 4608 being connected to the instruction decoder 4602 and the input circuit 4603 and for executing quaternary operations of an addition, a subtraction, a multiplication, a squaring operation and a logical operation based on the micro order 11 outputted from the instruction decoder 4602 and a quaternary signal outputted by the instruction decoder 4602; and an output circuit 4609 being connected to the instruction decoder 4602 and the operating circuits 4604 to 4608 and for receiving the quaternary operated results of the operating circuits 4604 to 4608 based on the micro orders 1 to 4 and 12 to 19 outputted from the instruction decoder 4602 and supplying it as the output data.

The multi-functional operating circuit shown in FIG. 46 is an example of an operating module in which the command register 4601 is installed as a register interface for decoding an external instruction consisting of eight bits and executing various operations.

The instruction inputted from the external is temporarily stored in the command register 4601 and dynamically or statically selects and executes various operations in response to each of the micro orders outputted from the instruction decoder 4602. In addition, this register interface may similarly apply to the other representative combinations as shown in FIGS. 4 to 16 if a logical operation is added to the combinations.

Figure 47:
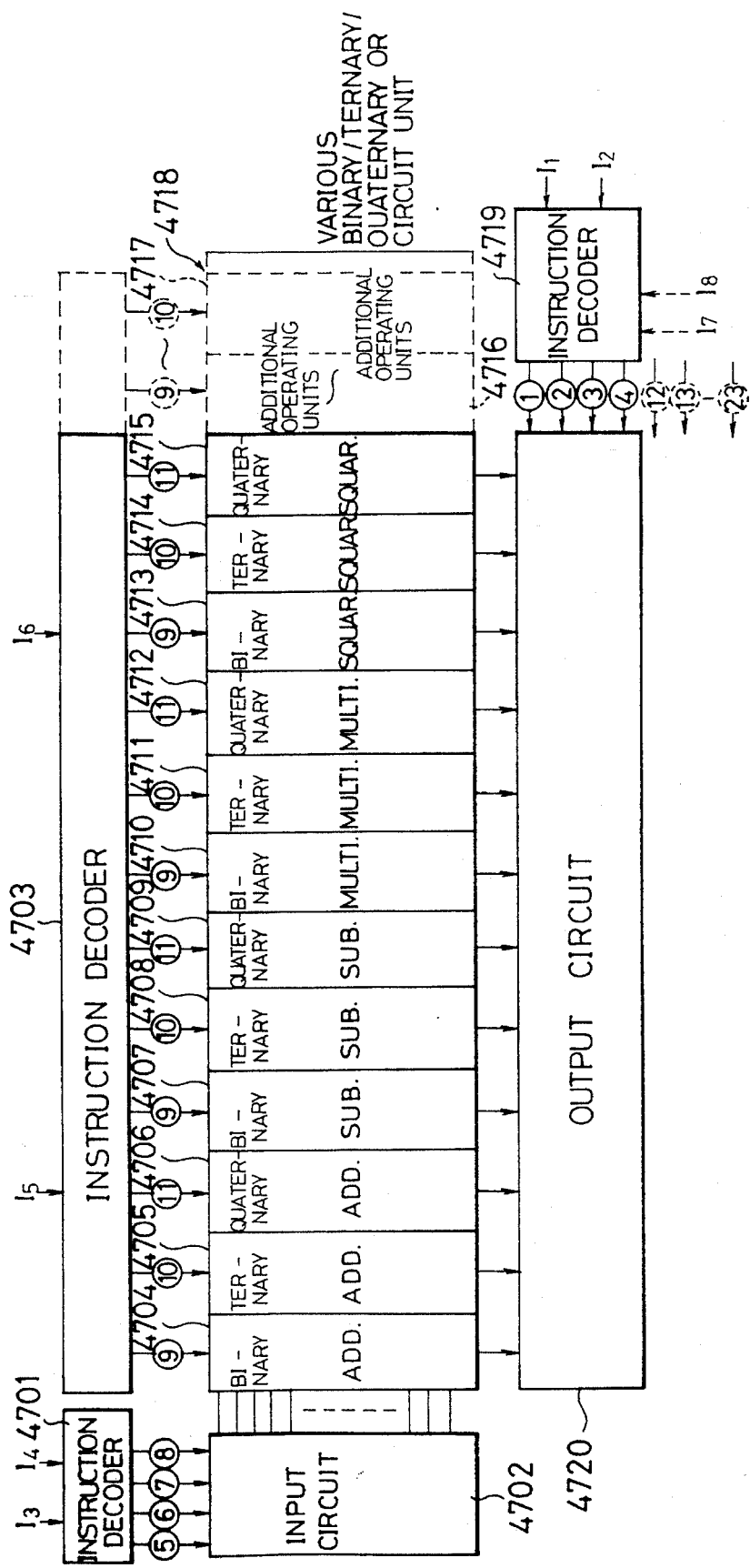
FIG. 47 is a block diagram showing another operating module having a command register included in the multi-functional operating circuit according to the present invention.
Figures 48, 49:
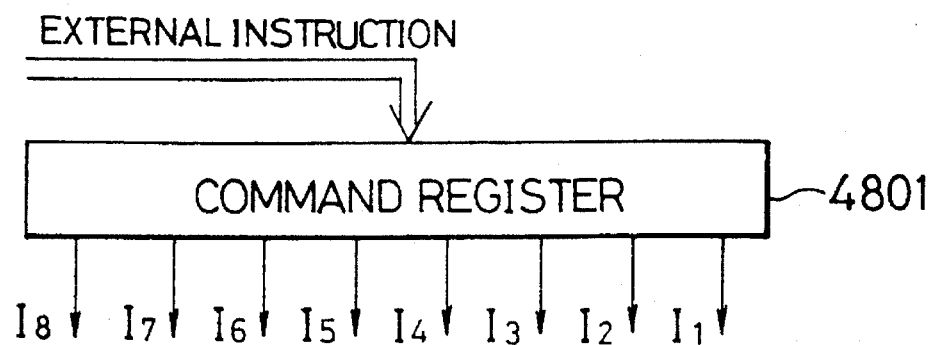
FIG. 48 is a view showing a command register included in the multi-functional operating circuit shown in FIG. 47.
FIG. 49 is a table for describing signal conversions between input data (input signal) and output data (output signal) in the multi-functional operating circuit according to the present invention.

FIG. 47 shows one arrangement of a multi-functional operating circuit containing a command register shown in FIG. 48.

The multi-functional operating circuit shown in FIG. 47 is arranged to have an instruction decoder 4701 for receiving external instructions $I_3$ and $I_4$ outputted from the command register 4801 shown in FIG. 48 and outputting micro orders 5 to 8; an input circuit 4702 being connected to the instruction decoder 4701 and for receiving the micro orders 5 to 8 outputted from the instruction decoder 4701 and the input data from the external and outputting a binary, a ternary, a binary and a quaternary signals; an instruction decoder 4703 for receiving external instructions $I_5$ and $I_6$ outputted from the command register 4801 and outputting the micro orders 9, 10 and 11; a binary/ternary/quaternary OR circuit 4718 having operating circuits 4704 to 4717 being connected to the input circuit 4702 and the instruction decoder 4703 and for executing some binary, ternary and quaternary operations of an addition, a subtraction, a multiplication, a squaring, and an additional operation based on the micro orders 9, 10 and 11 outputted from the instruction decoder 4703 and the binary, the ternary, and the quaternary signals outputted from the input circuit 4702; an instruction decoder 4719 for receiving external instructions $I_1$, $I_2$, $I_7$ and $I_8$ outputted from the command register 4801 and outputting micro orders 1 to 4 and 12 to 23; and an output circuit 4720 being connected to the instruction decoder 4719 and the operating circuits 4704 to 4717 and for receiving the operated results given of the operating circuits 4704 to 4717 based on the micro orders 1 to 4 and 12 to 23 outputted from the instruction decoder 4719 and supplying it as the output data.

The multi-functional operating circuit shown in FIG. 47 is an example of an operating module in which the command register 4801 shown in FIG. 48 is installed as a register interface for decoding an external instruction consisting of eight bits and executing various operations. The instruction inputted from the external is temporarily stored in the command register 4801 and dynamically or statically selects and executes various operations in response to each of the micro orders outputted through the instruction decoders 4701, 4703 and 4719.

The command register 4801 shown in FIG. 48 is arranged to receive an external instruction and output the external instructions $I_1$ to $I_8$ to the multi-functional operating circuit shown in FIG. 47.

FIG. 49 i s a table showing various signal conversions between the input data (input signal) and output data (output signal) in the multi-functional operating circuit. That is, in each of the addition, the subtraction, the multiplication, the squaring and a logical operation, a binary output signal, a ternary output signal and a quaternary output signal are selectively combined with the binary input signal, the ternary input signal and the quaternary input signal in order to perform various signal conversions.

As set forth in the description of the foregoing embodiment, the binary, the ternary and the quaternary output signals are selectively combined with the binary, the ternary and the quaternary input signals in order to perform various logical conversions.

In various operating systems for an addition, a subtraction, a multiplication, a squaring and a logical operation, it is possible to obtain a ternary output signal for a binary input signal, a quaternary output signal for a binary input signal, a binary output signal for a ternary input signal, a quaternary output signal for a ternary input signal, a binary output signal for a quaternary input signal, and a ternary output signal for a quaternary input signal in each of the operating systems.

Likewise, in various operating systems in which it is possible to obtain a binary output signal for a binary input signal, a ternary output signal for a ternary input signal, and a quaternary output signal for a quaternary input signal, various signal conversions are made possible.

As mentioned above, the multi-functional operating circuit according to the present invention includes various complexed operating circuits. The operating circuits may be selectively combined in response to an external instruction. Further, with the external instruction, the operating function can be changed by dynamically or statically controlling the operating circuits.

Further, since the operating circuit is complexed (integrated), a high-density integrated operating circuit needing the fastest speed is made possible and electric delay of a signal is allowed to be prevented or reduced.

Further, since various operating circuits are made complex, a controllable and a multi-functional operating module can be realized in response to an external instruction (operating instruction). As such, it is possible to provide an architecture which is quite effective in a super LSI for an operating system as well as configuring the operating circuit which is commonly used for each of a binary signal, a ternary signal and a quaternary signal.

The processing speed of each operation controlled in response to an external instruction is allowed to be doubled without having to change a clock frequency. Hence, the resulting operating circuit may keep the operating speed if the clock frequency is divided into a half, A circuit element called as "single electron storage cell", which is now being studied in the #Cabendish Laboratory of the Cambridge University in England, provides a capability of handling electrons one by one, that is, using the electrons most efficiently, though the current integrated circuit handles electrons containing idle movable ones as a mass and thus serves as inhibiting expansion of integration. The "single electron storage cell" therefore can treat a large volume of data and a high speed of operation at a lower power consumption.

The single electron storage cell may be used as a quantizing functional cell used in the multi-functional operating circuit.

Since this single electron storage cell can handle electrons one by one, a quaternary operating circuit may be arranged by corresponding a zero-electron state, a one-electron state, a two-electron state and a three-electron state to 0, 1/3, 2/3 and 1, respectively. Further, by corresponding the zero-electron state, the one-electron state and the two-electron state to 0, 1/2 and 1, respectively, a ternary operating circuit may be arranged. Likewise, by corresponding the zero-electron state and the one-electron state to 0 and 1, respectively, a binary operating circuit may be arranged. It means that the use of a single electron cell makes it possible to realize a multi-functional operating circuit, an operating system and a logical circuit at a high speed and a low power consumption.

In addition, various multi-valued logic may be arranged according to the number of electrons to be processed by the single electron cell. The single electron cell may apply to a multi-valued gate circuit (AND circuit, OR circuit and the like), a multi-valued delay circuit and an equivalent circuit (equivalent logic).

Figure 50:
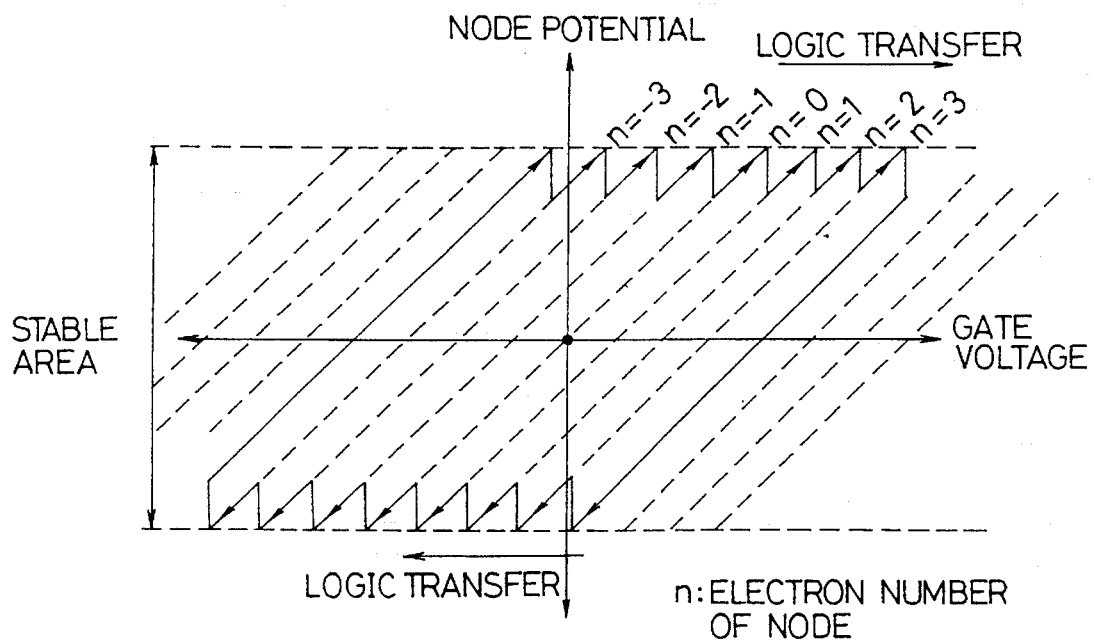
FIG. 50 is a figure for explaining a principle of operation of element operated single electron.

It is known that electrons are allowed to be handled one by one. It is also known that the principle of operations of the element to be operated on a single electron is illustrated in FIG. 50. It is at the research stage and is experimented in the #Cabendish Laboratory.

This principle of operation allows each electron to be controlled so that the principle may apply to various kinds of multivalued gate circuits. Concretely, consider a quaternary gate. For a value of "0", zero-electron state is allocated. For "1/3", one-electron state is allocated. For "2/3", two-electron state are allocated. For "1", three-electron state are allocated. Consider a ternary gate. For "0", zero-electron state is allocated. For "1/2", one-electron state is allocated. For "1", two-electron state are allocated. Then, consider a binary gate. For "0", zero-electron state is allocated. For "1", one-electron state is allocated.

It goes without saying that electrons are adjustably allocated according to each gate logical value like the above examples.

As shown in FIG. 50, the electric potential at the node has a constant stable area. The voltage at the gate changes according to the number of electrons so that the gate state may transfer. The behavior of each logic circuit shown in FIG. S1, 52 or 53 applies to the principle of operation based on the logic state transfer to be done according to each electron number of n=0, n=1, n=2 and n=3. As is obvious from FIG. 50, the electrons may be variably applied to each logic value. As such, the transfer state may be variable according to the allocation. If the number of electrons at the node changes, the potential at the node secures a constant stable area. In the stable area, hence, the gate voltage is allowed to be transferred according to the number of electrons at the node. It means realization of a multivalued logic for each electron number. To realize the multivalued logic, the substantially stable area is quite important to constituting a physically stable multivalued logic. The electron number is changed as shown by an arrow of FIG. 50. The change of the number of electrons in any logic circuit is obvious from the principle of operation as described above.

The known semiconductor integrated circuit handles so many electrons at a time that the circuit may consume much electric power (brings about much loss) and be critical in speed and integration.

On the other hand, if the circuit element handles a single electron at a time, the energy loss of the circuit is suppressed to a quite small value. At a time, the circuit enhances its speed capability, needs quite small power consumption, and makes its integration far more dense. Further, the multivalued logic is allowed to be applied to the circuit. It means that the multi-functional operating circuit according to the present invention is quite useful.

As will be noted below, the binary logic circuit provides seven kinds of basic circuits. The ternary logic circuit provides ten kinds of basic circuits. The quaternary logic circuit provides thirteen kinds of basic circuits.

The function of each gate circuit will be discussed below with reference to FIGS. 51, 52 and 53. Herein, the terms "zero-electron state", "one-electron state", "two-electron state" and "three-electron state" concretely mean the logical values defined according to zero electron, one electron, two electrons and three electrons respectively.

At first, the description will be oriented to the operation of the binary logic circuit.

Figure 51:
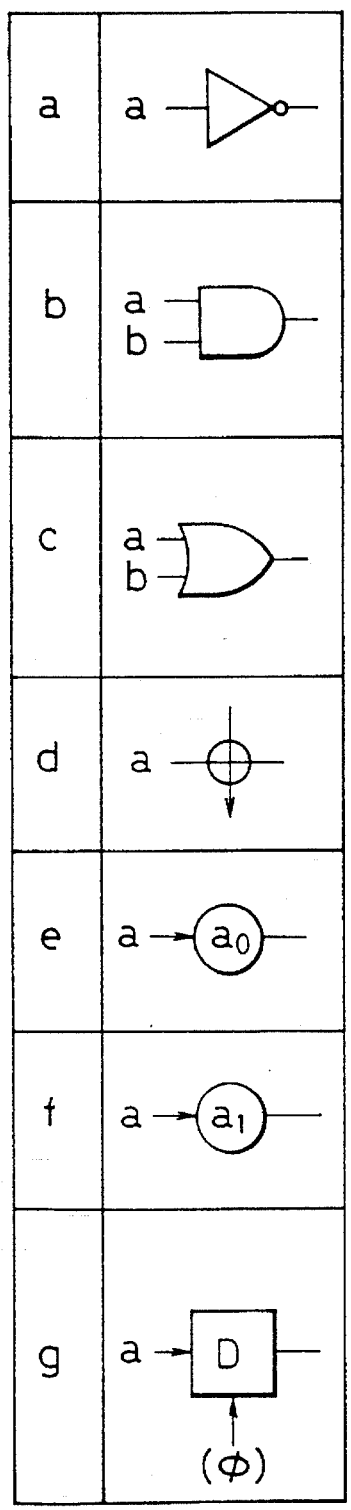
FIG. 51 is a symbol list for explaining binary logic circuits.

In FIG. 51-*a*, a NOT circuit outputs zero-electron state if the input a has one-electron state or outputs one-electron state if the input a has zero-electron state.

In FIG. 51-*b*, an AND circuit outputs one-electron state if each of the inputs a and b has one-electron state or zero-electron state if any one of the inputs a and b has zero-electron state.

In FIG. 51-*c*, an OR circuit outputs one-electron state if any one of the inputs a and b has one-electron state or zero-electron state if both of the inputs a and b have zero-electron state.

In FIG. 51-*d*, a binary element outputs one-electron state if the input a has one-electron state or zero-electron state if the input a has zero-electron state.

In FIG. 51-*e*, an equivalent circuit outputs one-electron state if the input a has zero-electron state or zero-electron state if the input a has one-electron state.

In FIG. 51-*f*, an equivalent circuit outputs one-electron state if the input a has one-electron state or zero-electron state if the input a has zero-electron state.

In FIG. 51-*g*, a delay circuit stores and outputs one-electron state in synchronous to a clock (φ) if the input a has one-electron state or zero-electron state if the input a has zero-electron state.

Next, the description will be oriented to the operation of the ternary logic circuit.

Figure 52:
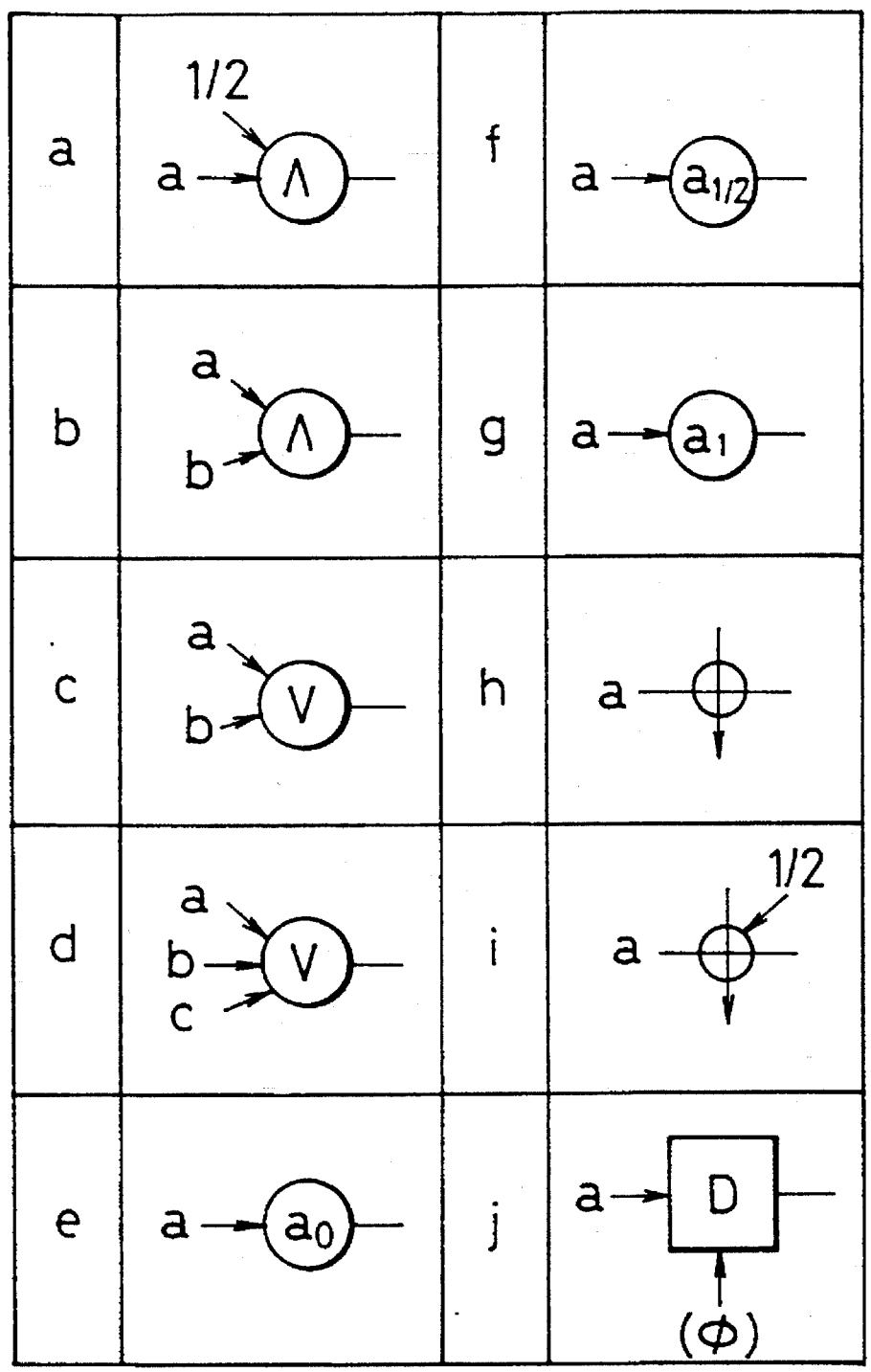
FIG. 52 is a symbol list for explaining ternary logic circuits.

In FIG. 52-a, an AND circuit outputs one-electron state if the input a has one-electron state or zero-electron state if the input a has zero-electron state.

In FIG. 52-b, an AND circuit outputs one-electron state if one of the inputs a and b has one-electron state and the other input has one-electron state as well, two-electron state if one of the inputs a and b has one-electron state and the other input has two-electron state. Likewise, the AND circuit outputs zero-electron state if one of the inputs a and b has one-electron state and the other has zero-electron state, zero-electron state if any one of the inputs a and b has zero-electron state.

In FIG. 52-c, an OR circuit outputs one-electron state if any one of the inputs a and b has one-electron state, two-electron state if any one of the inputs a and b has two-electron state, or zero-electron state if both of the inputs a and b have zero-electron state.

In FIG. 52-d, an OR circuit outputs one-electron state if any one of the inputs a, b and c has one-electron state, two-electron state if any one of the inputs a, b and c has two-electron state, or zero-electron state if all of the inputs a, b and c have zero-electron state.

In FIG. 52-e, an equivalent circuit outputs one-electron state if the input a has zero-electron state or zero-electron state if the input a has one or two-electron state.

In FIG. 52-f, an equivalent circuit outputs one-electron state if the input a has one-electron state or zero-electron state if the input a has zero or two-electron state.

In FIG. 52-g, an equivalent circuit outputs one-electron state if the input a has two-electron state or zero-electron state if the input a has zero or one-electron state.

In FIG. 52-h, a multivalued element outputs two-electron state if the input a has one-electron state or zero-electron state if the input a has zero-electron state.

In FIG. 52-i, a multivalued element outputs one-electron state if the input a has one-electron state or zero-electron state if the input a has zero-electron state.

In FIG. 52-j, a delay circuit stores and outputs one-electron state in synchronous to a clock (φ) if the input a has one-electron state, two-electron state if the input a has two-electron state, or zero-electron state if the input a has zero-electron state.

Next, the description will be oriented to the operation of the quaternary logic circuit.

Figure 53:
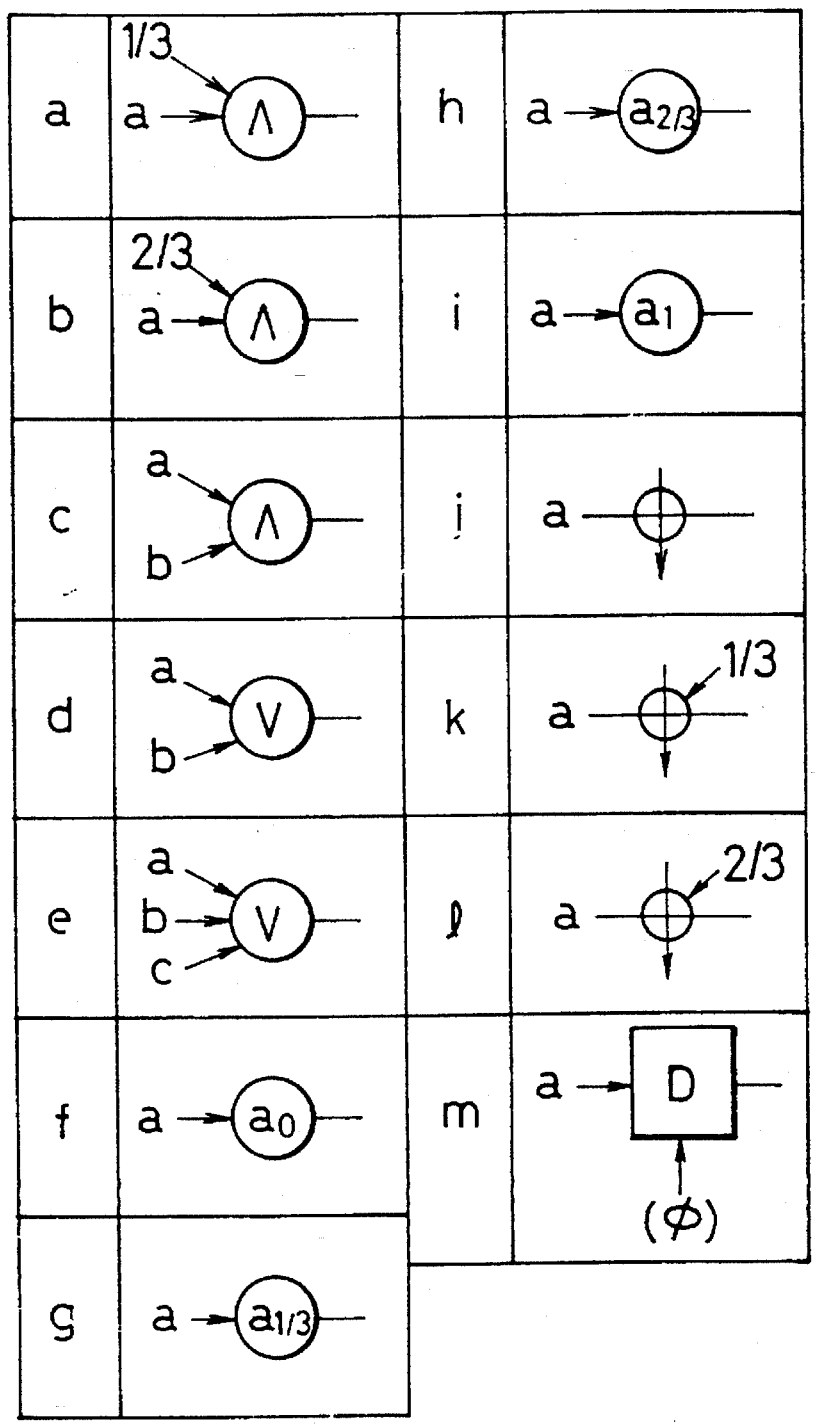
FIG. 53 is a symbol list for explaining quaternary logic circuits.

In FIG. 53-a, an AND circuit outputs one-electron state if the input a has one-electron state or zero-electron state if the input a has zero-electron state.

In FIG. 53-b, an AND circuit outputs two-electron state if the input a has one-electron state or zero-electron state if the input a has zero-electron state.

In FIG. 53-c, an AND circuit outputs one-electron state if any one of the inputs a and b has one-electron state and the other one has one-electron state, two-electron state if one of the inputs a and b has one-electron state and the other has two-electron state, or three-electron state if one of the inputs a and b has one-electron state and the other has three-electron state. Likewise, if one of the inputs has one-electron state and the other has zero-electron state, the AND circuit outputs zero-electron state. If any one of the inputs a and b has zero-electron state, zero-electron state is output from the AND circuit.

In FIG. 53-d, an OR circuit outputs one-electron state if any one of the inputs a and b has one-electron state, two-electron state if any one of the inputs a and b has two-electron state, three-electron state if any one of the inputs a and b has three-electron state, or zero-electron state if both of the inputs a and b have zero-electron state.

In FIG. 53-e, an OR circuit outputs one-electron state if any one of the inputs a, b and c has one-electron state, two-electron state if any one of the inputs a, b and c has two-electron state, three-electron state if any one of the inputs a, b and c has three-electron state, or zero-electron state if all of the inputs a, b and c have zero-electron state.

In FIG. 53-f, an equivalent circuit outputs one-electron state if the input a has zero-electron state or zero-electron state if the input a has one, two or three-electron state.

In FIG. 53-g, an equivalent circuit outputs one-electron state if the input a has one-electron state or zero-electron state if the input a has zero, two or three-electron state.

In FIG. 53-h, an equivalent circuit outputs one-electron state if the input a has two-electron state or zero-electron state or outputs zero-electron state if the input a has zero-electron state, one-electron state or three-electron state.

In FIG. 53-i, an equivalent circuit outputs one-electron state if the input a has three-electron state or zero-electron state if the input a has zero-electron state, one-electron state or two-electron state.

In FIG. 53-j, a multivalued element outputs three-electron state if the input a has one-electron state or zero-electron state if the input a has zero-electron state.

In FIG. 53-k, a multivalued element outputs one-electron state if the input a has one-electron state or zero-electron state if the input a has zero-electron state.

In FIG. 53-l, a multivalued element outputs two-electron state if the input a has one-electron state or zero-electron state if the input a has zero-electron state.

In FIG. 53-m, a delay circuit stores and outputs one-electron state in synchronous to a clock (φ) if the input a has one-electron state, two-electron state if the input a has two-electron state, three-electron state if the input a has three-electron state, or zero-electron state if the input a has zero-electron state.

Many widely different embodiments of the present invention may be constructed without having to depart from the spirit and scope of the present invention. It should be understood that the present invention is not limited to the specific embodiments described in the specification, except as defined in the appended claims.

What is claimed is:

1. A multi-function operating circuit comprising:
   input means including a plurality of portions each corresponding to one of a plurality of N-value data respectively, where N is a natural number equal to or greater than 2;
   operating means having a plurality of operating circuits each for performing one of a plurality of kinds of operations with respect to one of said plurality of N-value data respectively;
   output means for outputting a result of operation of at least one of said plurality of operating circuits in one of said plurality of N-value data; and
   controlling means for controlling said input circuit, said plurality of operating circuits and said output circuit so as to select and combine dynamically or statically one of said portions of said input means, said plurality of operating circuits and said output circuit in response to external signals including instruction of an operation to be performed and data representing a value of said N.

2. A multi-function operating circuit according to claim 1, wherein said input means, said operating means and said output means have respective output portions with respect to $N_0$-value.

3. A multi-function operating circuit according to claim 2, wherein said operating circuits comprise a first multiplication circuit for performing a multiplicating of $N_1$-value and a second multiplication circuit for performing a multiplicating of $N_2$-value.

4. A multi-function operating circuit according to claim 3, wherein said operating circuits comprise a third multiplication circuit for performing a multiplicating of $N_3$-value.

5. A multi-function operating circuit according to claim 2, wherein said operating circuits comprise a first squaring circuit for performing a squaring of $N_1$-value and a second squaring circuit for performing a squaring of $N_2$-value.

6. A multi-function operating circuit according to claim 5, wherein said operating circuits comprise a third squaring circuit for performing a squaring operation of $N_3$-value.

7. A multi-function operating circuit according to claim 2, wherein said operating circuits comprise a first addition circuit for performing a adding of $N_1$-value and a second addition circuit for performing a adding of $N_2$-value.

8. A multi-function operating circuit according to claim 7, wherein said operating circuits comprise a third addition circuit for performing an adding operation of $N_3$-value.

9. A multi-function operating circuit according to claim 2, wherein said operating circuits comprise a first subtraction circuit for performing a subtracting of $N_1$-value and a second subtraction circuit for performing a subtracting of $N_2$-value.

10. A multi-function operating circuit according to claim 9, wherein said operating circuits comprise a third subtraction circuit for performing a subtracting of $N_3$-value.

11. A multi-function operating circuit according to claim 2, wherein said operating circuits comprise a first logical circuit for performing a logical operation of $N_1$-value and a second logical circuit for performing a logical operation of $N_2$-value.

12. A multi-function operating circuit according to claim 11, wherein said operating circuits comprise a third logical circuit for performing a logical operation of $N_3$-value.

13. A multi-function operating circuit according to claim 12, wherein said $N_0$-value is different from $N_1$-value, $N_2$-value and $N_3$-value.

14. A multi-function operating circuit according to any one of claims 9 to 13, wherein said $N_1$-value is binary value, said $N_2$-value is ternary value, and said $N_3$-value is quaternary value.

15. A multi-function operating circuit according to claim 12, wherein $N_0$-value is identical with at least one of $N_1$-value, $N_2$-value and $N_3$-value.

16. A multi-function operating circuit according to any one of claims 9 to 13, wherein said $N_1$-value is binary value, said $N_2$-value is ternary value, and said $N_3$-value is quaternary value.

17. A multi-functional operating circuit according to claim 16, wherein each of said binary adding circuit, said ternary adding circuit, said quaternary adding circuit, said binary subtracting circuit, said ternary subtracting circuit, and said quaternary subtracting circuit included in said operating circuits is composed of a binary, a ternary or a quaternary OR circuit, a NOT circuit element or I/O elements, logical AND circuit elements connected to said OR circuit and one of said NOT circuit, element and I/O elements, logical OR circuit elements selectively connected to said logical AND circuit elements, and a delaying circuit element being connected to one of said logical AND circuit elements.

18. A multi-functional operating circuit according to claim 16, wherein each of said binary multiplication circuit, said ternary multiplication circuit, and said quaternary multiplication circuit included in said operating circuits is composed of a binary, a ternary or a quaternary OR circuit, a NOT circuit element, I/O elements, logical AND circuit elements connected to said OR circuit and one of said I/O elements, logical OR circuit elements selectively connected to said logical AND circuit elements, and a delaying circuit element being connected to one of said logical AND circuit elements.

19. A multi-functional operating circuit according to claim 16, wherein each of said binary squaring circuit, said ternary squaring circuit, and said quaternary squaring circuit included in said operating circuits is composed of a binary, a ternary or a quaternary OR circuit, a NOT circuit element, I/O elements, logical AND circuit elements connected to said OR circuit and one of said I/O elements, logical OR circuit elements selectively connected to said logical AND circuit elements, and a delaying circuit element being connected to one of said logical AND circuit elements.

20. A multi-functional operating circuit according to claim 16, wherein each of said binary logic circuit, said ternary logic circuit, and said quaternary logic circuit included in said operating circuits is composed of a binary, a ternary or a quaternary OR circuit, AND circuit elements, and OR circuit elements.

21. A multi-functional operating circuit according to claim 16, wherein said input circuit is composed of logical AND circuit elements, and equivalent elements.

22. A multi-function operating circuit according to claim 2, wherein said operating circuits comprise a first multiplication circuit for performing a multiplicating of $N_1$-value and a second multiplication circuit for performing a multiplicating of $N_2$-value, a first squaring circuit for performing a squaring of $N_1$-value and a second squaring circuit for performing a squaring of $N_2$-value, a first addition circuit for performing a adding of $N_1$-value and a second addition circuit for performing a adding of $N_2$-value, a first subtraction circuit for performing a subtracting of $N_1$-value and a second subtraction circuit for performing a subtracting of $N_2$-value, and a first logical circuit for performing a logical operation of $N_1$-value and a second logical circuit for performing a logical operation of $N_2$-value.

23. A multi-function operating circuit according to claim 2, wherein each of a plurality of said operating circuits comprises a circuit element handling a single electron at a time.

24. A multi-function operating circuit according to claim 23, wherein the number of electrons corresponds to a state of a logic.

25. A multi-function operating circuit according to claim 23, wherein zero electron corresponds to a value of "0", one electron corresponds to a value of "1/3", two electrons corresponds to a value of "2/3", and three electrons corresponds to a value of "1", on a quaternary gate.

26. A multi-function operating circuit according to claim 23, wherein zero electron corresponds to a value of "0", one electron corresponds to a value of "1/2", and two electrons corresponds to a value of "1", on a ternary gate.

27. A multi-function operating circuit according to claim 23, wherein zero electron corresponds to a value of "0", and one electron corresponds to a value of "1", on a binary gate.

* * * * *

UNITED STATES PATENT AND TRADEMARK OFFICE
CERTIFICATE OF CORRECTION

PATENT NO. : 5,524,088
DATED : June 4, 1996
INVENTOR(S) : Yukihiro Yoshida

It is certified that error appears in the above-indentified patent and that said Letters Patent is hereby corrected as shown below:

Column 29, line 43-44,

Claim 13, lines 1 and 2, and claim 15, lines 1 and 2,
"according to claim 12" should read
--according to any one of claims 4, 6, 8, 10 and 12--

Column 29, line 45-46,

Claim 14, lines 1 and 2,
"any one of claims 9 to 13" should read --claim 13--

Column 29, line 49-50,

Claim 16, lines 1 and 2,
"any one of claims 9 to 13" should read --claim 15--

Signed and Sealed this

Twenty-ninth Day of October 1996

Attest:

BRUCE LEHMAN

Attesting Officer

Commissioner of Patents and Trademarks